United States Patent
Sekar et al.

(10) Patent No.: US 10,043,781 B2
(45) Date of Patent: Aug. 7, 2018

(54) 3D SEMICONDUCTOR DEVICE AND STRUCTURE

(71) Applicant: Monolithic 3D Inc., San Jose, CA (US)

(72) Inventors: Deepak Sekar, San Jose, CA (US); Zvi Or-Bach, San Jose, CA (US); Brian Cronquist, San Jose, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days.

(21) Appl. No.: 15/904,377

(22) Filed: Feb. 25, 2018

(65) Prior Publication Data

US 2018/0190619 A1 Jul. 5, 2018

Related U.S. Application Data

(63) Continuation-in-part of application No. 15/470,866, filed on Mar. 27, 2017, now Pat. No. 9,953,972, (Continued)

(51) Int. Cl.
*H01L 23/48* (2006.01)
*H01L 25/065* (2006.01)
(Continued)

(52) U.S. Cl.
CPC .. *H01L 25/0657* (2013.01); *H01L 21/823475* (2013.01); *H01L 23/3677* (2013.01);
(Continued)

(58) Field of Classification Search
CPC .............. H01L 23/3677; H01L 23/481; H01L 23/5225; H01L 25/0657; H01L 27/0688;
(Continued)

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.

(Continued)

*Primary Examiner* — Cuong Q Nguyen
(74) *Attorney, Agent, or Firm* — Tran & Associates

(57) ABSTRACT

A 3D semiconductor device, the device including: a first single crystal layer including a plurality of first transistors; at least one metal layer interconnecting the first transistors, a portion of the first transistors forming a plurality of logic gates; a plurality of second transistors overlaying the first single crystal layer; at least one connection from the plurality of first transistors to a plurality of through silicon vias (TSVs); a plurality of third transistors overlaying the plurality of second transistors, where the plurality of second transistors are self-aligned to the plurality of third transistors having been processed following the same lithography step; and a first memory array and a second memory array, where the first memory array includes the plurality of second transistors and the second memory array includes the plurality of third transistors.

20 Claims, 55 Drawing Sheets

Related U.S. Application Data which is a continuation-in-part of application No. 15/079,017, filed on Mar. 23, 2016, now Pat. No. 9,613,887, which is a continuation of application No. 14/747,599, filed on Jun. 23, 2015, now Pat. No. 9,299,641, which is a continuation-in-part of application No. 13/869,115, filed on Apr. 24, 2013, now Pat. No. 9,099,424, which is a continuation of application No. 13/571,614, filed on Aug. 10, 2012, now Pat. No. 8,450,804, application No. 15/904,377, which is a continuation-in-part of application No. 15/201,430, filed on Jul. 2, 2016, now Pat. No. 9,892,972, which is a continuation-in-part of application No. 14/626,563, filed on Feb. 19, 2015, now Pat. No. 9,385,088, which is a continuation of application No. 14/017,266, filed on Sep. 3, 2013, now abandoned, which is a continuation of application No. 13/099,010, filed on May 2, 2011, now Pat. No. 8,581,349, which is a continuation-in-part of application No. 12/951,913, filed on Nov. 22, 2010, now Pat. No. 8,536,023, which is a continuation-in-part of application No. 12/904,119, filed on Oct. 13, 2010, now Pat. No. 8,476,145, said application No. 15/201,430 is a continuation-in-part of application No. 13/016,313, filed on Jan. 28, 2011, now Pat. No. 8,362,482, which is a continuation-in-part of application No. 12/970,602, filed on Dec. 16, 2010, now Pat. No. 9,711,407, which is a continuation-in-part of application No. 12/949,617, filed on Nov. 18, 2010, now Pat. No. 8,754,533, which is a continuation-in-part of application No. 12/900,379, filed on Oct. 7, 2010, now Pat. No. 8,395,191, which is a continuation-in-part of application No. 12/847,911, filed on Jul. 30, 2010, now Pat. No. 7,960,242, which is a continuation-in-part of application No. 12/792,673, filed on Jun. 2, 2010, now Pat. No. 7,964,916, which is a continuation-in-part of application No. 12/706,520, filed on Feb. 16, 2010, now abandoned, which is a continuation-in-part of application No. 12/577,532, filed on Oct. 12, 2009, now abandoned.

(51) Int. Cl.
| | | |
|---|---|---|
| H01L 23/367 | (2006.01) | |
| H01L 27/092 | (2006.01) | |
| H01L 21/8234 | (2006.01) | |
| H01L 27/088 | (2006.01) | |
| H01L 23/522 | (2006.01) | |
| H01L 27/06 | (2006.01) | |

(52) U.S. Cl.
CPC ........ *H01L 23/481* (2013.01); *H01L 23/5225* (2013.01); *H01L 27/0688* (2013.01); *H01L 27/088* (2013.01); *H01L 27/0886* (2013.01); *H01L 27/092* (2013.01); *H01L 27/0922* (2013.01); *H01L 2225/06527* (2013.01); *H01L 2225/06541* (2013.01); *H01L 2225/06589* (2013.01); *H01L 2924/00* (2013.01); *H01L 2924/0002* (2013.01)

(58) Field of Classification Search
CPC . H01L 27/088; H01L 27/0886; H01L 27/092; H01L 27/0922
See application file for complete search history.

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |

(56) References Cited

U.S. PATENT DOCUMENTS

| | | |
|---|---|---|
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |

(56) References Cited

U.S. PATENT DOCUMENTS

| | | |
|---|---|---|
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,557,367 B2 | 7/2009 | Rogers et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,464 B2 | 10/2011 | Yamazaki et al. |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |

(56) References Cited

U.S. PATENT DOCUMENTS

| | | |
|---|---|---|
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |
| 8,264,065 B2 | 9/2012 | Su et al. |
| 8,343,851 B2 | 1/2013 | Kim et al. |
| 8,354,308 B2 | 1/2013 | Kang et al. |
| 8,355,273 B2 | 1/2013 | Liu |
| 8,432,751 B2 | 4/2013 | Hafez |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,508,994 B2 | 8/2013 | Okhonin |
| 8,514,623 B2 | 8/2013 | Widjaja et al. |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,619,490 B2 | 12/2013 | Yu |
| 8,650,516 B2 | 2/2014 | McIlrath |
| 8,679,861 B2 | 3/2014 | Bose |
| 8,773,562 B1 | 7/2014 | Fan |
| 8,775,998 B2 | 7/2014 | Morimoto |
| 8,841,777 B2 | 9/2014 | Farooq |
| 8,853,785 B2 | 10/2014 | Augendre |
| 8,928,119 B2 | 1/2015 | Leedy |
| 8,971,114 B2 | 3/2015 | Kang |
| 9,172,008 B2 | 10/2015 | Hwang |
| 9,227,456 B2 | 1/2016 | Chien |
| 9,334,582 B2 | 5/2016 | See |
| 9,570,683 B1 | 2/2017 | Jo |
| 9,595,530 B1 | 3/2017 | Zhou |
| 9,673,257 B1 | 6/2017 | Takaki |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonelli et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |

(56) References Cited

U.S. PATENT DOCUMENTS

| | | |
|---|---|---|
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0108171 A1 | 5/2008 | Rogers et al. |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |

(56) References Cited

U.S. PATENT DOCUMENTS

| | | |
|---|---|---|
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Futasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0276662 A1 | 11/2010 | Colinge |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0048867 A1 | 2/2014 | Toh |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2015/0243887 A1 | 8/2015 | Saitoh |
| 2015/0255418 A1 | 9/2015 | Gowda |
| 2016/0049201 A1 | 2/2016 | Lue |
| 2016/0104780 A1 | 4/2016 | Mauder |
| 2016/0133603 A1* | 5/2016 | Ahn .............. H01L 25/0657 365/63 |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1* | 3/2017 | Park .............. H01L 25/0657 |
| 2017/0092371 A1 | 3/2017 | Harari |
| 2017/0098596 A1* | 4/2017 | Lin .............. H01L 23/481 |
| 2017/0148517 A1 | 5/2017 | Harari |
| 2017/0179146 A1 | 6/2017 | Park |

(56) References Cited

U.S. PATENT DOCUMENTS

| | | |
|---|---|---|
| 2017/0221900 A1 | 8/2017 | Widjaja |
| 2018/0090368 A1 | 3/2018 | Eun-Jeong et al. |
| 2018/0108416 A1 | 4/2018 | Harari |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et. al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (φFlash), Suitable for Full 3D Integration", International Electron Devices Meeting, 2009, pp. 637-640.

Celler, G.K. et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terminal Mechanical Photovoltaic Stacks," III-Vs Review, Sep.-Oct. 2006, pp. 24-27, vol. 19, Issue 7.

Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M. "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D. et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C. et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," Chptr. 13.4, pp. 407-410, in "Integrated Interconnect Technologies for 3D Nano Electronic Systems", 2009, Artech House.

Weis, M. et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology/high-density 3D-integration technology for multifunctional devices", (2009) IEEE International Conference on 3D System Integration, 3DIC 2009.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

(56) References Cited

OTHER PUBLICATIONS

Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "*CELONCEL: Effective Design Technique for 3-D Monolithic Integration targeting High Performance Integrated Circuits*", Asia pacific DAC 2011, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360 ° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3(Stacked Single-crystal Si) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "'Three Dimensionally Stacked NAND Flash Memory Technology Using Stacking Single Crystal Si Layers on ILD and TANOS Structure for Beyond 30nm Node'", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3(Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-µm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal/High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration",www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.

(56) References Cited

OTHER PUBLICATIONS

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures?," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.

Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Phyisics Reviews, 1, 011104 (2014).
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T. et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.
Burr, G. W., et al., "Overview of candidate device technologies for storage-class memory," IBM Journal of Research and Development, vol. 52, No. 4.5, pp. 449-464, Jul. 2008.
Bez, R., et al., "Introduction to Flash memory," Proceedings IEEE, 91(4), 489-502 (2003).
Auth, C., et al., "45nm High-k + Metal Gate Strain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et.al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.

(56) References Cited

OTHER PUBLICATIONS

Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFET5 for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.

(56) References Cited

OTHER PUBLICATIONS

Boule, M., et al., "Adding debug enhancements to assertion checkers for hardware emulation and silicon debug", (2006) Proceedings of the IEEE International Conference on Computer Design, pp. 294-299.

Boule, M., et al., "Assertion checkers in verification, silicon debug and in-field diagnosis", (2007) Proceedings—Eighth International Symposium on Quality Electronic Design, ISQED 2007, pp. 613-618.

Burtscher, M., et al., "The VPC trace-compression algorithms", (2005) IEEE Transactions on Computers, 54 (11), Nov. 2005, pp. 1329-1344.

Frieden, B., "Trace port on powerPC 405 cores", (2007) Electronic Product Design, 28 (6), pp. 12-14.

Hopkins, A.B.T., et al., "Debug support for complex systems on-chip: A review", (2006) IEEE Proceedings: Computers and Digital Techniques, 153 (4), Jul. 2006, pp. 197-207.

Hsu, Y.-C., et al., "Visibility enhancement for silicon debug", (2006) Proceedings—Design Automation Conference, Jul. 24-28, 2006, San Francisco, pp. 13-18.

Josephson, D., et al., "The crazy mixed up world of silicon debug", (2004) Proceedings of the Custom Integrated Circuits Conference, paper 30-1, pp. 665-670.

Josephson, D.D., "The manic depression of microprocessor debug", (2002) IEEE International Test Conference (TC), paper 23.4, pp. 657-663.

Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.

Ko, H.F., et al., "Distributed embedded logic analysis for post-silicon validation of SOCs", (2008) Proceedings of the IEEE International Test Conference, paper 16.3, pp. 755-763.

Ko, H.F., et al., "Functional scan chain design at RTL for skewed-load delay fault testing", (2004) Proceedings of the Asian Test Symposium, pp. 454-459.

Ko, H.F., et al., "Resource-efficient programmable trigger units for post-silicon validation", (2009) Proceedings of the 14th IEEE European Test Symposium, ETS 2009, pp. 17-22.

Liu, X., et al., "On reusing test access mechanisms for debug data transfer in SoC post-silicon validation", (2008) Proceedings of the Asian Test Symposium, pp. 303-308.

Liu, X., et al., "Trace signal selection for visibility enhancement in post-silicon validation", (2009) Proceedings DATE, pp. 1338-1343.

McLaughlin, R., et al., "Automated debug of speed path failures using functional tests", (2009) Proceedings of the IEEE VLSI Test Symposium, pp. 91-96.

Morris, K., "On-Chip Debugging—Built-in Logic Analyzers on your FPGA", (2004) Journal of FPGA and Structured ASIC, 2 (3).

Nicolici, N., et al., "Design-for-debug for post-silicon validation: Can high-level descriptions help?", (2009) Proceedings—IEEE International High-Level Design Validation and Test Workshop, HLDVT, pp. 172-175.

Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.

Sellathamby, C.V., et al., "Non-contact wafer probe using wireless probe cards", (2005) Proceedings—International Test Conference, 2005, pp. 447-452.

Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.

Meindl, J. D., "Beyond Moore's Law: The Interconnect ERA", IEEE Computing in Science & Engineering, Jan./Feb. 2003, pp. 20-24.

Lin, X., et al., "Local Clustering 3-D Stacked CMOS Technology for Interconnect Loading Reduction", IEEE Transactions on electron Devices, vol. 53, No. 6, Jun. 2006, pp. 1405-1410.

He, T., et al., "Controllable Molecular Modulation of Conductivity in Silicon-Based Devices", J. Am. Chem. Soc. 2009, 131, 10023-10030.

Henley, F., "Engineered Substrates Using the Nanocleave Process", SemiconWest, TechXPOT Conference—Challenges in Device Scaling, Jul. 19, 2006, San Francisco.

Diamant, G., et al., "Integrated Circuits based on Nanoscale Vacuum Phototubes", Applied Physics Letters 92, 262903-1 to 262903-3 (2008).

Landesberger, C., et al., "Carrier techniques for thin wafer processing", CS MANTECH Conference, May 14-17, 2007 Austin, Texas, pp. 33-36.

Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.

Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.

Borland, J.O., "Low Temperature Activation of Ion Implanted Dopants: A Review", International Workshop on Junction technology 2002, S7-3, Japan Society of Applied Physics, pp. 85-88.

Vengurlekar, A., et al., "Hydrogen Plasma Enhancement of Boron Activation in Shallow Junctions", Applied Physics Letters, vol. 85, No. 18, Nov. 1, 2004, pp. 4052-4054.

El-Maleh, A. H., et al., "Transistor-Level Defect Tolerant Digital System Design at the Nanoscale", Research Proposal Submitted to Internal Track Research Grant Programs, 2007. Internal Track Research Grant Programs.

Austin, T., et al., "Reliable Systems on Unreliable Fabrics", IEEE Design & Test of Computers, Jul./Aug. 2008, vol. 25, issue 4, pp. 322-332.

Borkar, S., "Designing Reliable Systems from Unreliable Components: The Challenges of Transistor Variability and Degradation", IEEE Micro, IEEE Computer Society, Nov.-Dec. 2005, pp. 10-16.

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

(56) References Cited

OTHER PUBLICATIONS

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+'" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-584, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.
FOA—De3 Apr. 26, 2013: Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.

(56) References Cited

OTHER PUBLICATIONS

FOA—De3 Apr. 26, 2013: Khakifirooz, A., "ETSOI Technology for 20nm and Beyond", SOI Consortium Workshop: Fully Depleted SOI, Apr. 28, 2011, Hsinchu Taiwan.
Email/mtg Byoung Hun Lee: Kim, I.-K., et al.,"Advanced Integration Technology for a Highly Scalable SOI DRAM with SOC (Silicon-On-Capacitors)", IEDM 1996, pp. 96-605-96-608, 22.5.4.
Lee, B.H., et al., "A Novel CMP Method for cost-effective Bonded SOI Wafer Fabrication," Proceedings 1995 IEEE International SOI Conference, Oct. 1995, pp. 60-61.

* cited by examiner

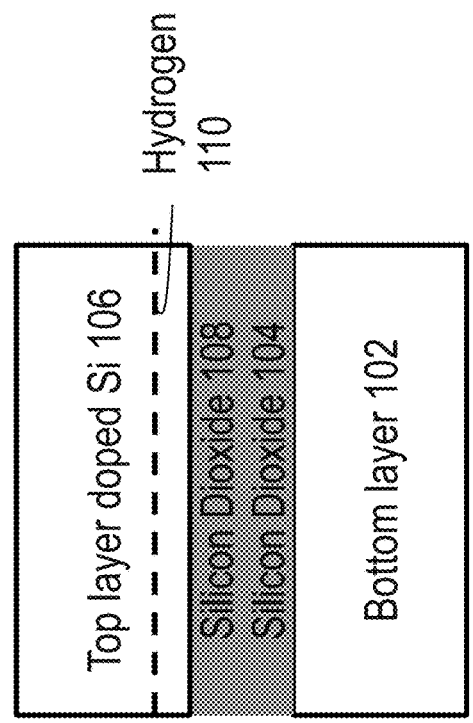
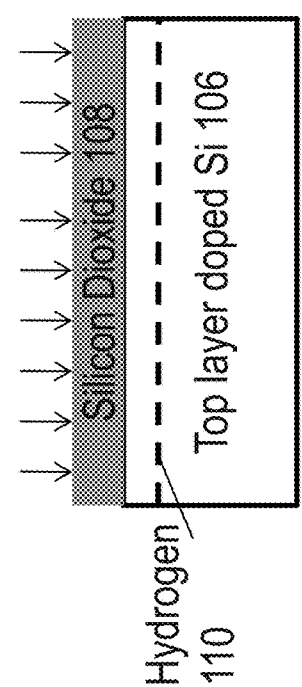
Fig. 1A
Fig. 1B
Fig. 1C
Fig. 1D

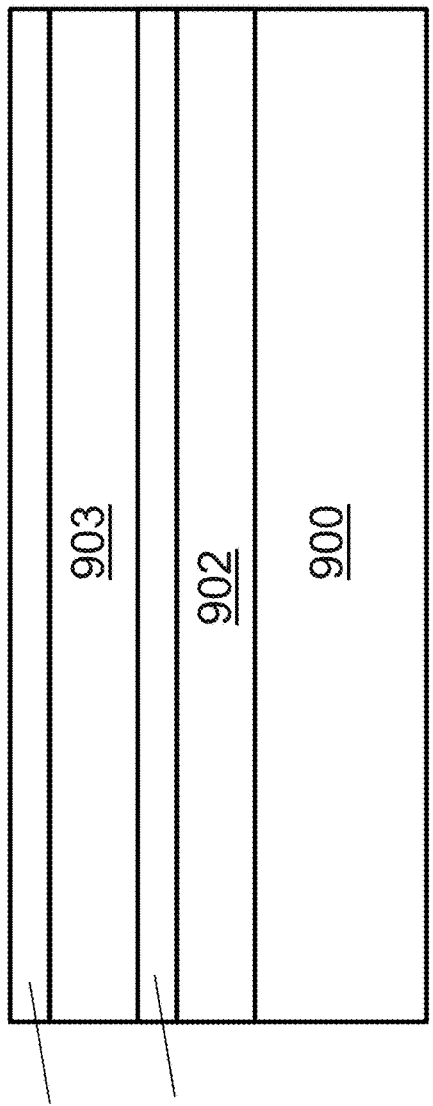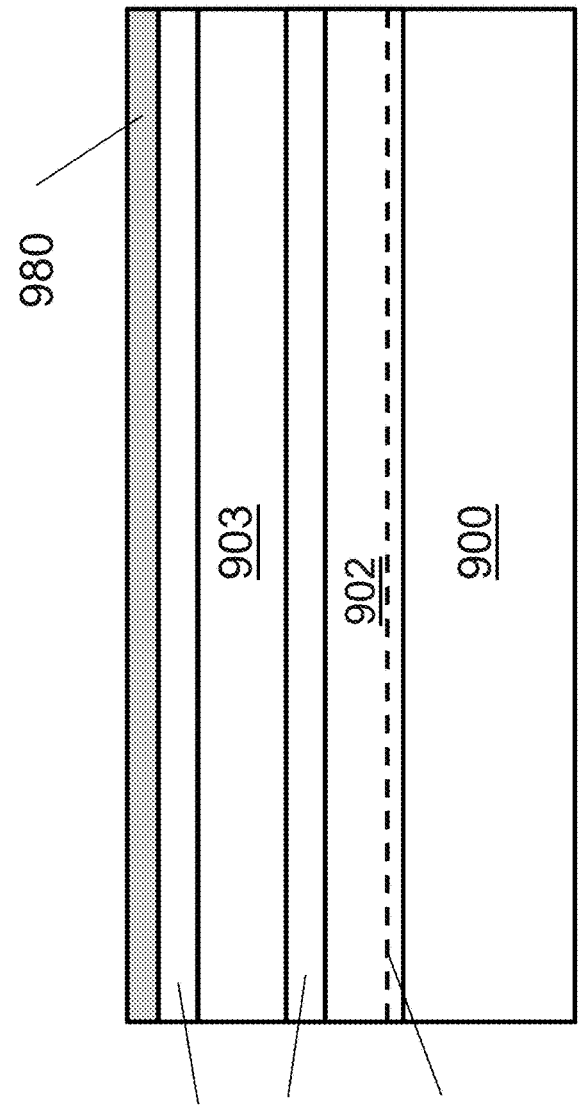

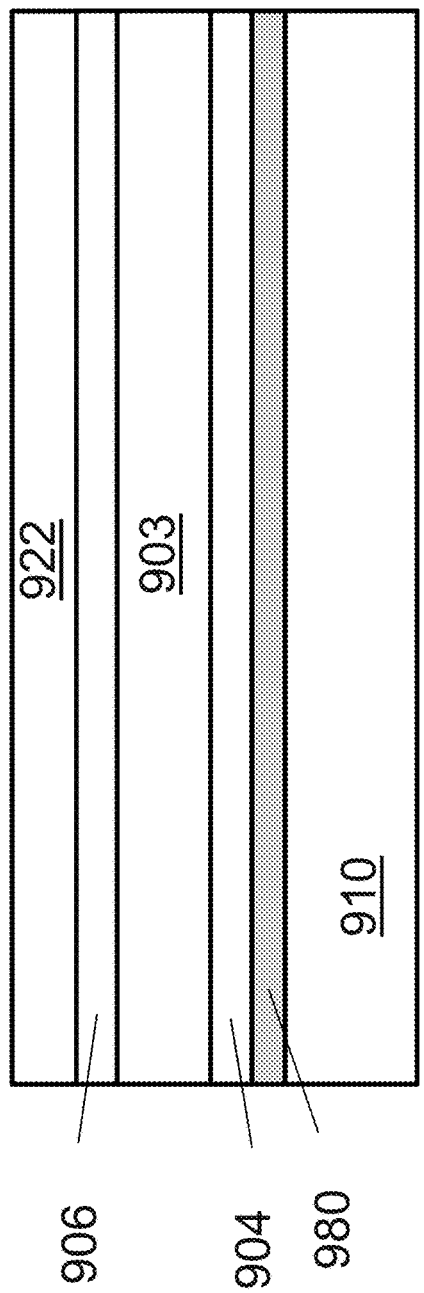
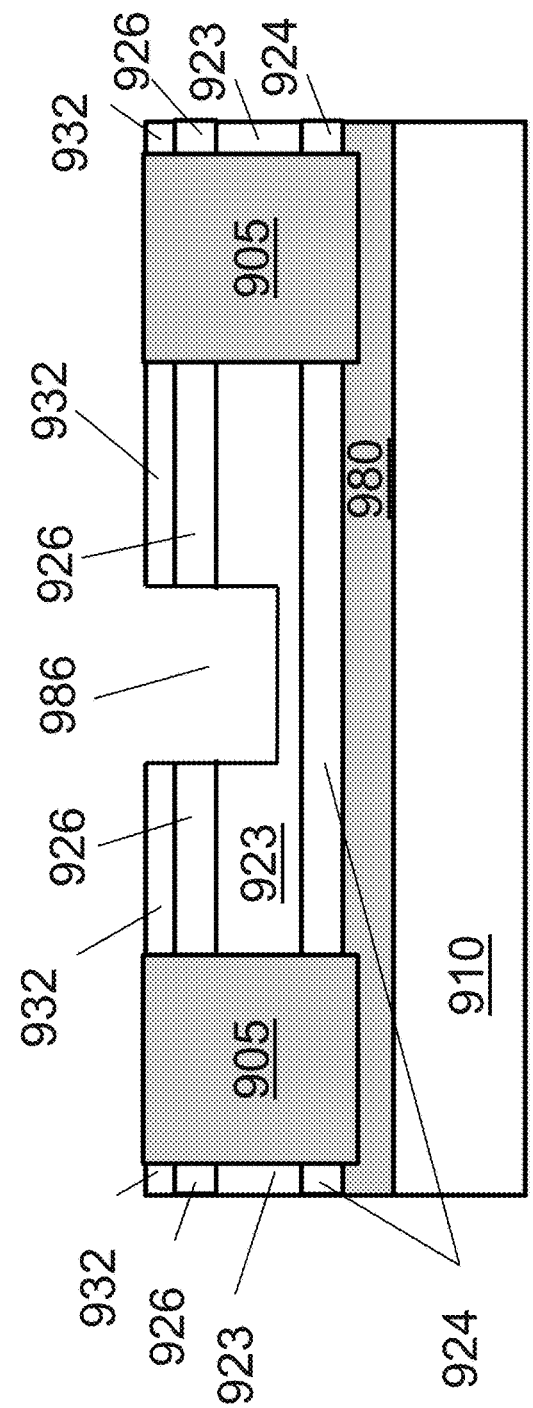

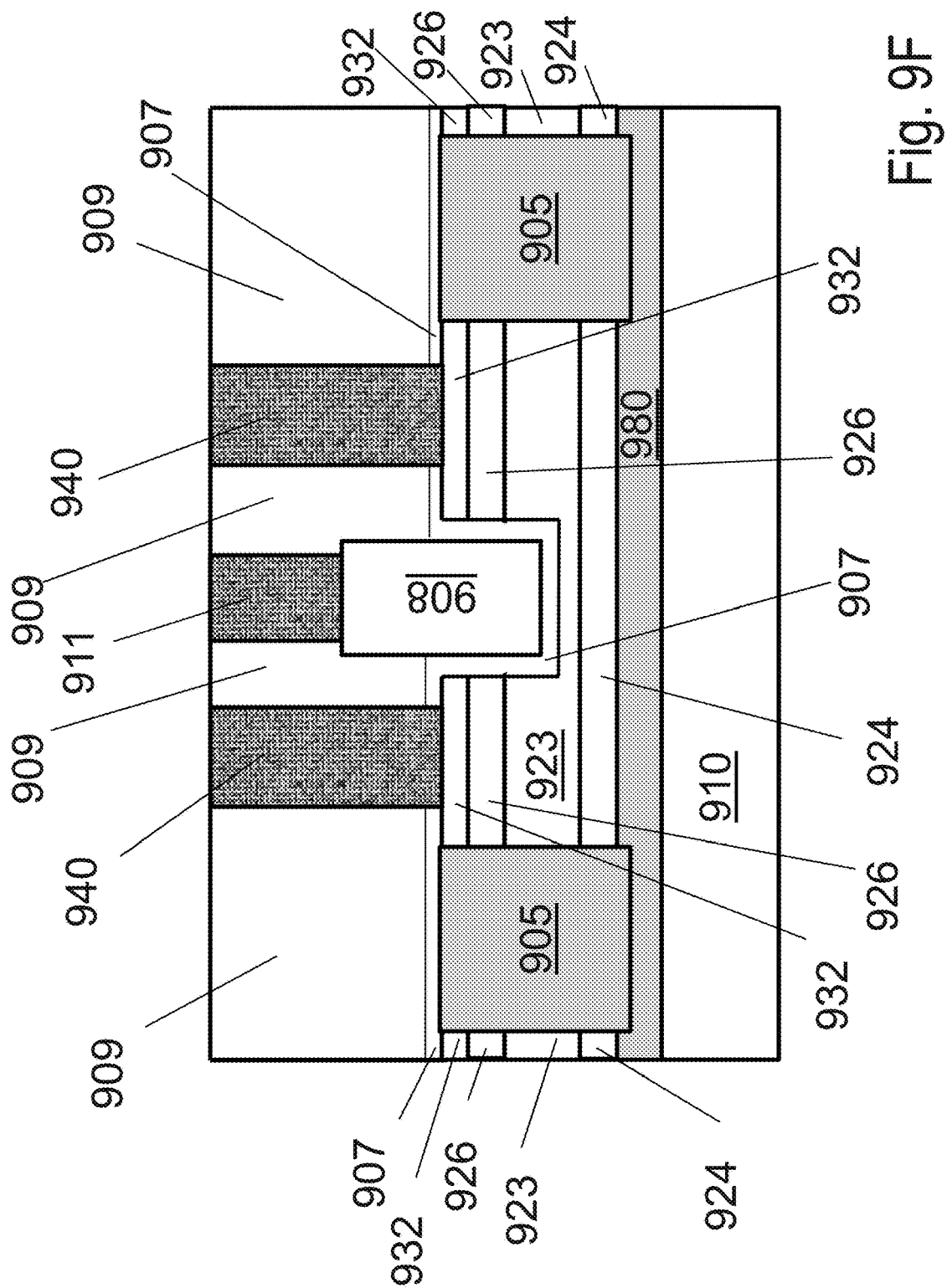

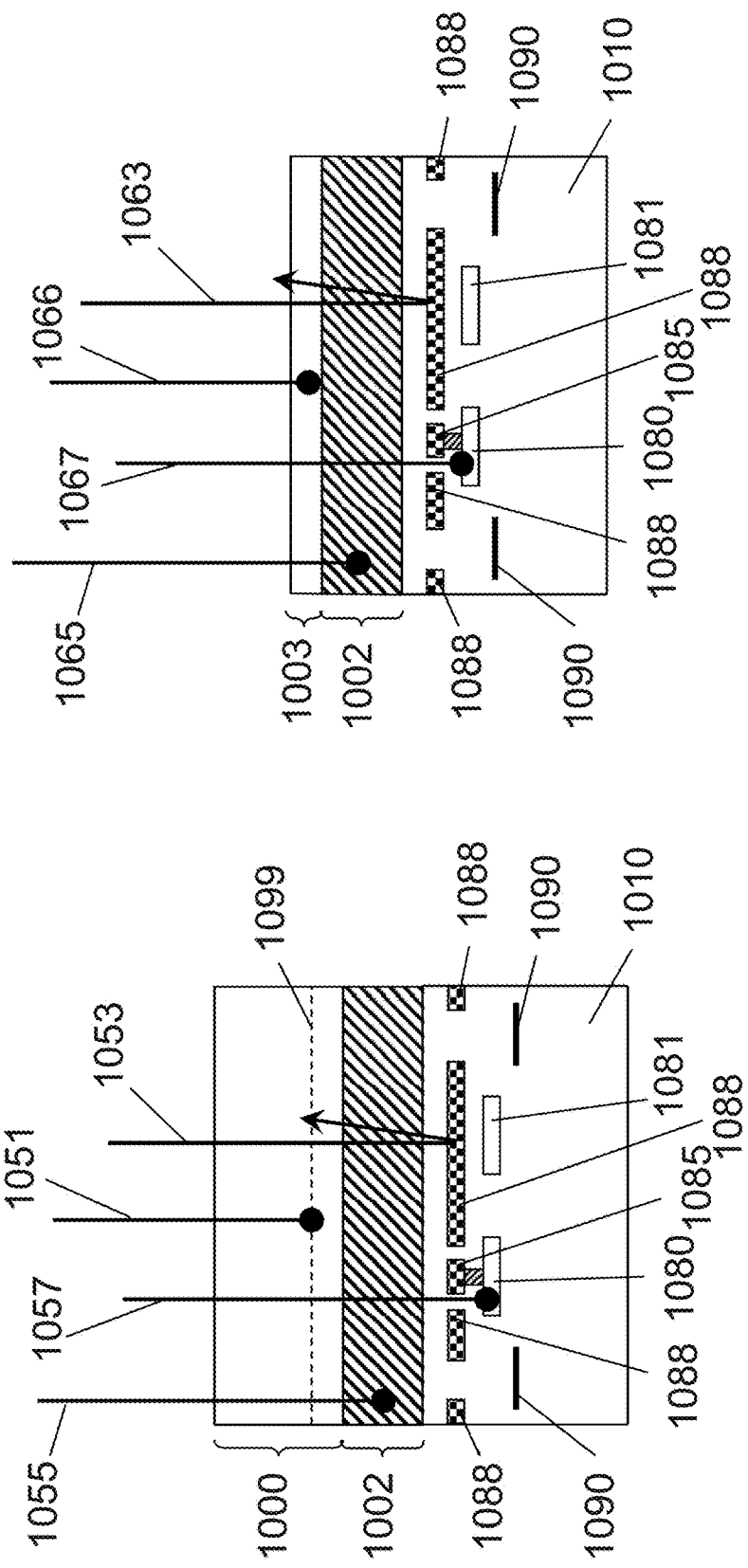

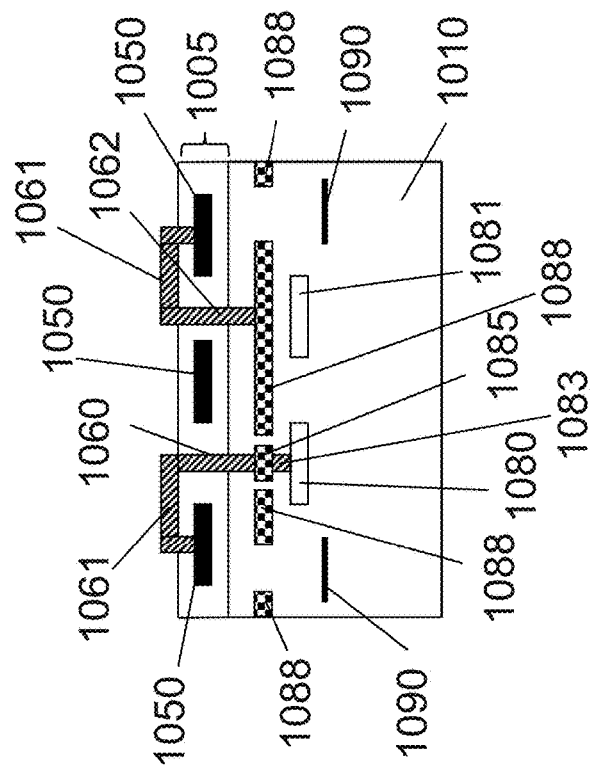
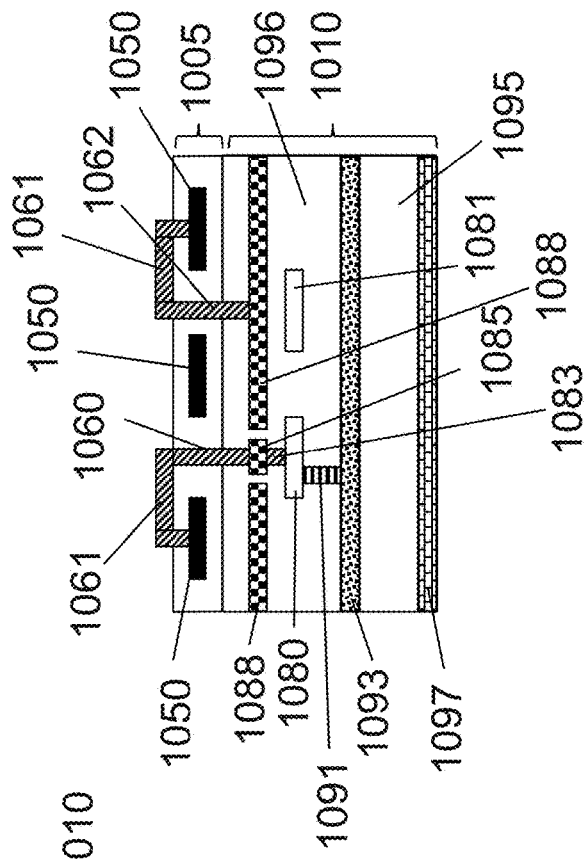
FIG. 10E
FIG. 10F

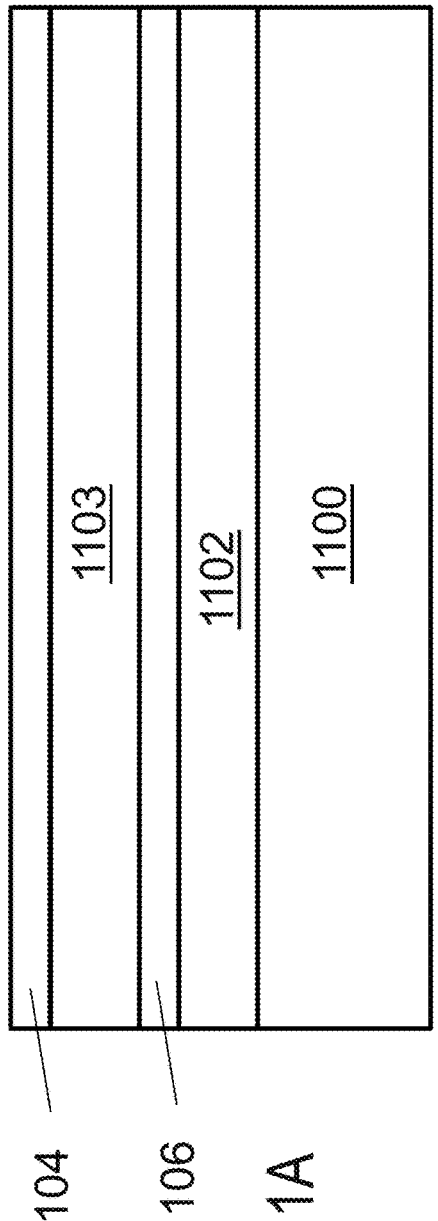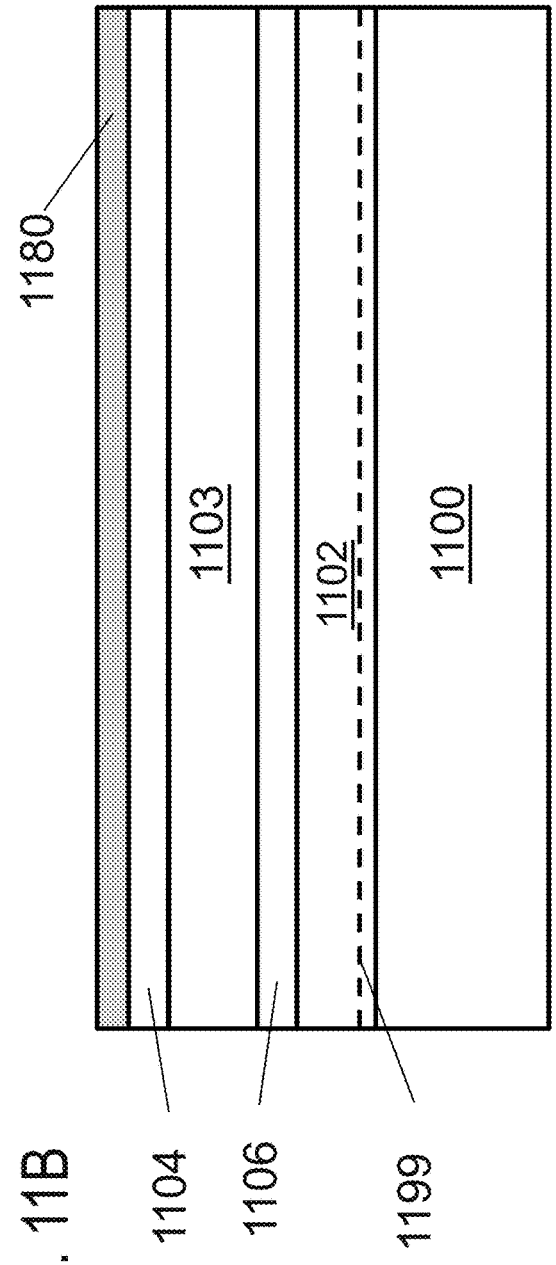

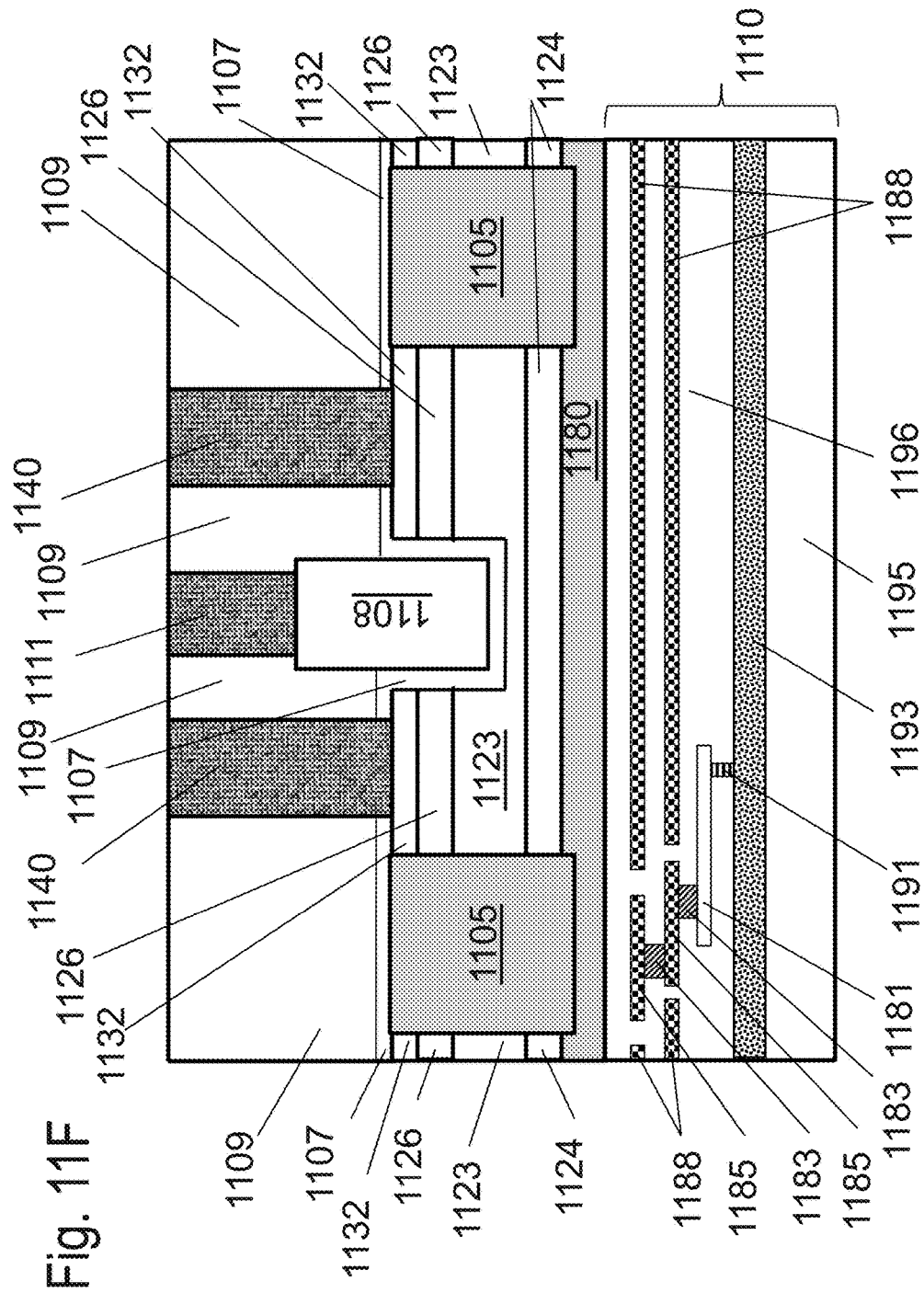

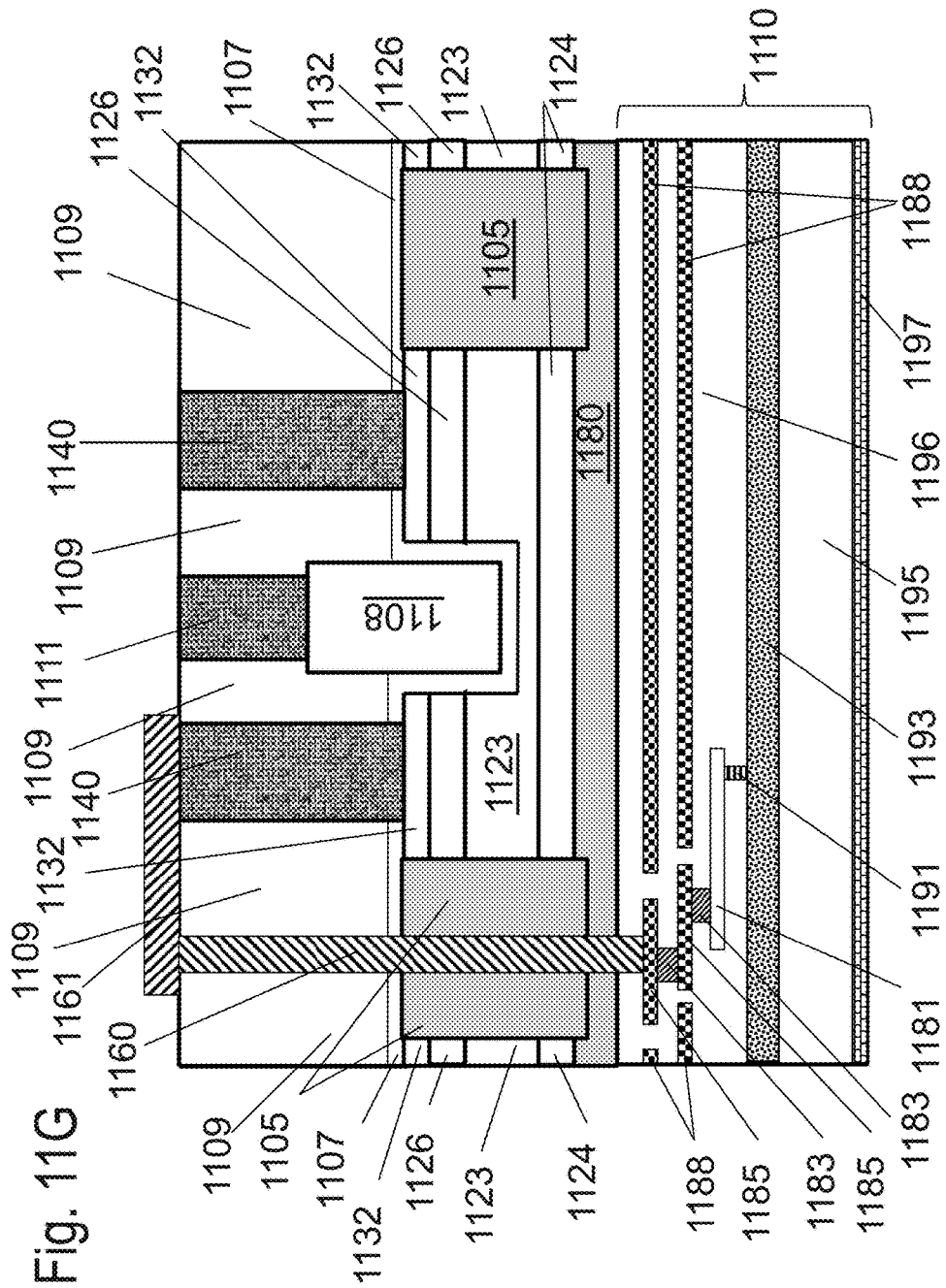

3D SEMICONDUCTOR DEVICE AND STRUCTURE

FIELD OF THE INVENTION

This application relates to the general field of Integrated Circuit (IC) devices and fabrication methods, and more particularly to multilayer or Three Dimensional Integrated Circuit (3D-IC) devices and fabrication methods.

DISCUSSION OF BACKGROUND ART

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,509,313, 9,640,531, 9,691,760, 9,711,407, 9,721,927, 9,871,034; and pending U.S. Patent Application Publications and applications; 2017/0117291, 2017/0133395, 2017/0207214, 2017/0221761, 15/173,686, 62/539,054, 62/562,457; and International Applications: PCT/US2010/052093, PCT/US2011/042071, PCT/US2016/52726, PCT/US2017/052359. The entire contents of the foregoing patents, publications, and applications are incorporated herein by reference.

Electro-Optics: There is also work done for integrated monolithic 3D including layers of different crystals, such as U.S. Pat. Nos. 8,283,215, U.S. Pat. Nos. 8,163,581, 8,753,913, 8,823,122, 9,197,804, 9,419,031; and U.S. patent application publication 2016/0064439. The entire contents of the foregoing patents, publications, and applications are incorporated herein by reference.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a 3D semiconductor device, the device comprising: a first single crystal layer comprising a plurality of first transistors; at least one metal layer interconnecting said first transistors, a portion of said first transistors forming a plurality of logic gates; a plurality of second transistors overlaying said first single crystal layer; at least one connection from said plurality of first transistors to a plurality of through silicon vias (TSVs); a plurality of third transistors overlaying said plurality of second transistors, wherein said plurality of second transistors are self-aligned to said plurality of third transistors having been processed following the same lithography step; and a first memory array and a second memory array, wherein said first memory array comprises said plurality of second transistors and said second memory array comprises said plurality of third transistors, wherein at least one of said plurality of second transistors comprises a polysilicon channel, wherein at least one of said plurality of second transistors is a junction-less transistor, and wherein each of said plurality of second transistors comprises a gate.

In another aspect, a 3D semiconductor device, the device comprising: a first single crystal layer comprising a plurality of first transistors; at least one metal layer interconnecting said first transistors, a portion of said first transistors forming a plurality of logic gates; a plurality of second transistors overlaying said first single crystal layer; at least one connection from said plurality of first transistors to a plurality of through silicon vias (TSVs); a plurality of third transistors overlaying said plurality of second transistors, wherein said plurality of second transistors are self-aligned to said plurality of third transistors having been processed following the same lithography step; and a first memory array and a second memory array, wherein said first memory array comprises said plurality of second transistors and said second memory array comprises said plurality of third transistors, wherein at least one of said plurality of second transistors comprises a polysilicon channel, wherein at least one of said plurality of second transistors is a junction-less transistor, and said device further comprising: a first set of external connections underlying said one metal layer to connect said device to a first external device; and a second set of external connections overlying said one metal layer to connect said device to a second external device, wherein said first set of external connections comprises said plurality of through silicon vias (TSVs).

In another aspect, a 3D semiconductor device, the device comprising: a first single crystal layer comprising a plurality of first transistors; at least one metal layer interconnecting said first transistors, a portion of said first transistors forming a plurality of logic gates; a plurality of second transistors overlaying said first single crystal layer; at least one connection from said plurality of first transistors to a plurality of through silicon vias (TSVs); a plurality of third transistors overlaying said plurality of second transistors, wherein said plurality of second transistors are self-aligned to said plurality of third transistors having been processed following the same lithography step; and a first memory array and a second memory array, wherein said first memory array comprises said plurality of second transistors and said second memory array comprises said plurality of third transistors.

BRIEF DESCRIPTION OF THE DRAWINGS

Various embodiments of the invention will be understood and appreciated more fully from the following detailed description, taken in conjunction with the drawings in which:

FIGS. 1A-1E are exemplary drawing illustrations of a layer transfer flow using ion-cut in which a top layer of doped Si is layer transferred atop a generic bottom layer;

FIGS. 3A-3J are exemplary drawing illustrations of a zero-mask per layer 3D resistive memory with a junctionless transistor;

FIGS. 4A-4K are exemplary drawing illustrations of an alternative zero-mask per layer 3D resistive memory;

FIGS. 9A-9F are exemplary drawing illustrations of a process flow for manufacturing fully depleted Recessed Channel Array Transistors (FD-RCAT);

FIGS. 10A-10F are exemplary drawing illustrations of the integration of a shield/heat sink layer in a 3D-IC; and FIGS. 11A-11G are exemplary drawing illustrations of a process flow for manufacturing fully depleted Recessed Channel Array Transistors (FD-RCAT) with an integrated shield/heat sink layer.

DETAILED DESCRIPTION

Figure 1E:
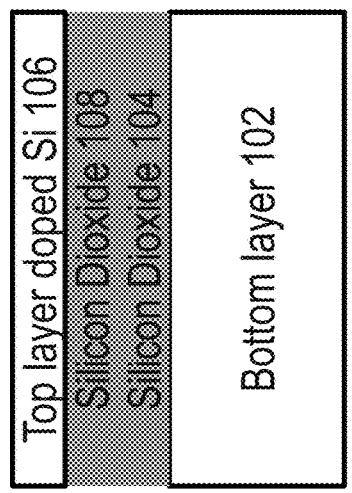

Various embodiments of inventions are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

FIGS. 1A-1E describes an ion-cut flow for layer transferring a single crystal silicon layer atop any generic bottom layer 102. The bottom layer 102 can be a single crystal silicon layer. Alternatively, it can be a wafer having transistors with wiring layers above it. This process of ion-cut based layer transfer may include several steps, as described in the following sequence:

Step (A): A silicon dioxide layer 104 is deposited above the generic bottom layer 102. FIG. 1A illustrates the structure after Step (A) is completed.

Step (B): The top layer of doped or undoped silicon 106 to be transferred atop the bottom layer is processed and an oxide layer 108 is deposited or grown above it. FIG. 1B illustrates the structure after Step (B) is completed.

Step (C): Hydrogen is implanted into the top layer silicon 106 with the peak at a certain depth to create the hydrogen plane 110. Alternatively, another atomic species such as helium or boron can be implanted or co-implanted. FIG. 1C illustrates the structure after Step (C) is completed.

Step (D): The top layer wafer shown after Step (C) is flipped and bonded atop the bottom layer wafer using oxide-to-oxide bonding. FIG. 1D illustrates the structure after Step (D) is completed.

Step (E): A cleave operation is performed at the hydrogen plane 110 using an anneal. Alternatively, a sideways mechanical force may be used. Further details of this cleave process are described in "Frontiers of silicon-on-insulator," J. Appl. Phys. 93, 4955-4978 (2003) by G. K. Celler and S. Cristoloveanu ("Celler") and "Mechanically induced Si layer transfer in hydrogen-implanted Si wafers," Appl. Phys. Lett., vol. 76, pp. 1370-1372, 1000 by K. Henttinen, I. Suni, and S. S. Lau ("Hentinnen"). Following this, a Chemical-Mechanical-Polish (CMP) is done. FIG. 1E illustrates the structure after Step (E) is completed.

FIG. 2A-K describe an alternative process flow to construct a horizontally-oriented monolithic 3D DRAM. This monolithic 3D DRAM utilizes the floating body effect and double-gate transistors. No mask is utilized on a "per-memory-layer" basis for the monolithic 3D DRAM concept shown in FIG. 2A-K, and all other masks are shared between different layers. The process flow may include several steps in the following sequence.

Figure 2A:
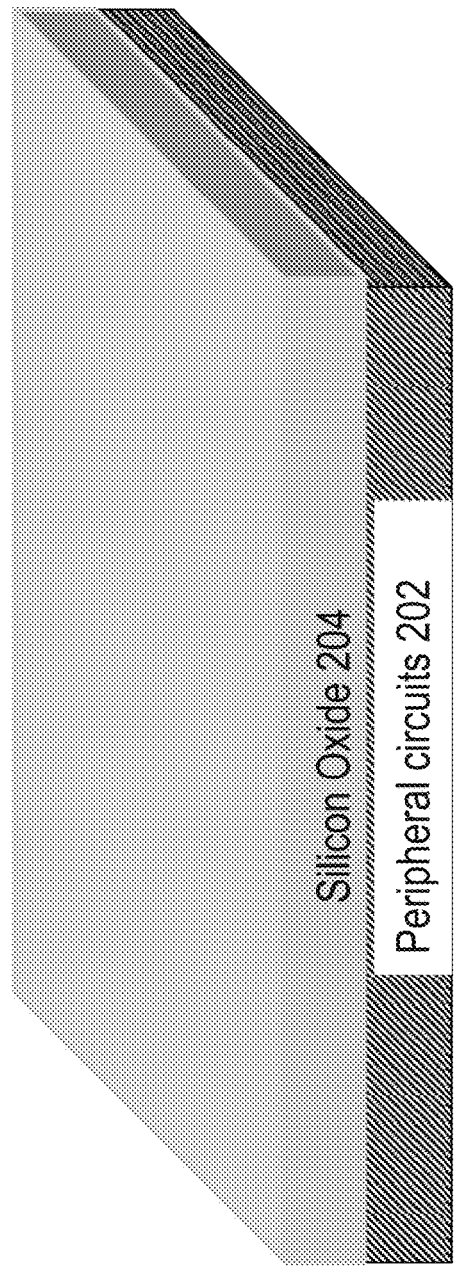
FIGS. 2A-2K are exemplary drawing illustrations of a zero-mask per layer 3D floating body DRAM.

Step (A): Peripheral circuits with tungsten wiring 202 are first constructed and above this oxide layer 204 is deposited. FIG. 2A shows a drawing illustration after Step (A).

Figure 2B:
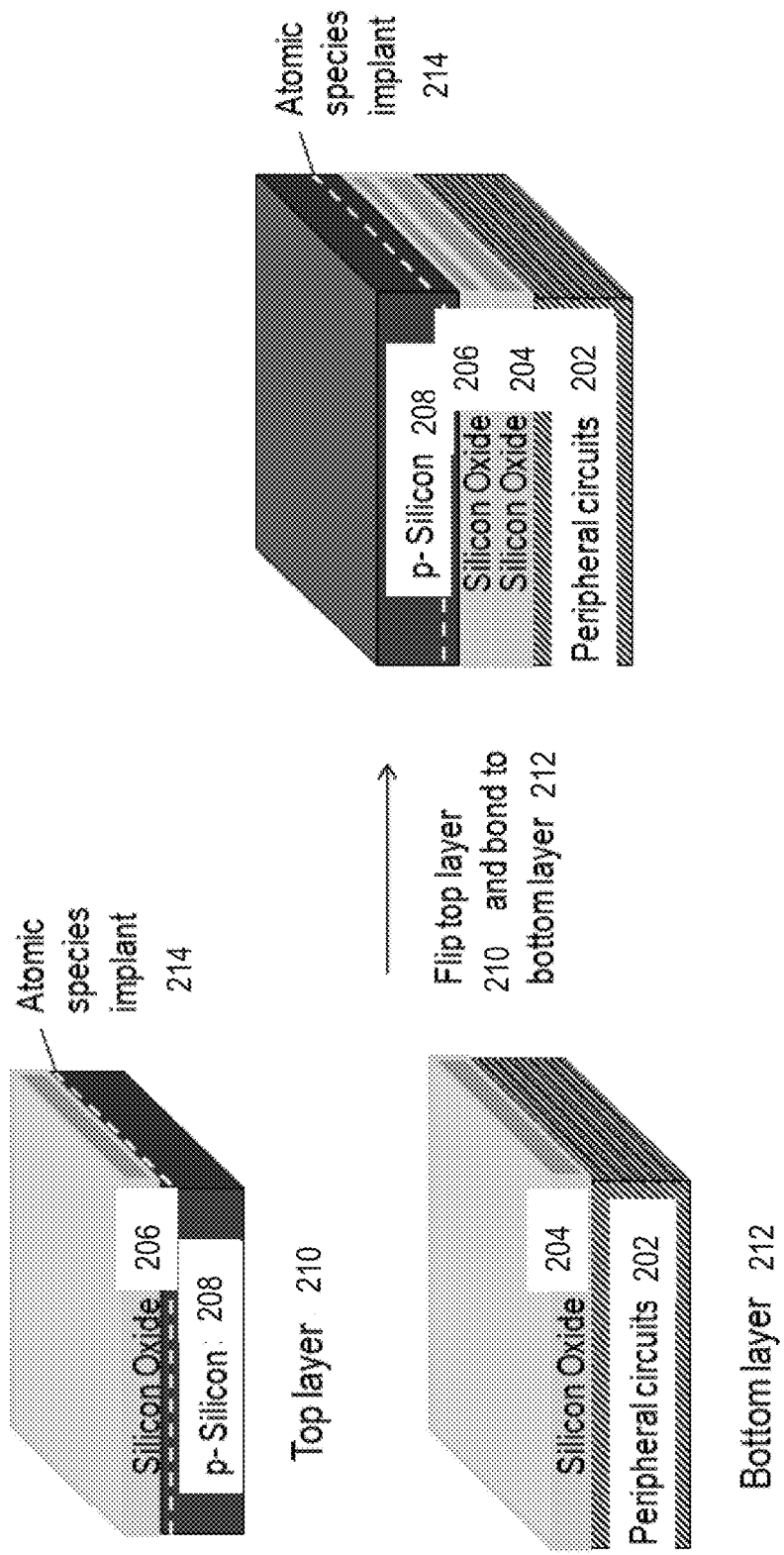

Step (B): FIG. 2B illustrates the structure after Step (B). A p− Silicon wafer 208 has an oxide layer 206 grown or deposited above it. Following this, hydrogen is implanted into the p− Silicon wafer at a certain depth indicated by 214. Alternatively, some other atomic species such as Helium could be (co-)implanted. This hydrogen implanted p− Silicon wafer 208 forms the top layer 210. The bottom layer 212 may include the peripheral circuits 202 with oxide layer 204. The top layer 210 is flipped and bonded to the bottom layer 212 using oxide-to-oxide bonding.

Figure 2C:
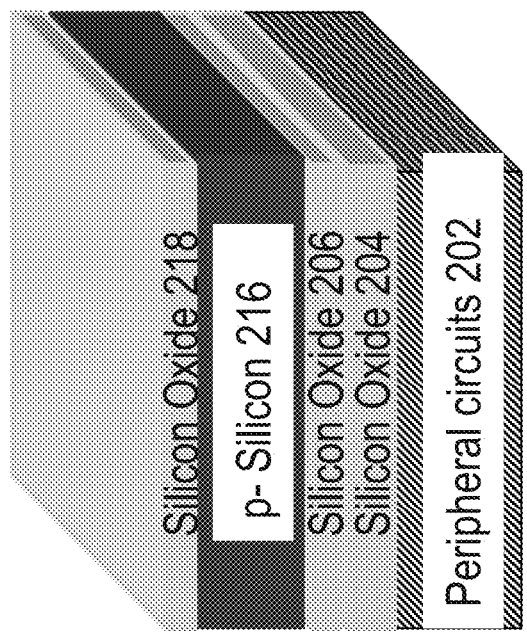

Step (C): FIG. 2C illustrates the structure after Step (C). The stack of top and bottom wafers after Step (B) is cleaved at the hydrogen plane 214 using either a anneal or a sideways mechanical force or other means. A CMP process is then conducted. A layer of silicon oxide 218 is then deposited atop the p− Silicon layer 216. At the end of this step, a single-crystal p− Silicon layer 216 exists atop the peripheral circuits, and this has been achieved using layer-transfer techniques.

Figure 2D:
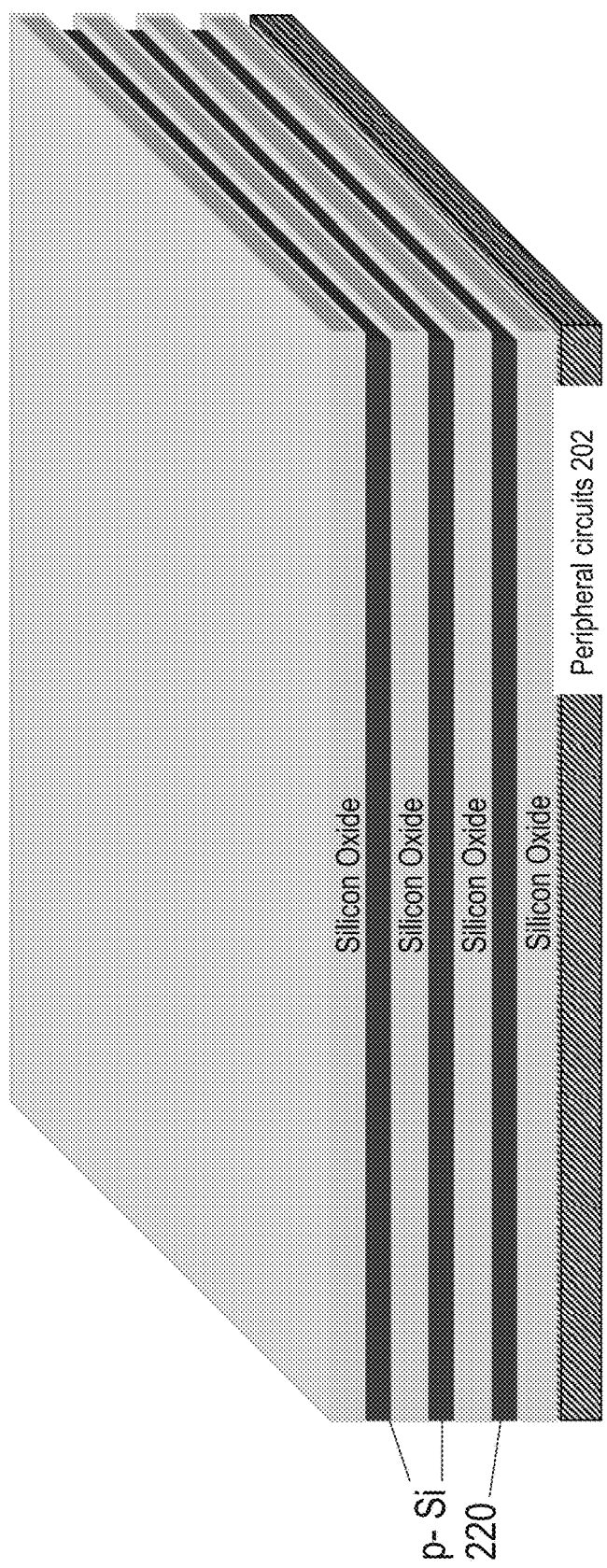

Step (D): FIG. 2D illustrates the structure after Step (D). Using methods similar to Step (B) and (C), multiple p− silicon layers 220 are formed with silicon oxide layers in between.

Figure 2E:
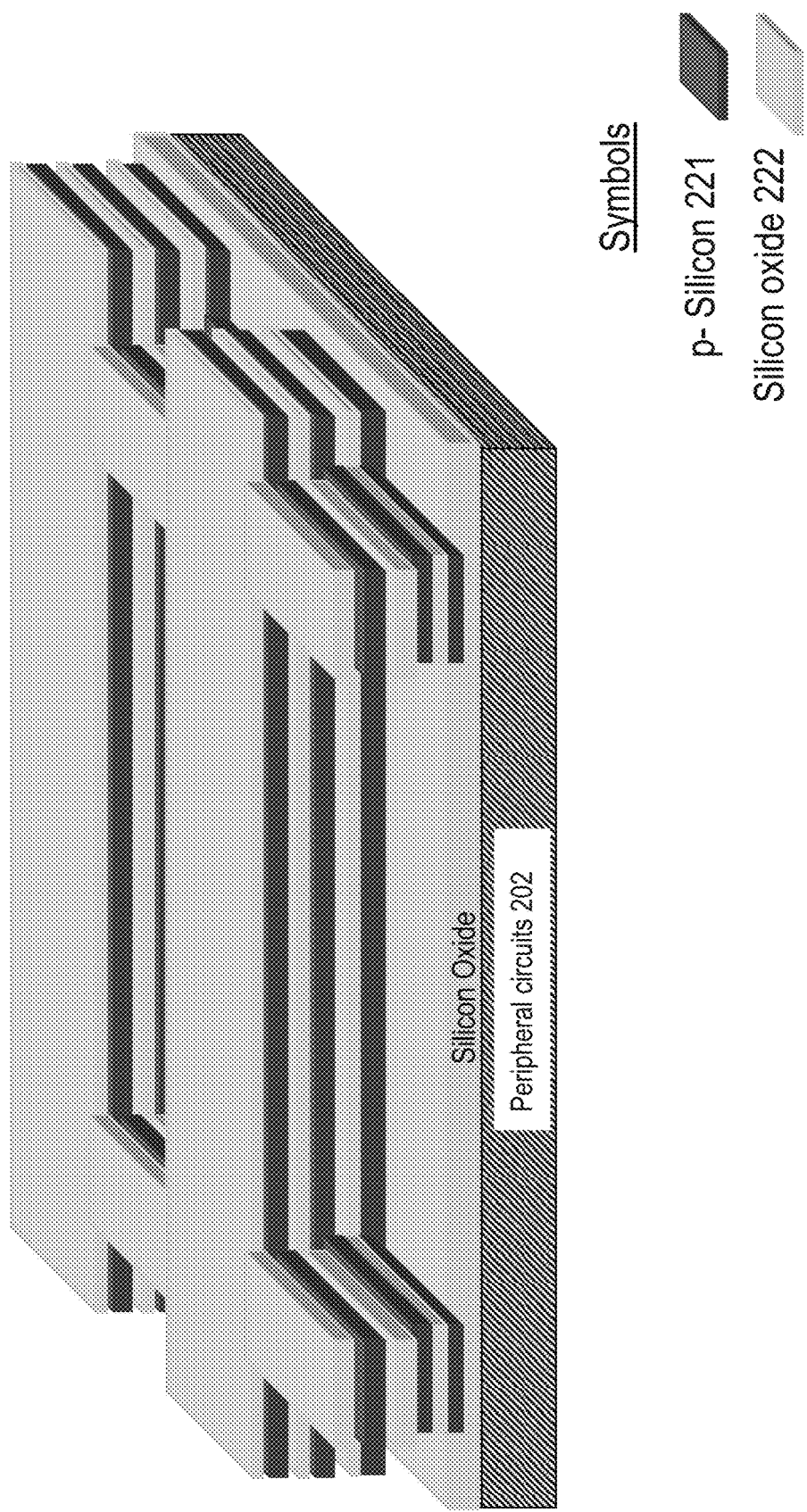

Step (E): FIG. 2E illustrates the structure after Step (E). Lithography and etch processes are then utilized to make a structure as shown in the figure.

Figure 2F:
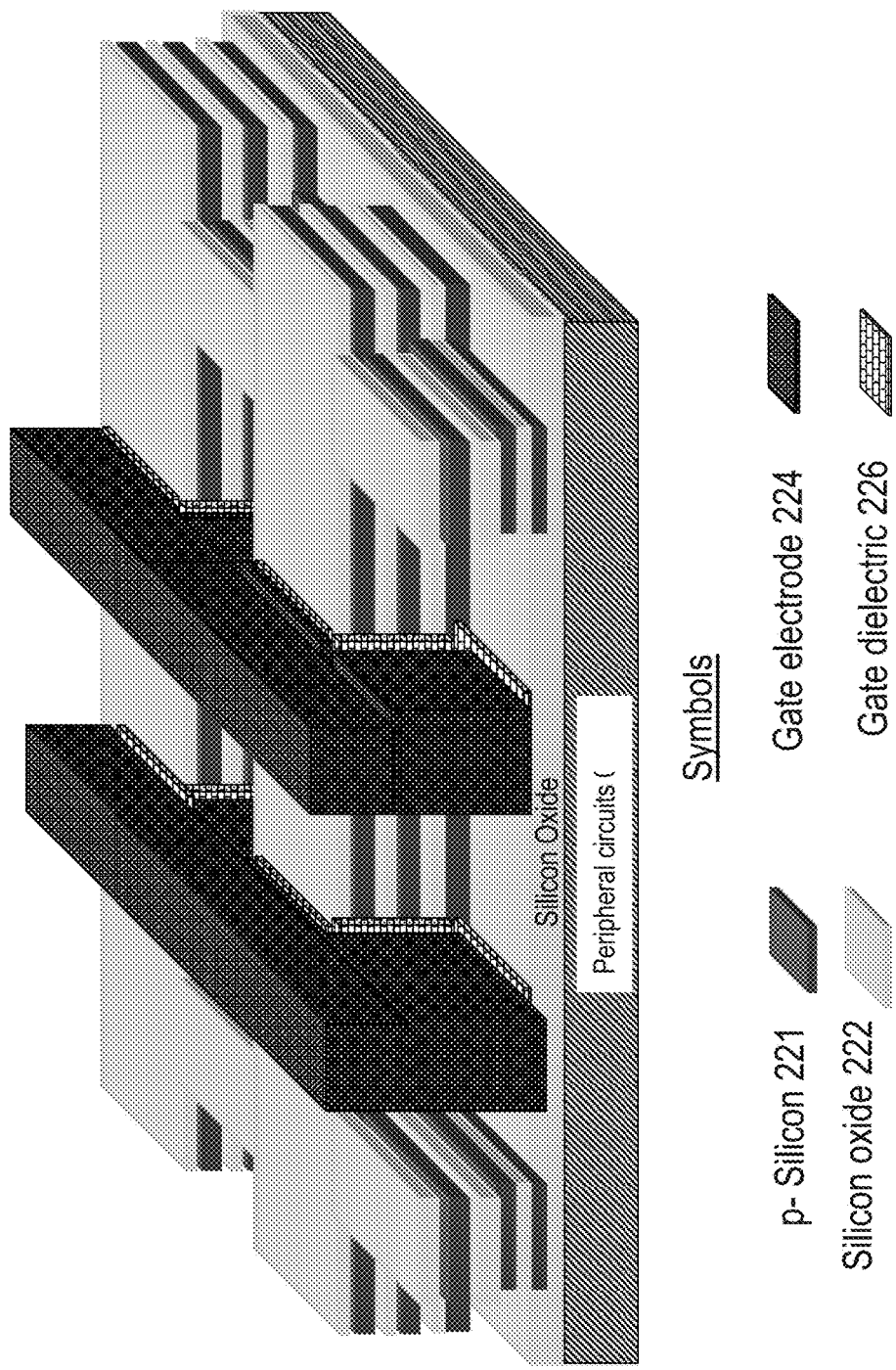

Step (F): FIG. 2F illustrates the structure after Step (F). Gate dielectric 226 and gate electrode 224 are then deposited following which a CMP is done to planarize the gate electrode 224 regions. Lithography and etch are utilized to define gate regions.

Figure 2G:
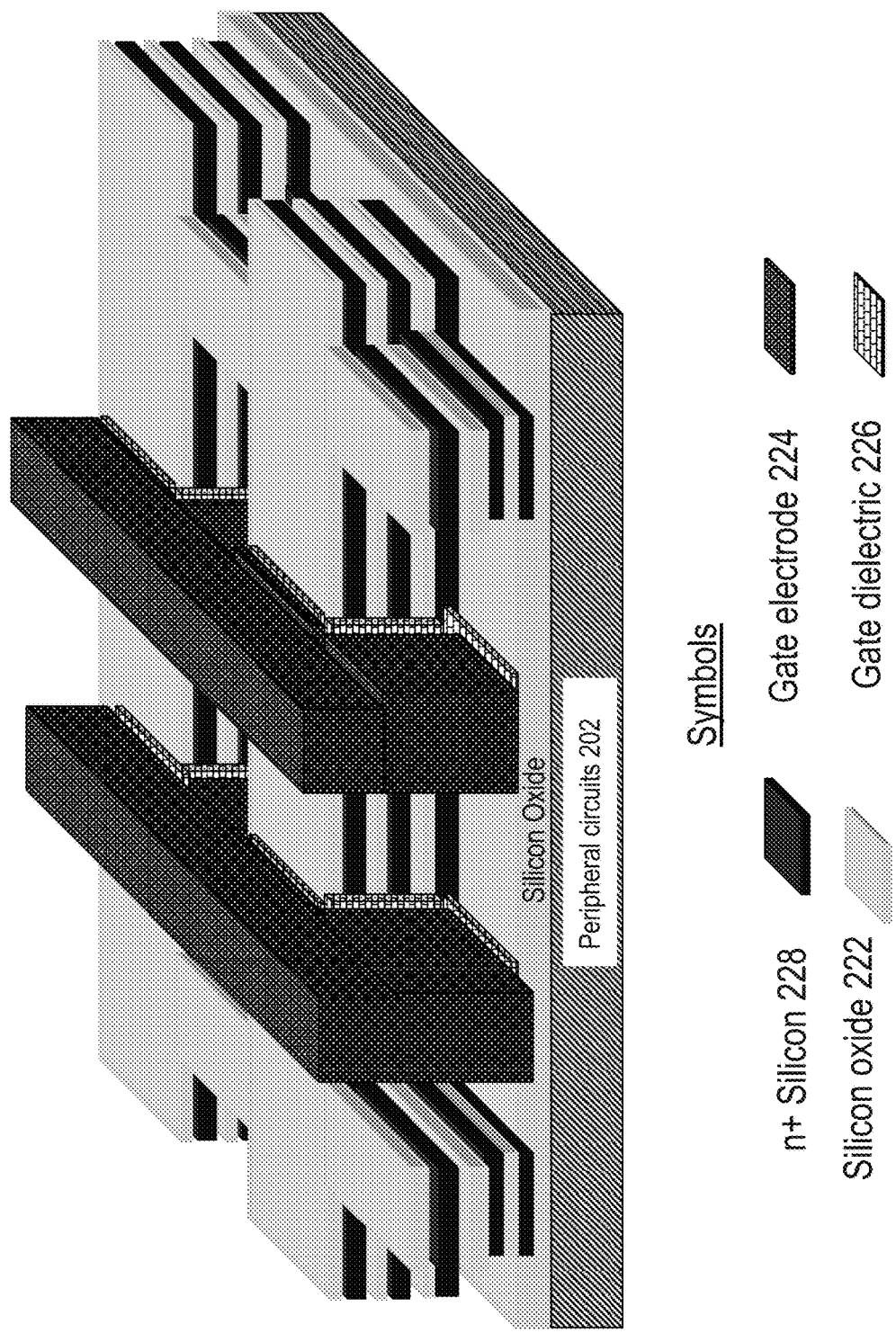

Step (G): FIG. 2G illustrates the structure after Step (G). Using the hard mask defined in Step (F), p− regions not covered by the gate are implanted to form n+ regions. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 2H:
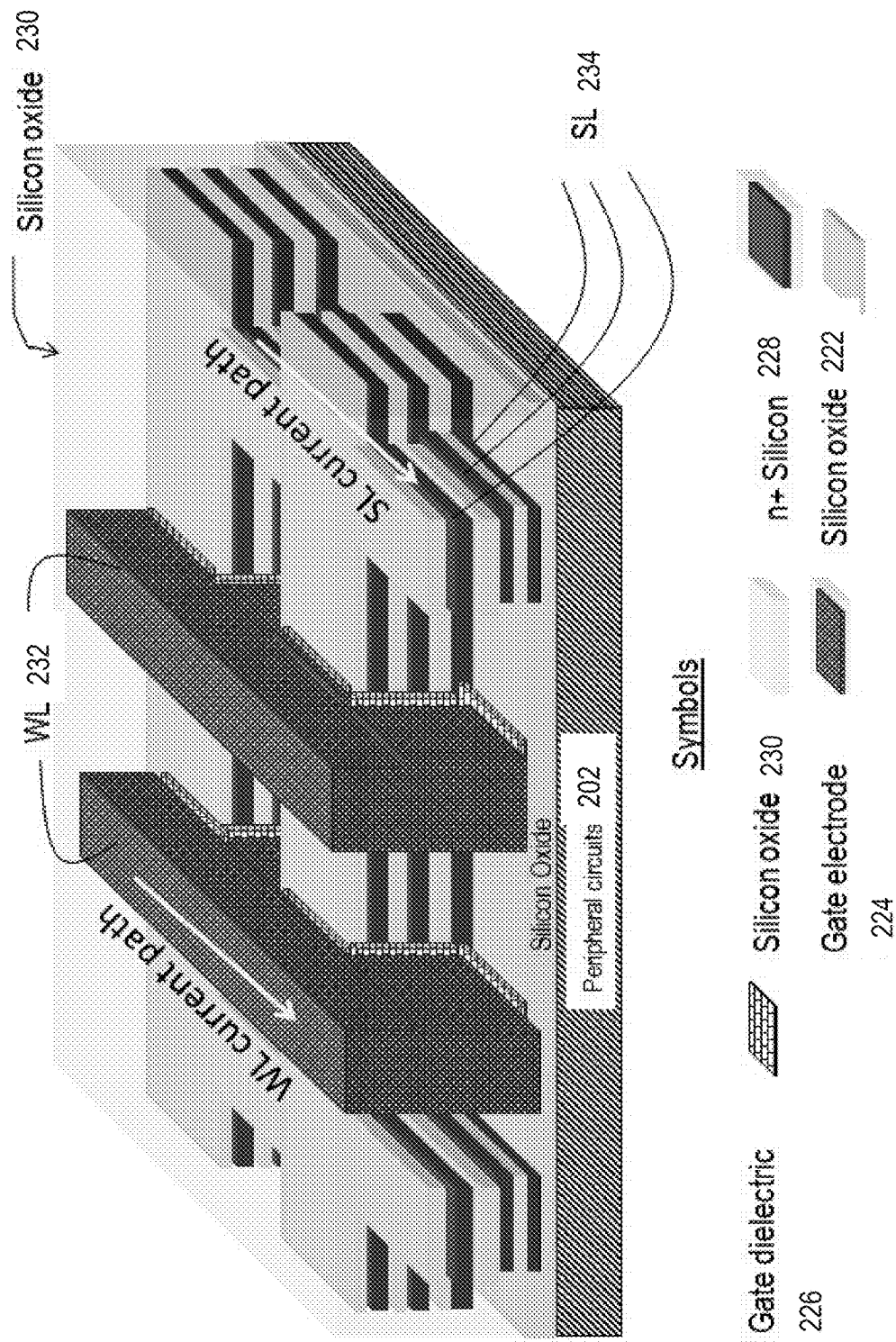

Step (H): FIG. 2H illustrates the structure after Step (H). A silicon oxide layer 230 is then deposited and planarized For clarity, the silicon oxide layer is shown transparent, along with word-line (WL) 232 and source-line (SL) 234 regions.

Figure 2I:
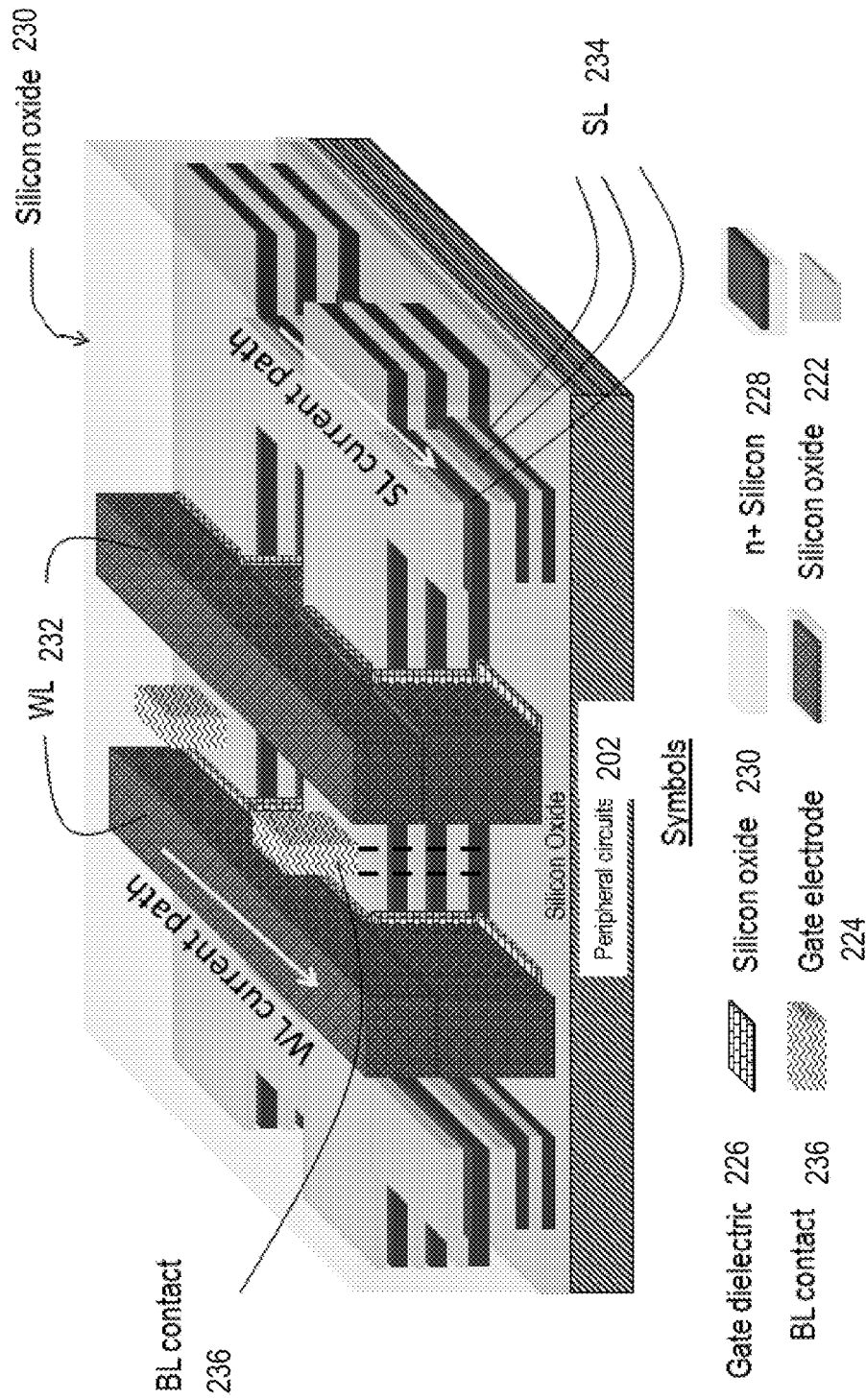

Step (I): FIG. 2I illustrates the structure after Step (I). Bit-line (BL) contacts 236 are formed by etching and deposition. These BL contacts are shared among all layers of memory.

Figure 2J:
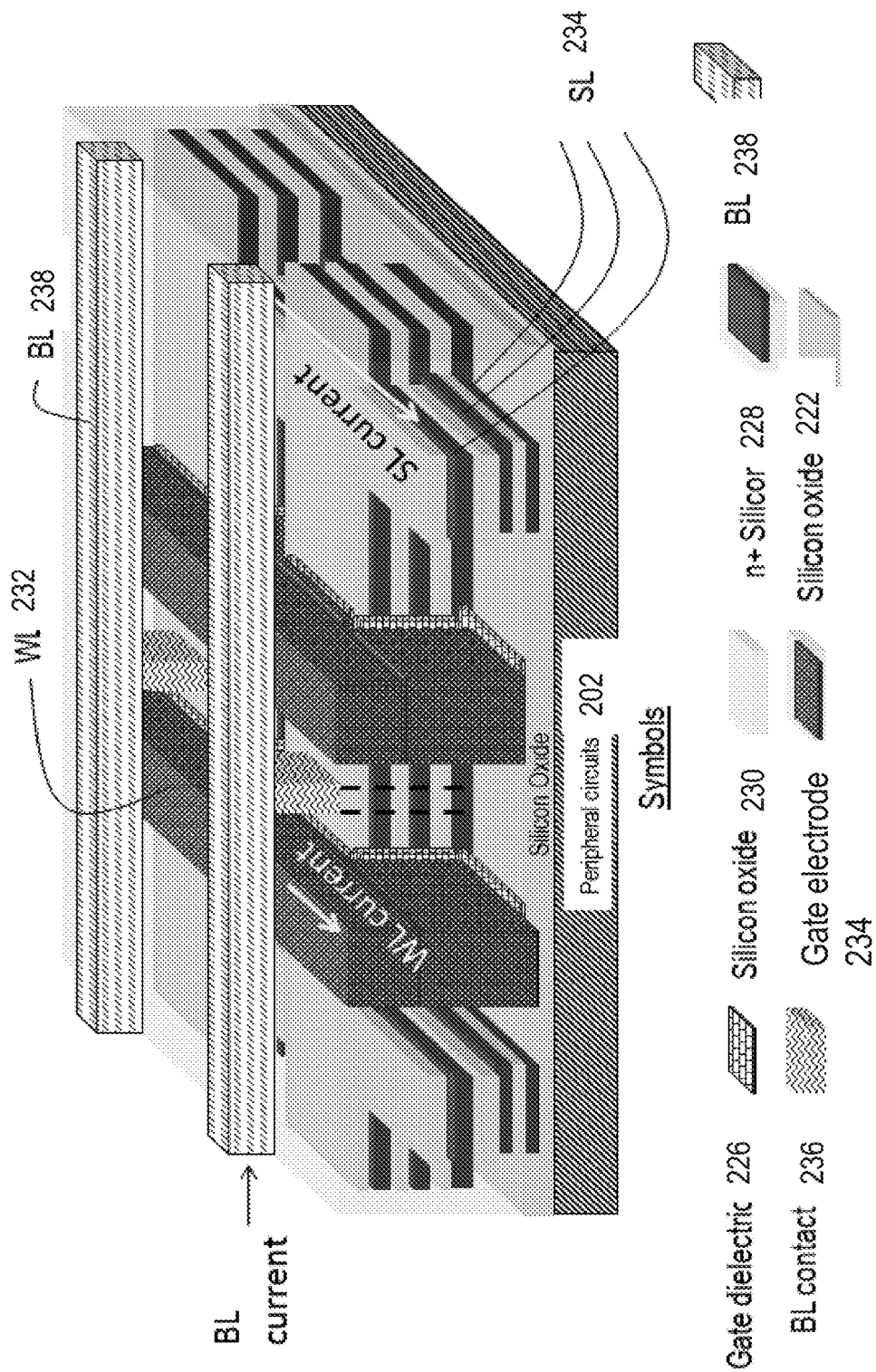

Step (J): FIG. 2J illustrates the structure after Step (J). BLs 238 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

Figure 2K:
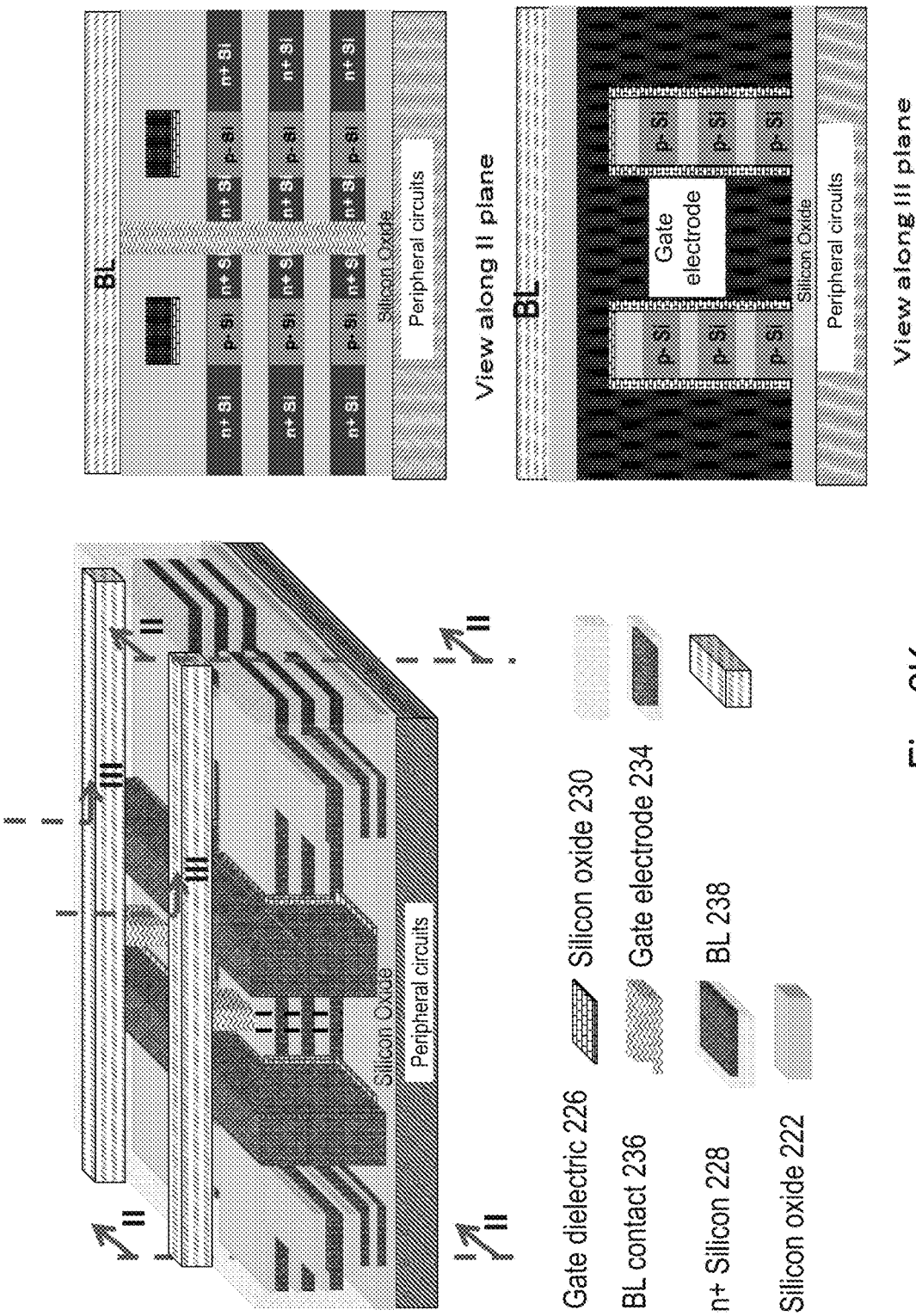

FIG. 2K shows cross-sectional views of the array for clarity. Double-gated transistors may be utilized along with the floating body effect for storing information.

A floating-body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, conductive bridge RAM, and MRAM. Background information on these resistive-memory types is given in "Overview of candidate device technologies for storage-class memory," IBM Journal of Research and Development, vol.52, no.4.5, pp. 449-464, July 2008 by Burr, G. W.; Kurdi, B. N.; Scott, J. C.; Lam, C. H.; Gopalakrishnan, K.; Shenoy, R. S.

FIG. 3A-J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIG. 3A-J, and all other masks are shared between different layers. The process flow may include several steps that occur in the following sequence.

Figure 3A:
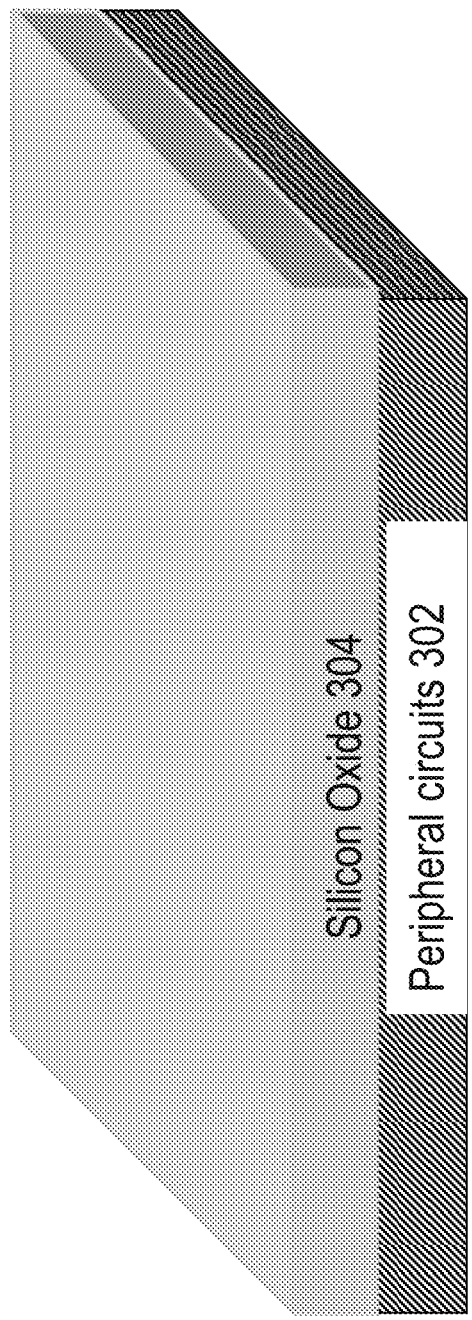

Step (A): Peripheral circuits 302 are first constructed and above this oxide layer 304 is deposited. FIG. 3A shows a drawing illustration after Step (A).

Figure 3B:
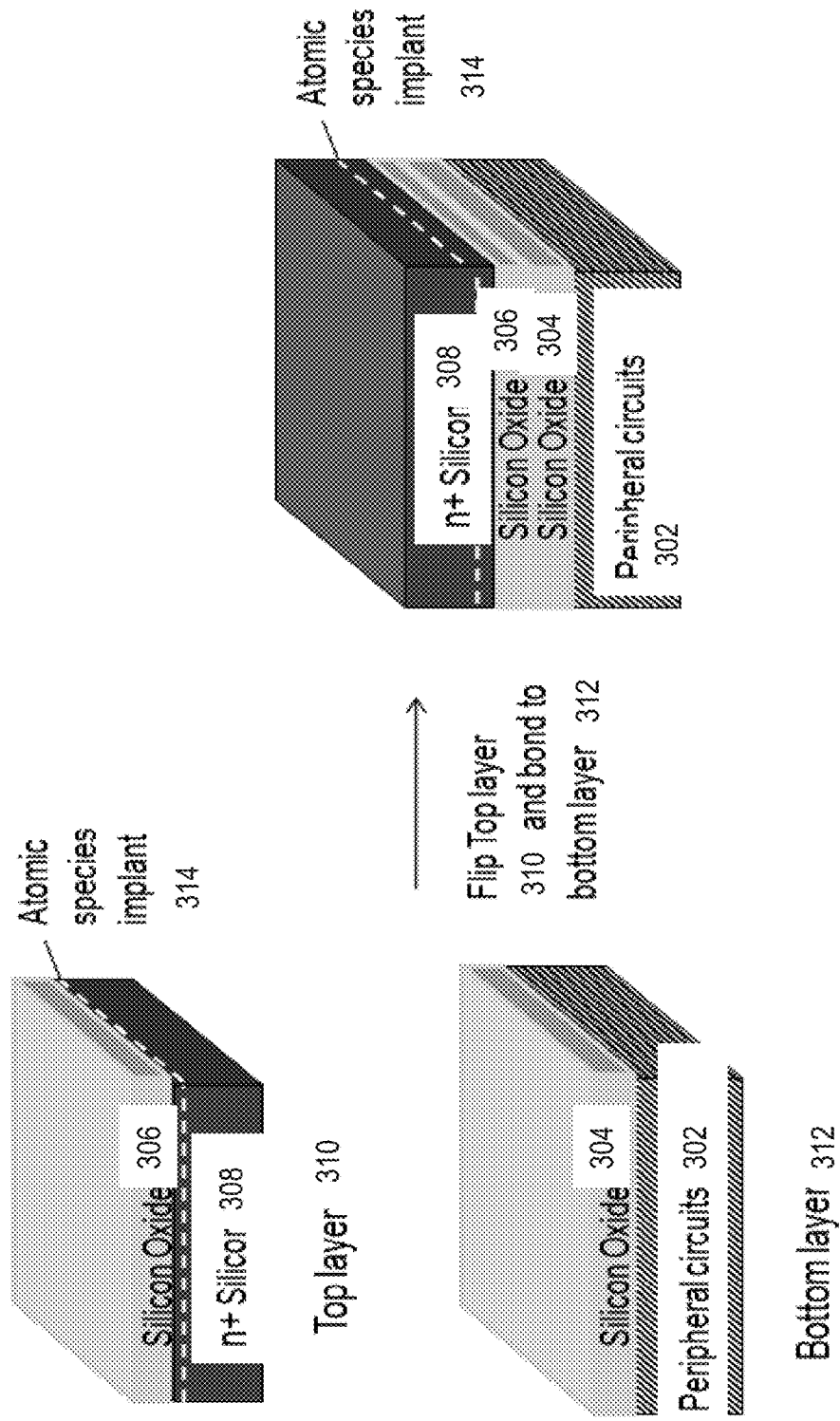

Step (B): FIG. 3B illustrates the structure after Step (B). N+ Silicon wafer 308 has an oxide layer 306 grown or deposited above it. Following this, hydrogen is implanted into the n+ Silicon wafer at a certain depth indicated by 314. Alternatively, some other atomic species such as Helium could be (co-)implanted. This hydrogen implanted n+ Silicon wafer 308 forms the top layer 310. The bottom layer 312 may include the peripheral circuits 302 with oxide layer 304. The top layer 310 is flipped and bonded to the bottom layer 312 using oxide-to-oxide bonding.

Figure 3C:
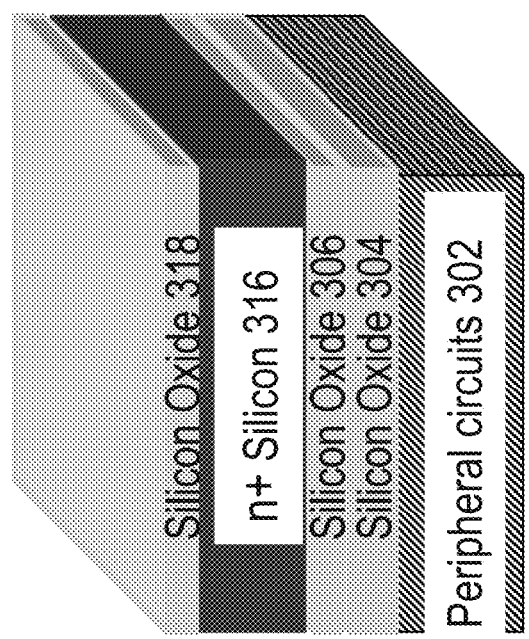

Step (C): FIG. 3C illustrates the structure after Step (C). The stack of top and bottom wafers after Step (B) is cleaved at the hydrogen plane 314 using either a anneal or a sideways mechanical force or other means. A CMP process is then conducted. A layer of silicon oxide 318 is then deposited atop the n+ Silicon layer 316. At the end of this step, a single-crystal n+ Si layer 316 exists atop the peripheral circuits, and this has been achieved using layer-transfer techniques.

Figure 3D:
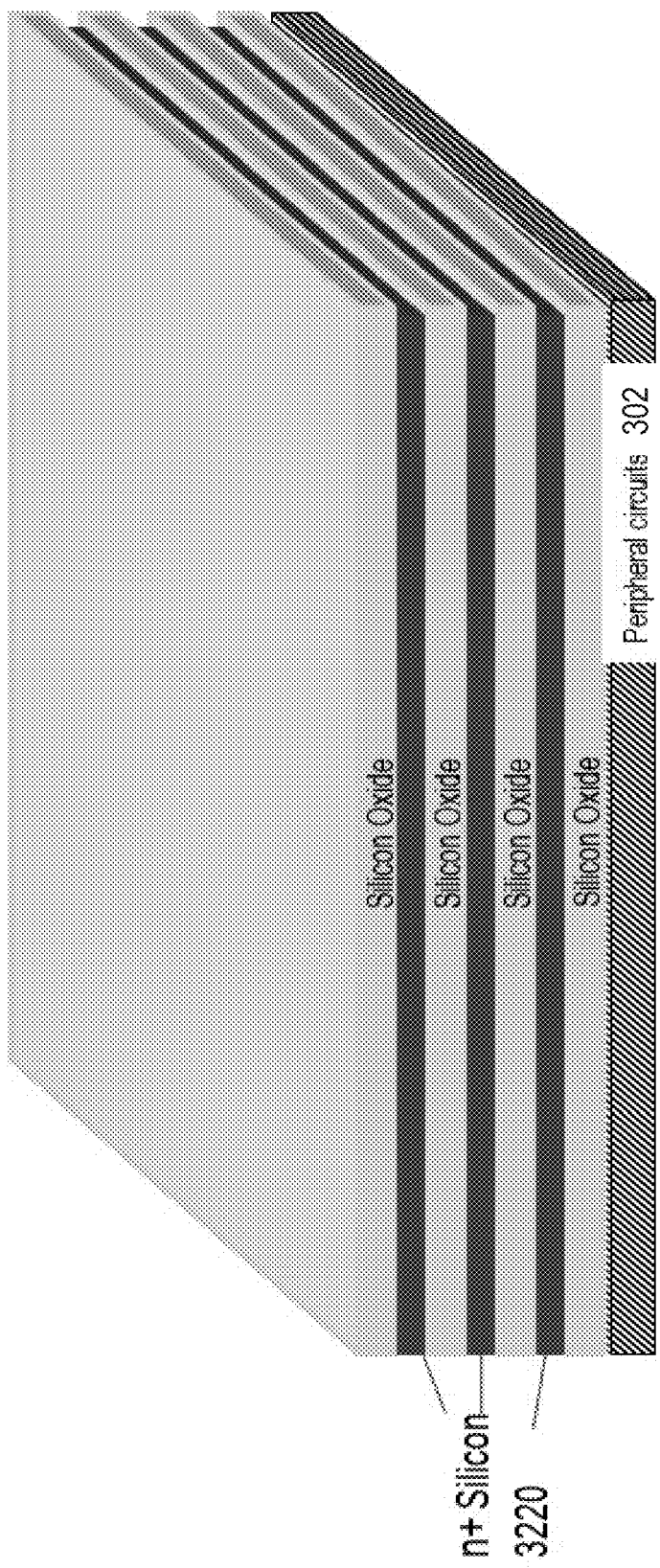

Step (D): FIG. 3D illustrates the structure after Step (D). Using methods similar to Step (B) and (C), multiple n+ silicon layers 320 are formed with silicon oxide layers in between.

Figure 3E:
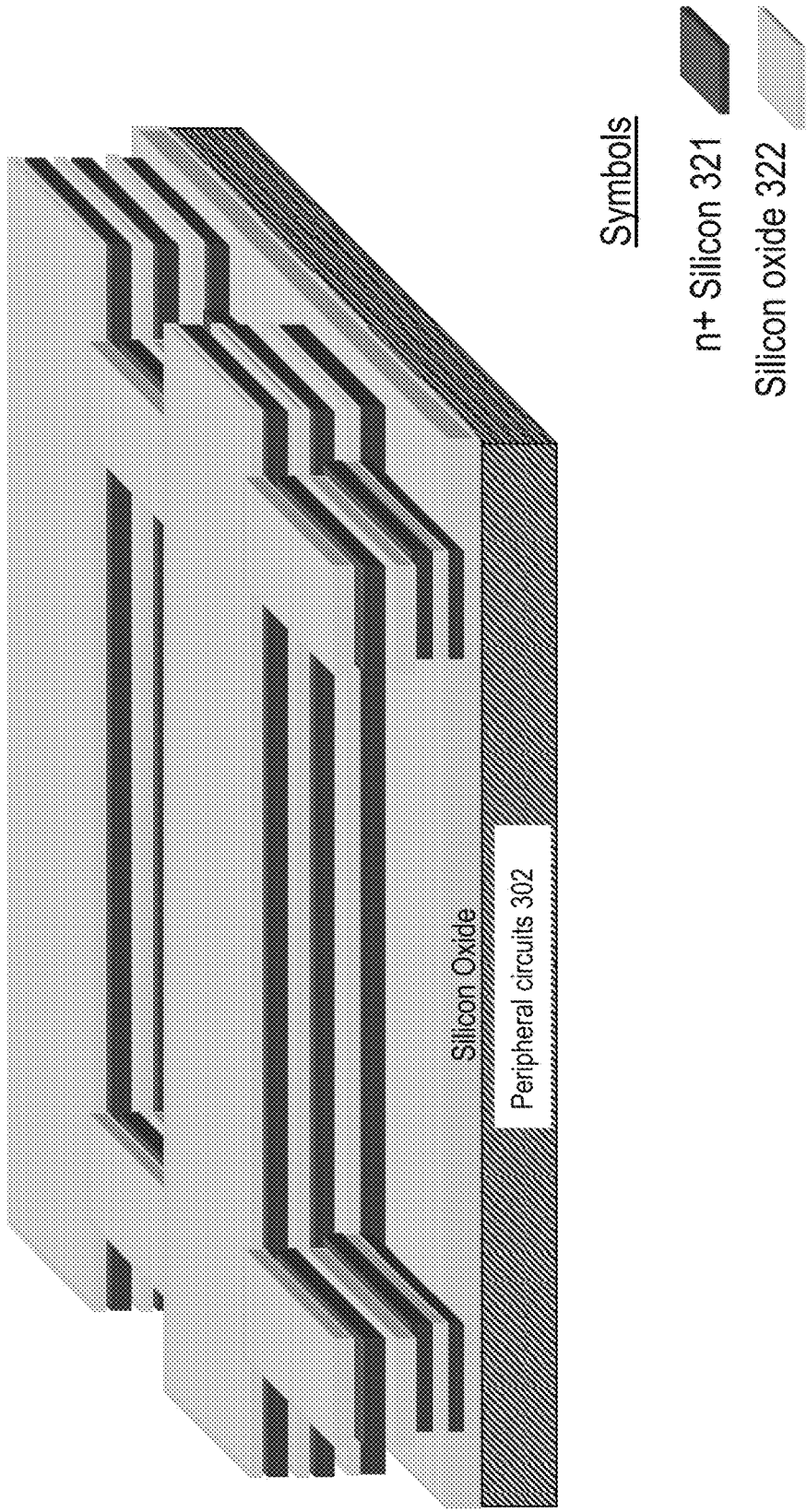

Step (E): FIG. 3E illustrates the structure after Step (E). Lithography and etch processes are then utilized to make a structure as shown in the figure.

Figure 3F:
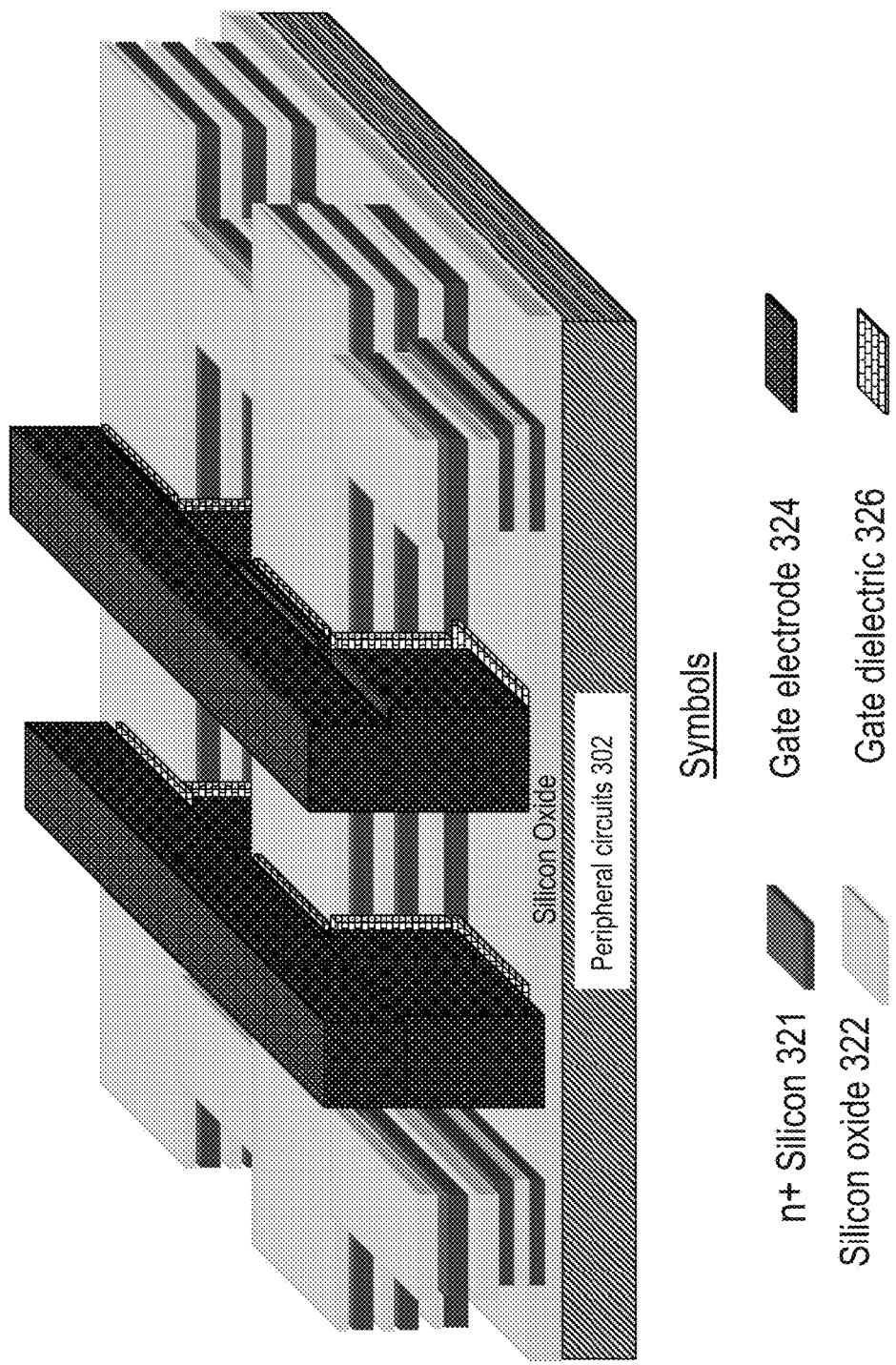

Step (F): FIG. 3F illustrates the structure after Step (F). Gate dielectric 326 and gate electrode 324 are then deposited following which a CMP is performed to planarize the gate electrode 324 regions. Lithography and etch are utilized to define gate regions.

Figure 3G:
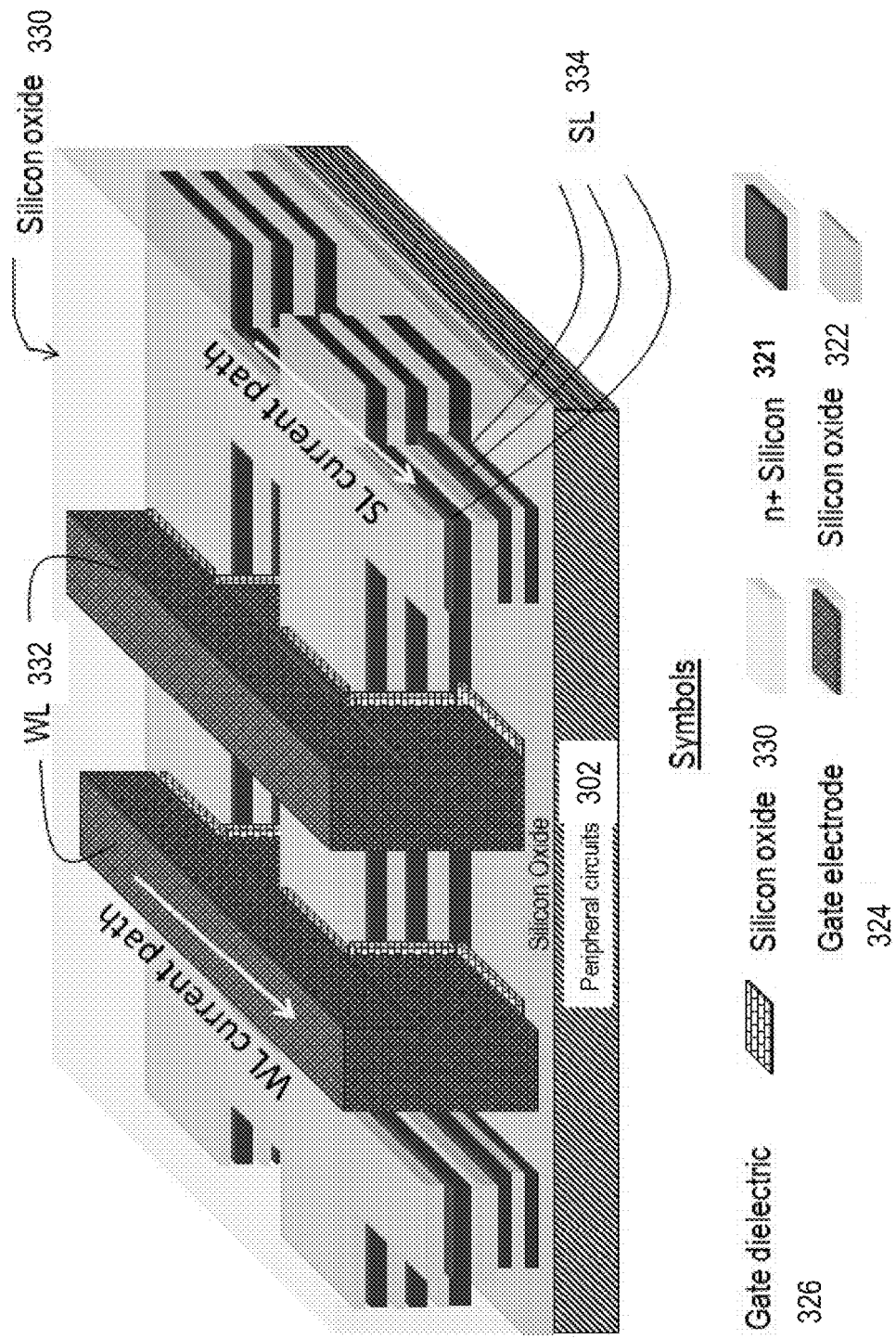

Step (G): FIG. 3G illustrates the structure after Step (G). A silicon oxide layer 330 is then deposited and planarized The silicon oxide layer is shown transparent in the figure for clarity, along with word-line (WL) 332 and source-line (SL) 334 regions.

Figure 3H:
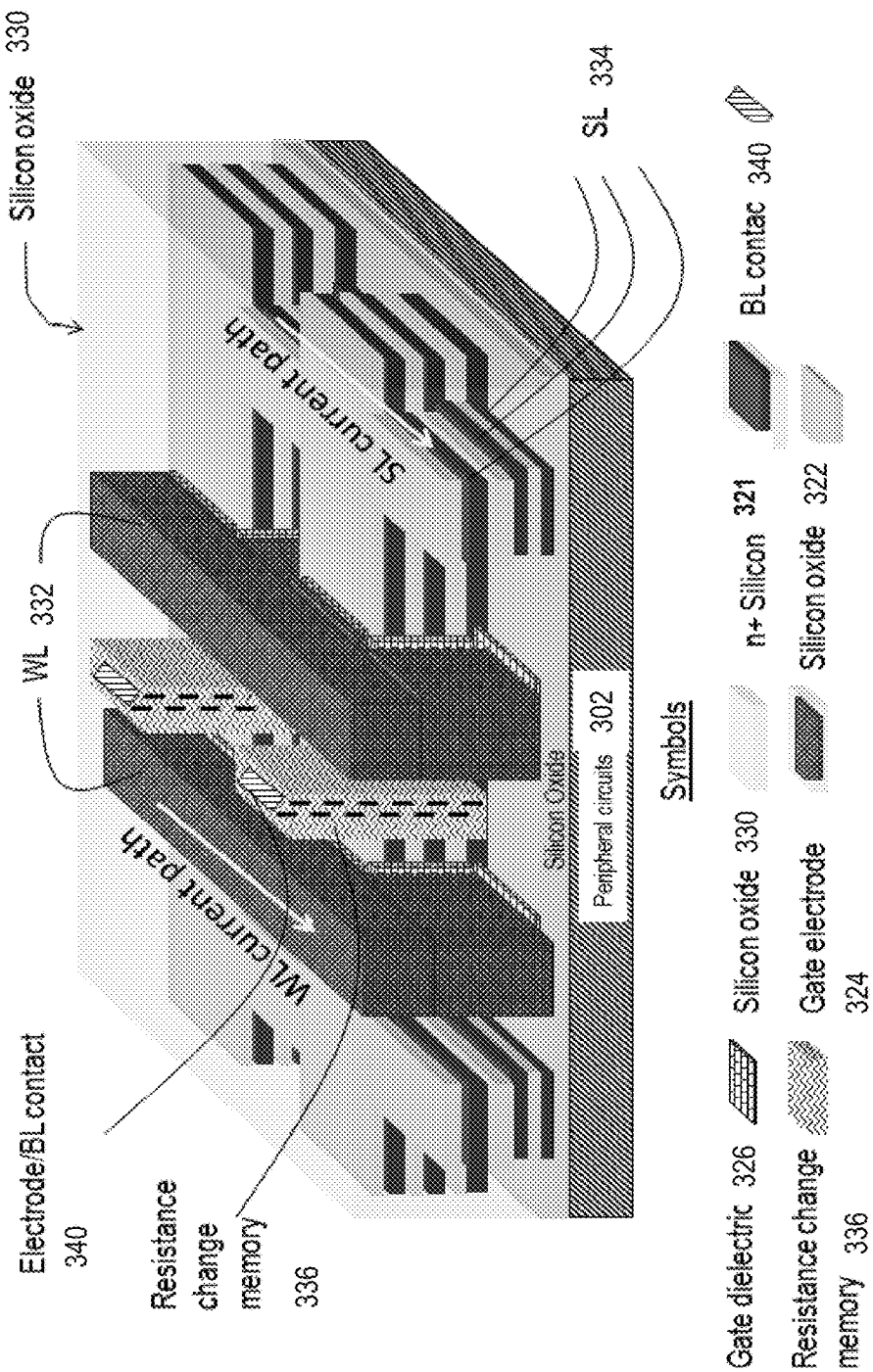
Figure 31:
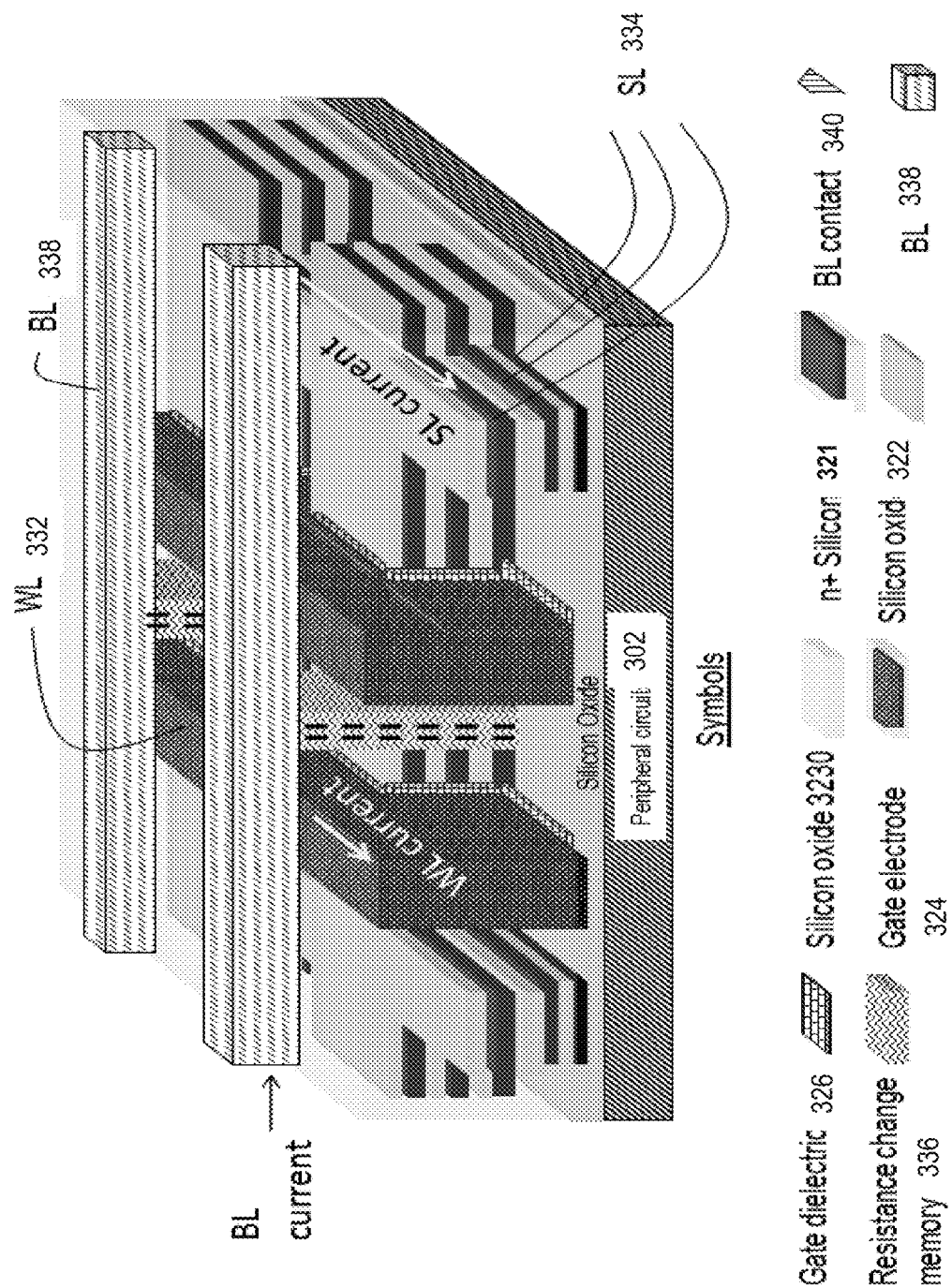

Step (H): FIG. 3H illustrates the structure after Step (H). Vias are etched through multiple layers of silicon and silicon dioxide as shown in the figure. A resistance change memory material 336 is then deposited (preferably with atomic layer deposition (ALD)). Examples of such a material include hafnium oxide, well known to change resistance by applying voltage. An electrode for the resistance change memory element is then deposited (preferably using ALD) and is shown as electrode/BL contact 340. A CMP process is then conducted to planarize the surface. It can be observed that multiple resistance change memory elements in series with junction-less transistors are created after this step.

Step (I): FIG. 3I illustrates the structure after Step (I). BLs 338 are then constructed. Contacts are made to BLs, WLs and SLs of the memory array at its edges. SL contacts can be made into stair-like structures using techniques described in in "Bit Cost Scalable Technology with Punch and Plug Process for Ultra High Density Flash Memory," VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well.

Figure 3J:
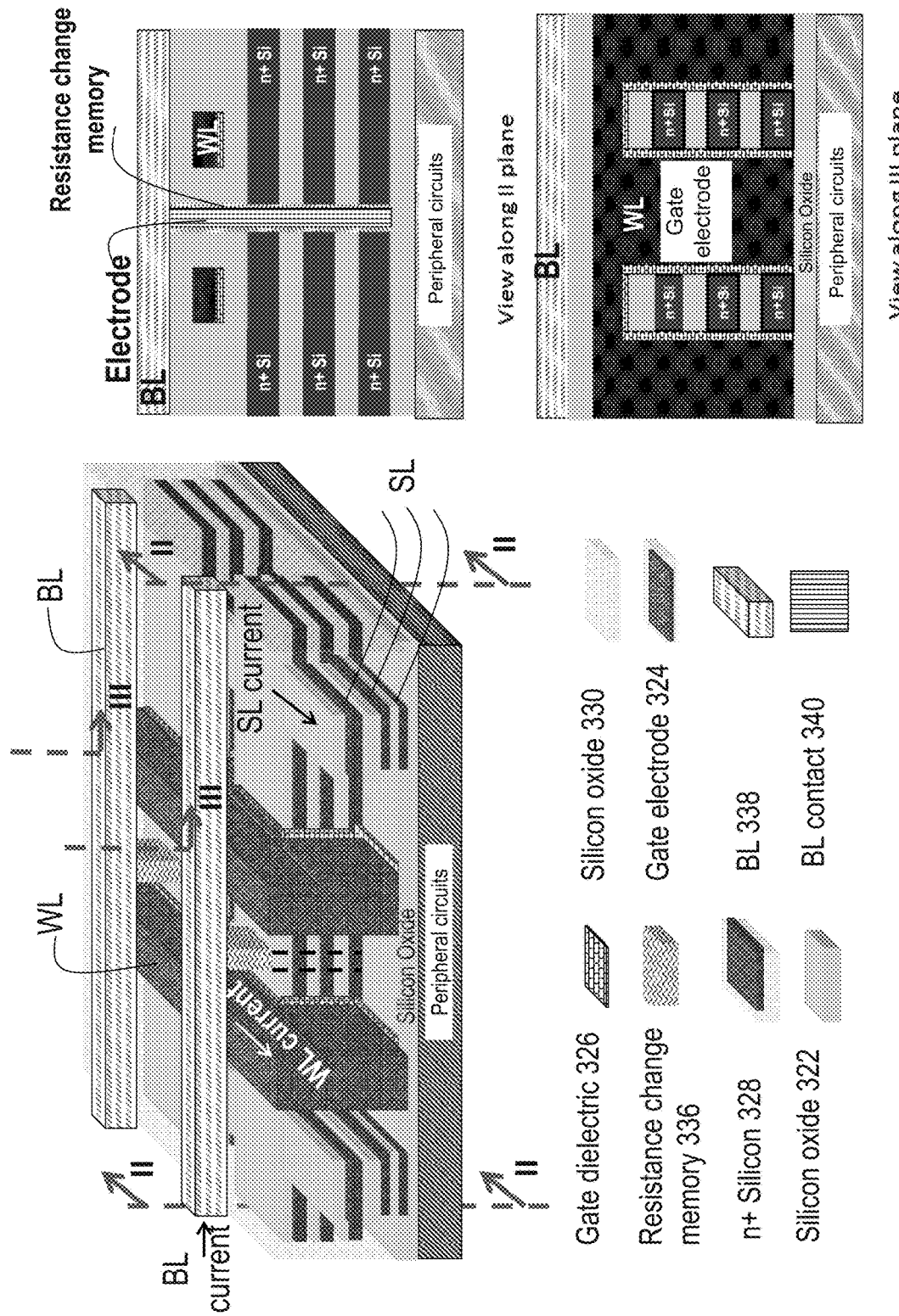

FIG. 3J shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

FIG. 4A-K describe an alternative process flow to construct a horizontally-oriented monolithic 3D resistive memory array. This embodiment has a resistance-based memory element in series with a transistor selector. No mask is utilized on a "per-memory-layer" basis for the monolithic 3D resistance change memory (or resistive memory) concept shown in FIG. 4A-K, and all other masks are shared between different layers. The process flow may include several steps as described in the following sequence.

Figure 4A:
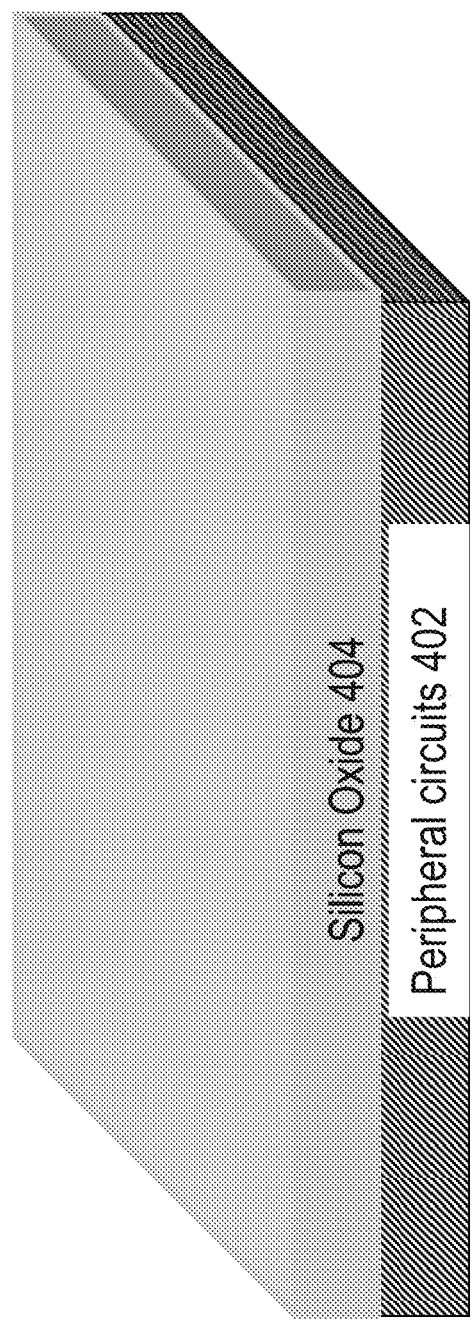

Step (A): Peripheral circuits with tungsten wiring 402 are first constructed and above this oxide layer 404 is deposited. FIG. 4A shows a drawing illustration after Step (A).

Figure 4B:
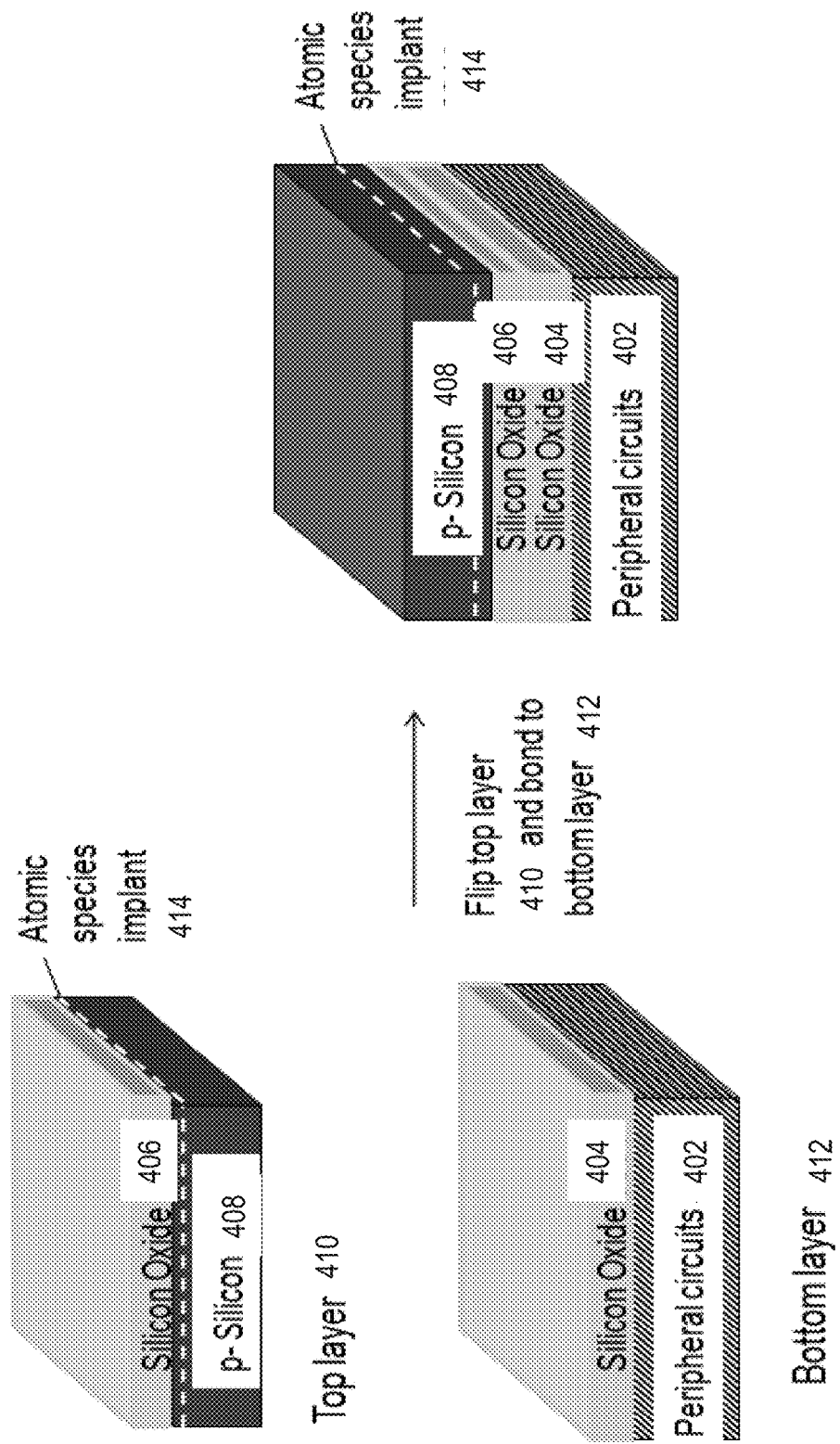

Step (B): FIG. 4B illustrates the structure after Step (B). A p− Silicon wafer 408 has an oxide layer 406 grown or deposited above it. Following this, hydrogen is implanted into the p− Silicon wafer at a certain depth indicated by 414. Alternatively, some other atomic species such as Helium could be (co-)implanted. This hydrogen implanted p− Silicon wafer 408 forms the top layer 410. The bottom layer 412 may include the peripheral circuits 402 with oxide layer 404. The top layer 410 is flipped and bonded to the bottom layer 412 using oxide-to-oxide bonding.

Figure 4C:
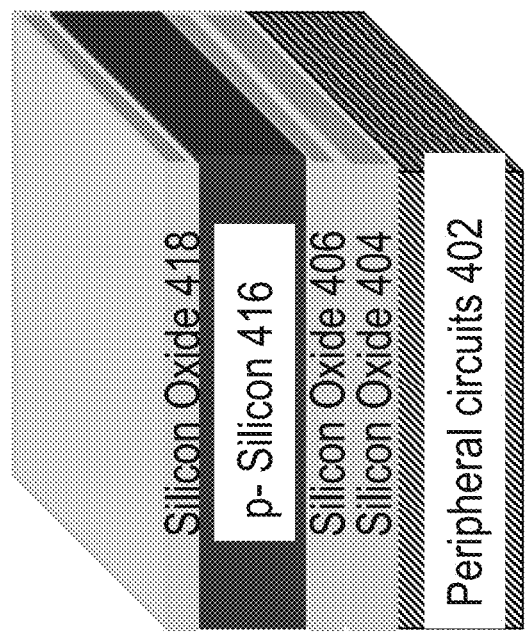

Step (C): FIG. 4C illustrates the structure after Step (C). The stack of top and bottom wafers after Step (B) is cleaved at the hydrogen plane 414 using either a anneal or a sideways mechanical force or other means. A CMP process is then conducted. A layer of silicon oxide 418 is then deposited atop the p− Silicon layer 416. At the end of this step, a single-crystal p− Silicon layer 416 exists atop the peripheral circuits, and this has been achieved using layer-transfer techniques.

Figure 4D:
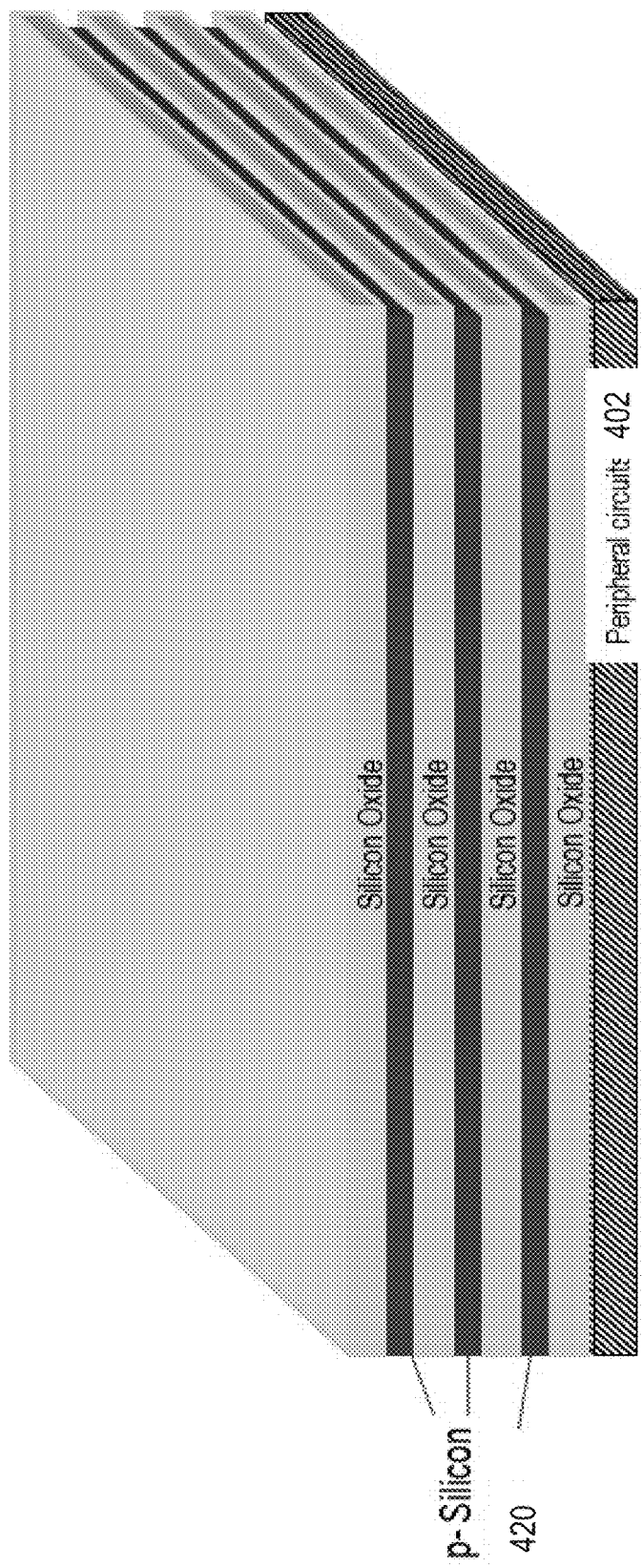

Step (D): FIG. 4D illustrates the structure after Step (D). Using methods similar to Step (B) and (C), multiple p− silicon layers 420 are formed with silicon oxide layers in between.

Figure 4E:
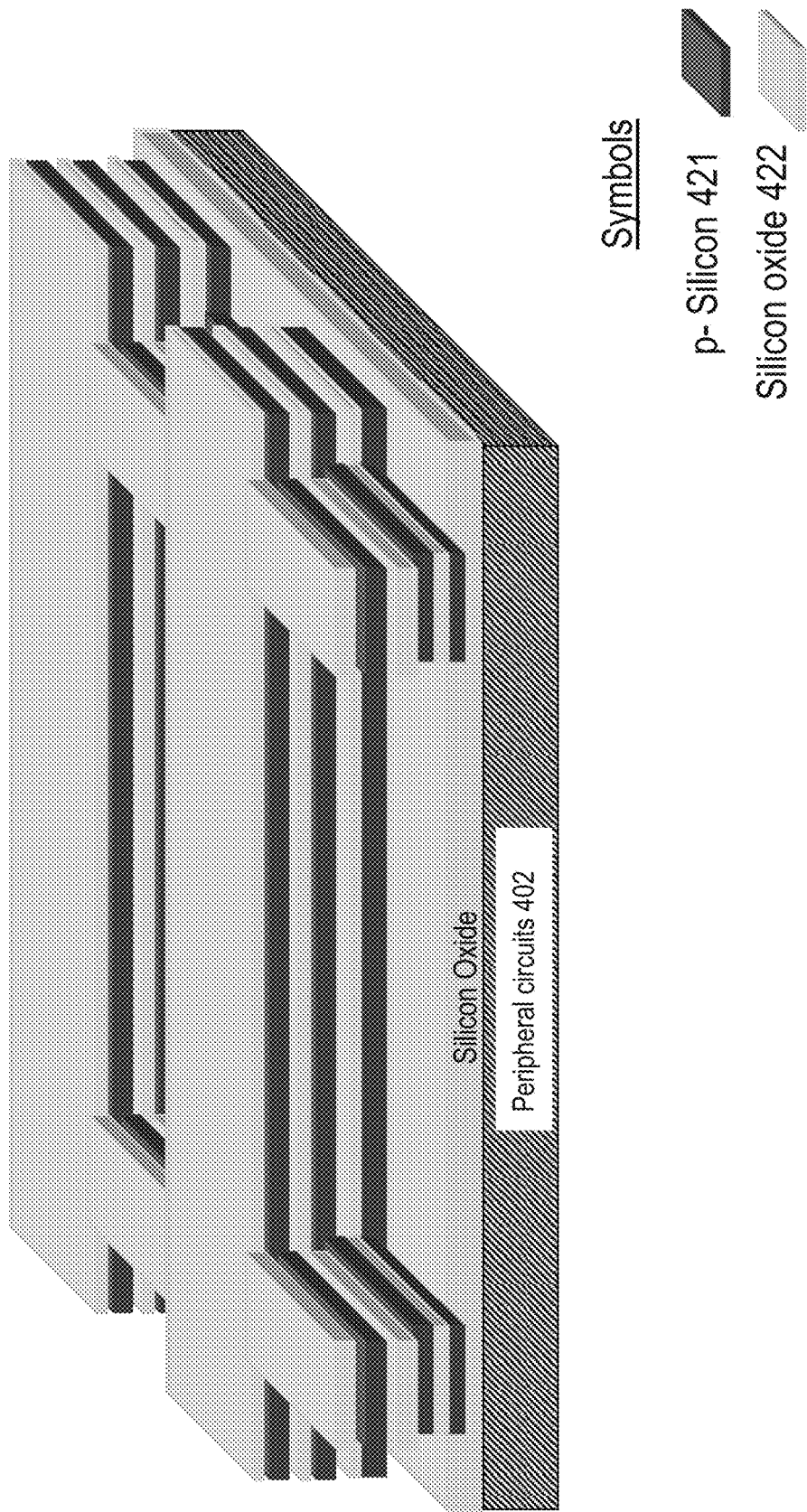

Step (E): FIG. 4E illustrates the structure after Step (E). Lithography and etch processes are then utilized to make a structure as shown in the figure.

Figure 4F:
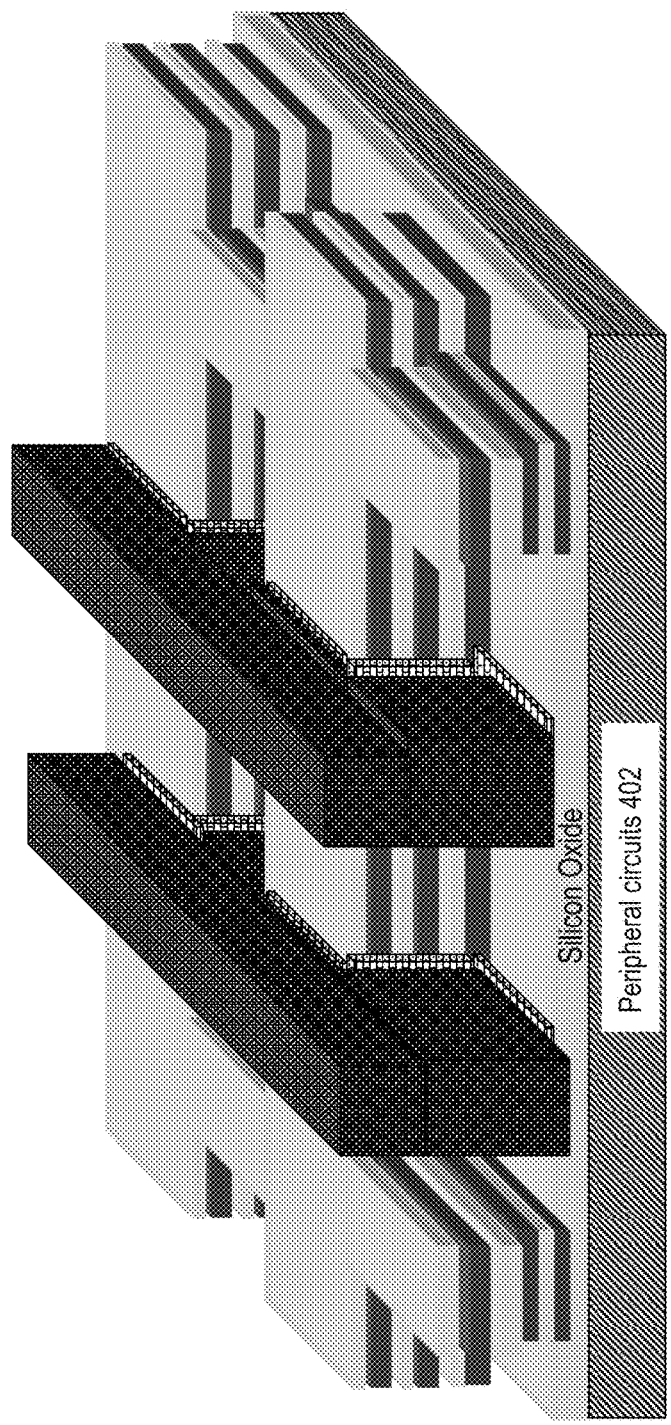

Step (F): FIG. 4F illustrates the structure on after Step (F). Gate dielectric 426 and gate electrode 424 are then deposited following which a CMP is done to planarize the gate electrode 424 regions. Lithography and etch are utilized to define gate regions.

Figure 4G:
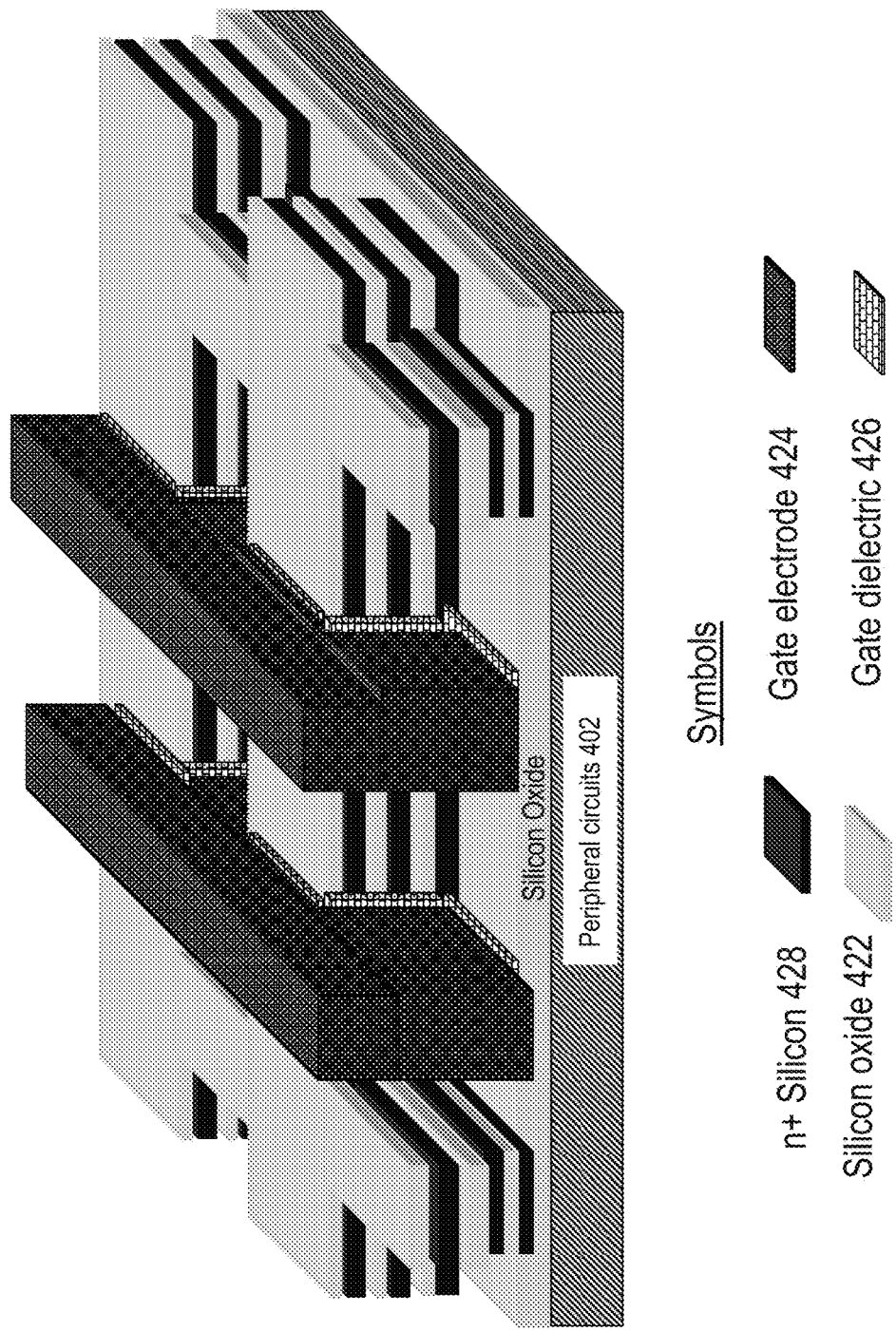

Step (G): FIG. 4G illustrates the structure after Step (G). Using the hard mask defined in Step (F), p− regions not covered by the gate are implanted to form n+ regions. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 4H:
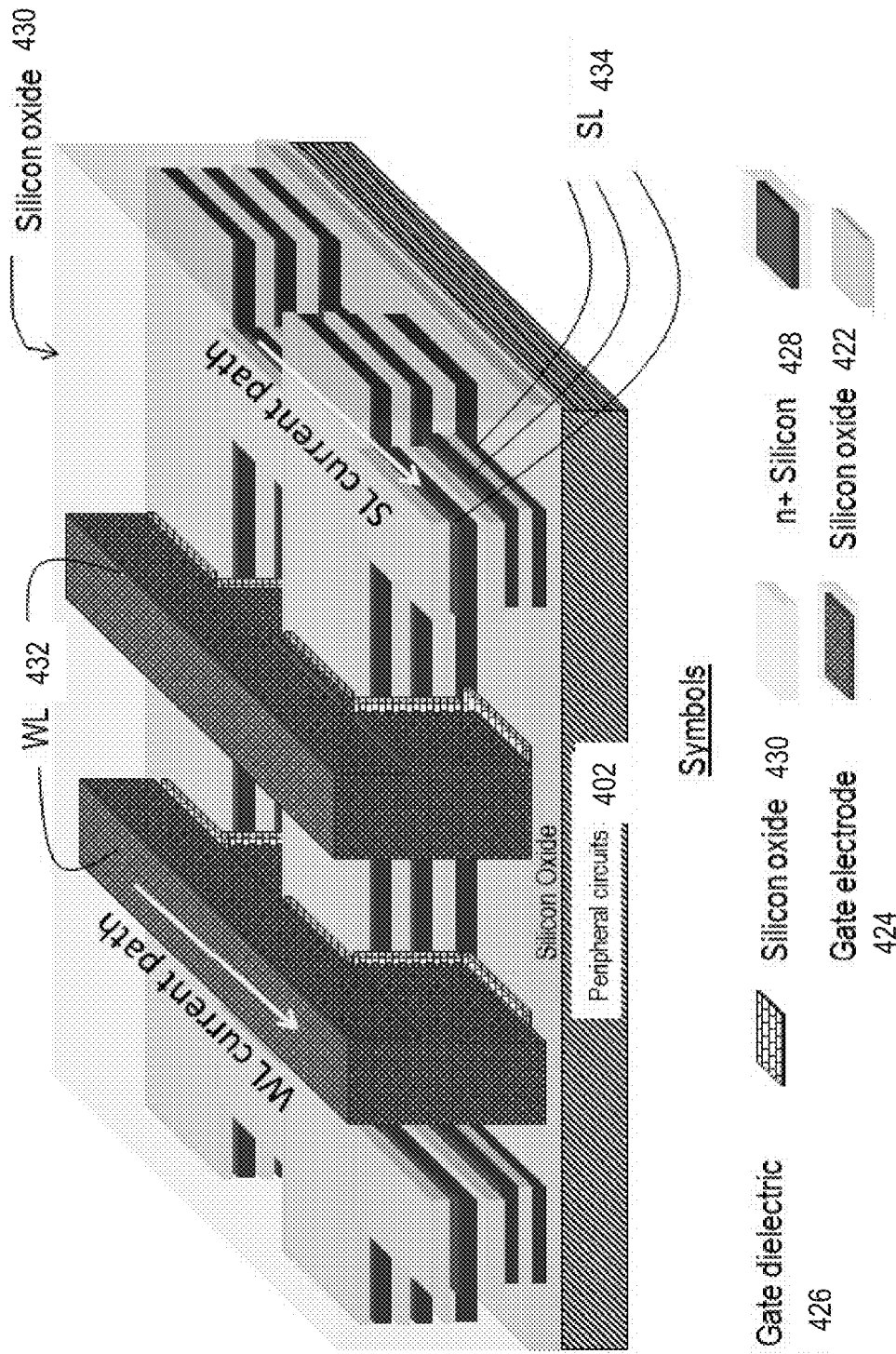
Figure 41:
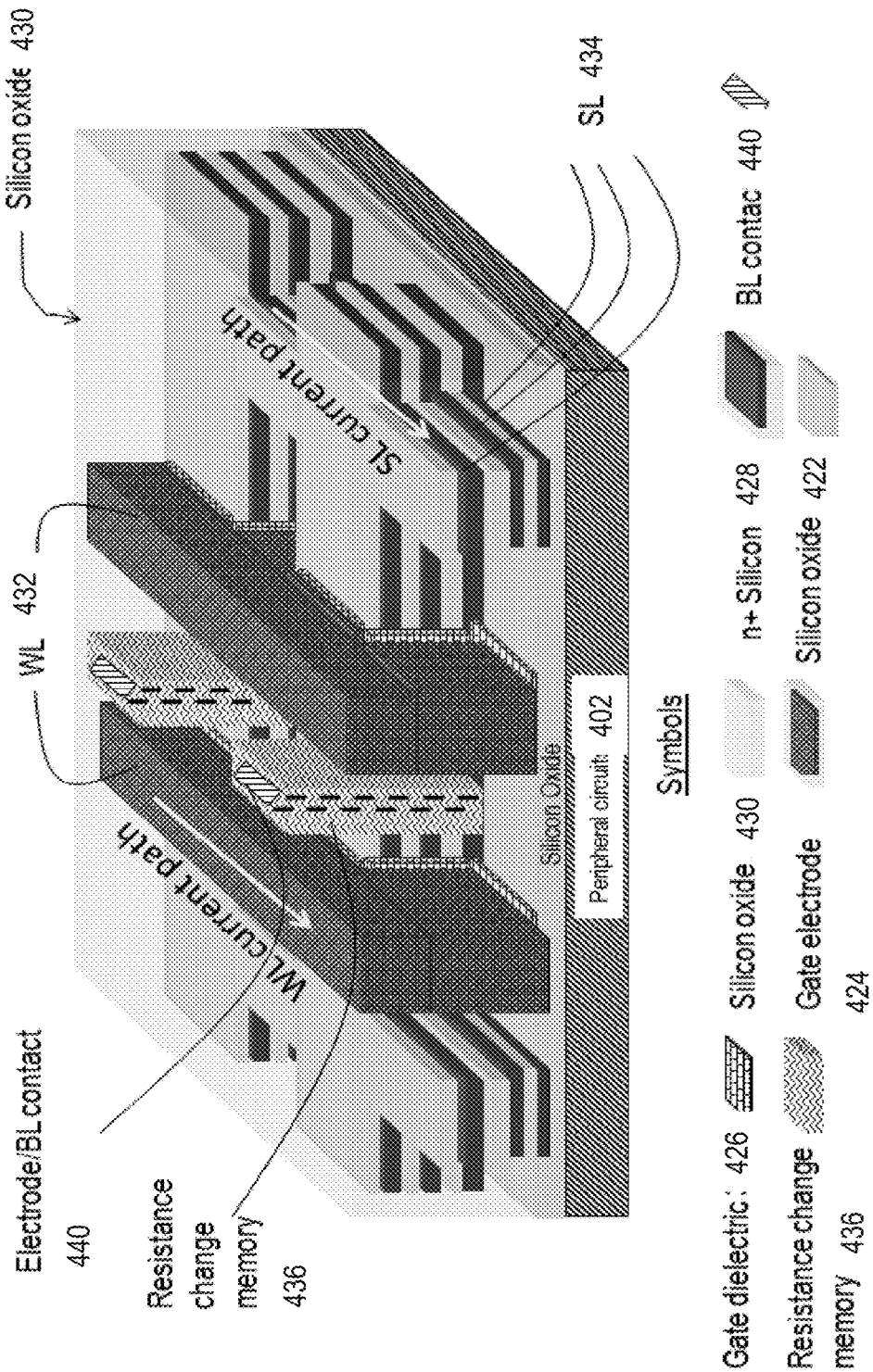

Step (H): FIG. 4H illustrates the structure after Step (H). A silicon oxide layer 430 is then deposited and planarized The silicon oxide layer is shown transparent in the figure for clarity, along with word-line (WL) 432 and source-line (SL) 434 regions.

Step (I): FIG. 4I illustrates the structure after Step (I). Vias are etched through multiple layers of silicon and silicon dioxide as shown in the figure. A resistance change memory material 436 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 440. A CMP process is then conducted to planarize the surface. It can be observed that multiple resistance change memory elements in series with transistors are created after this step.

Figure 4J:
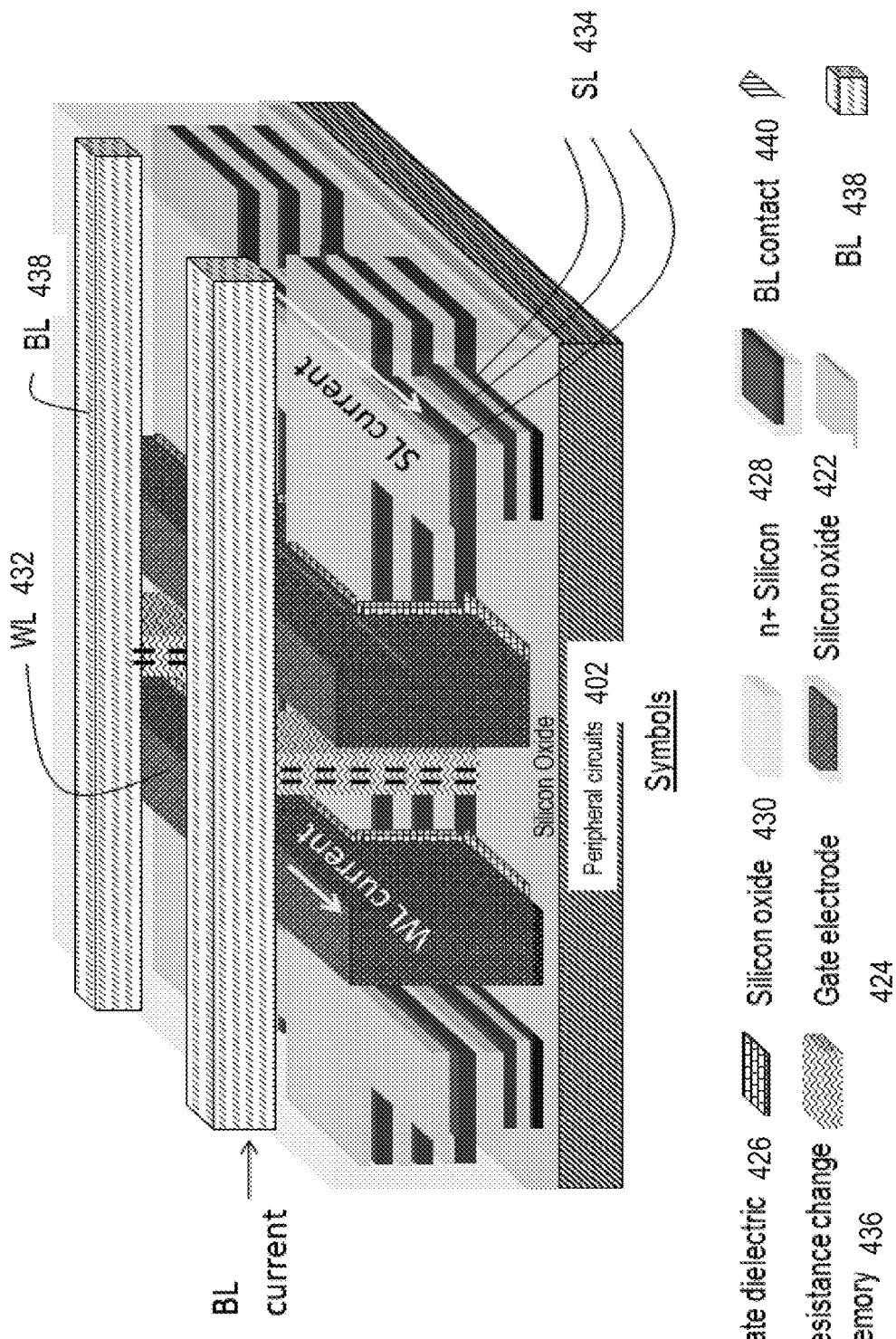

Step (J): FIG. 4J illustrates the structure after Step (J). BLs 438 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (I) as well.

Figure 4K:
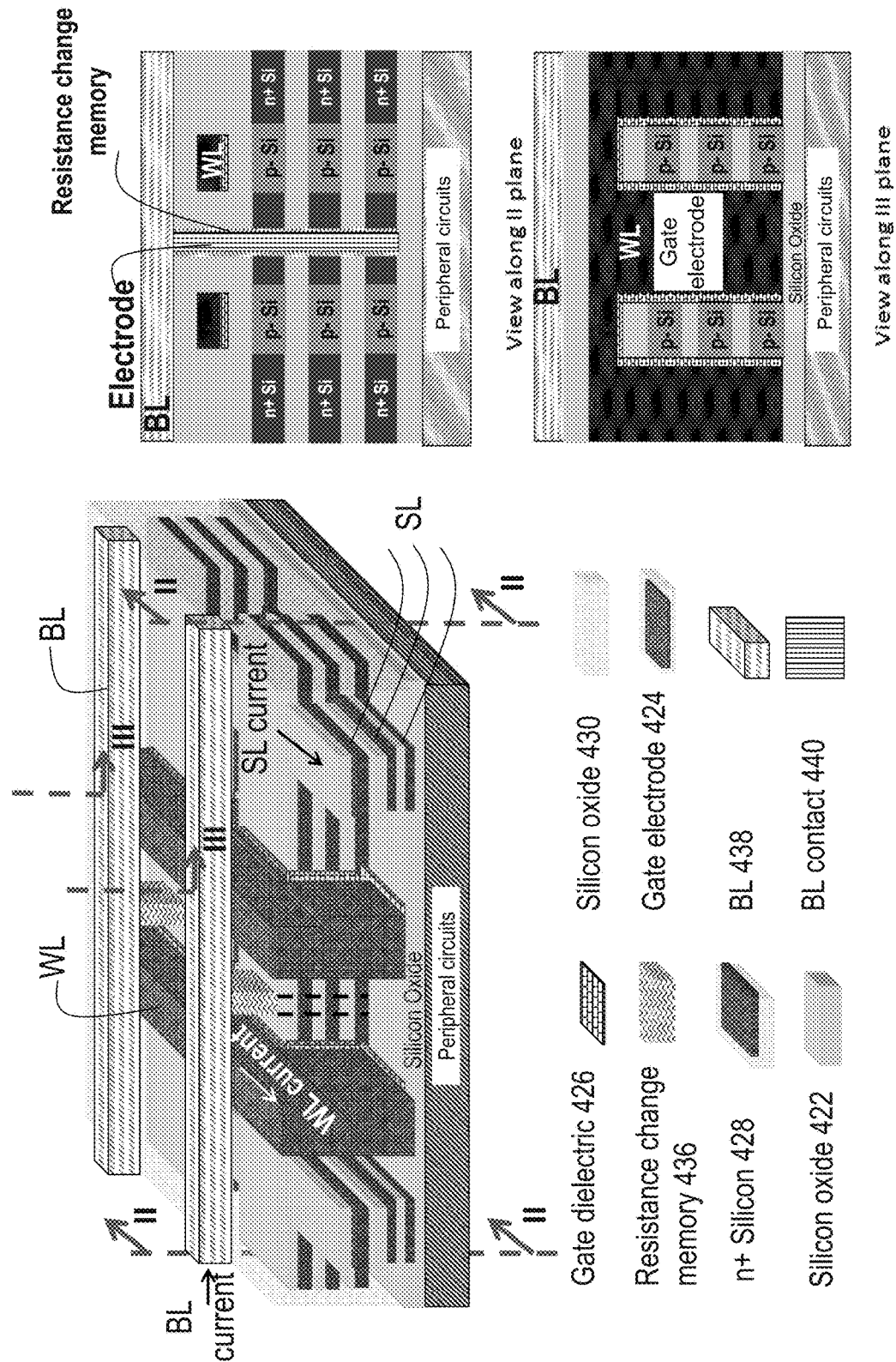

FIG. 4K shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "Integrated Interconnect Technologies for 3D Nanoelectronic Systems", Artech House, 2009 by Bakir and Meindl ("Balch") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 5A-G are relevant for any type of charge-trap memory.

FIG. 5A-G describes a memory architecture for single-crystal 3D charge-trap memories, and a procedure for its construction. It utilizes junction-less transistors. No mask is utilized on a "per-memory-layer" basis for the monolithic 3D charge-trap memory concept shown in FIG. 5A-G, and all other masks are shared between different layers. The process flow may include several steps as described in the following sequence.

Figure 5A:
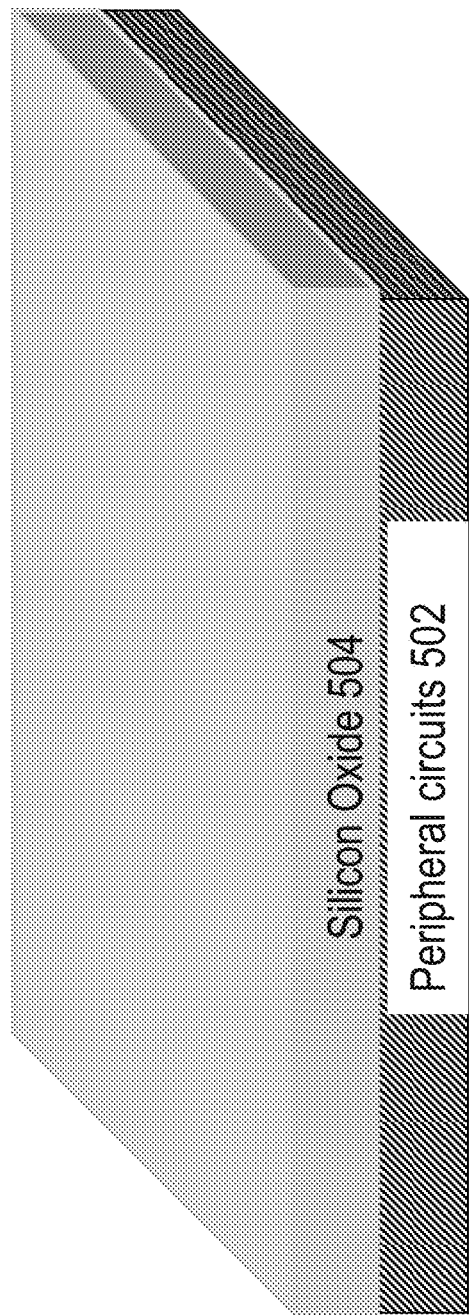
FIGS. 5A-5G are exemplary drawing illustrations of a zero-mask per layer 3D charge-trap memory.

Step (A): Peripheral circuits 502 are first constructed and above this oxide layer 504 is deposited. FIG. 5A shows a drawing illustration after Step (A).

Figure 5B:
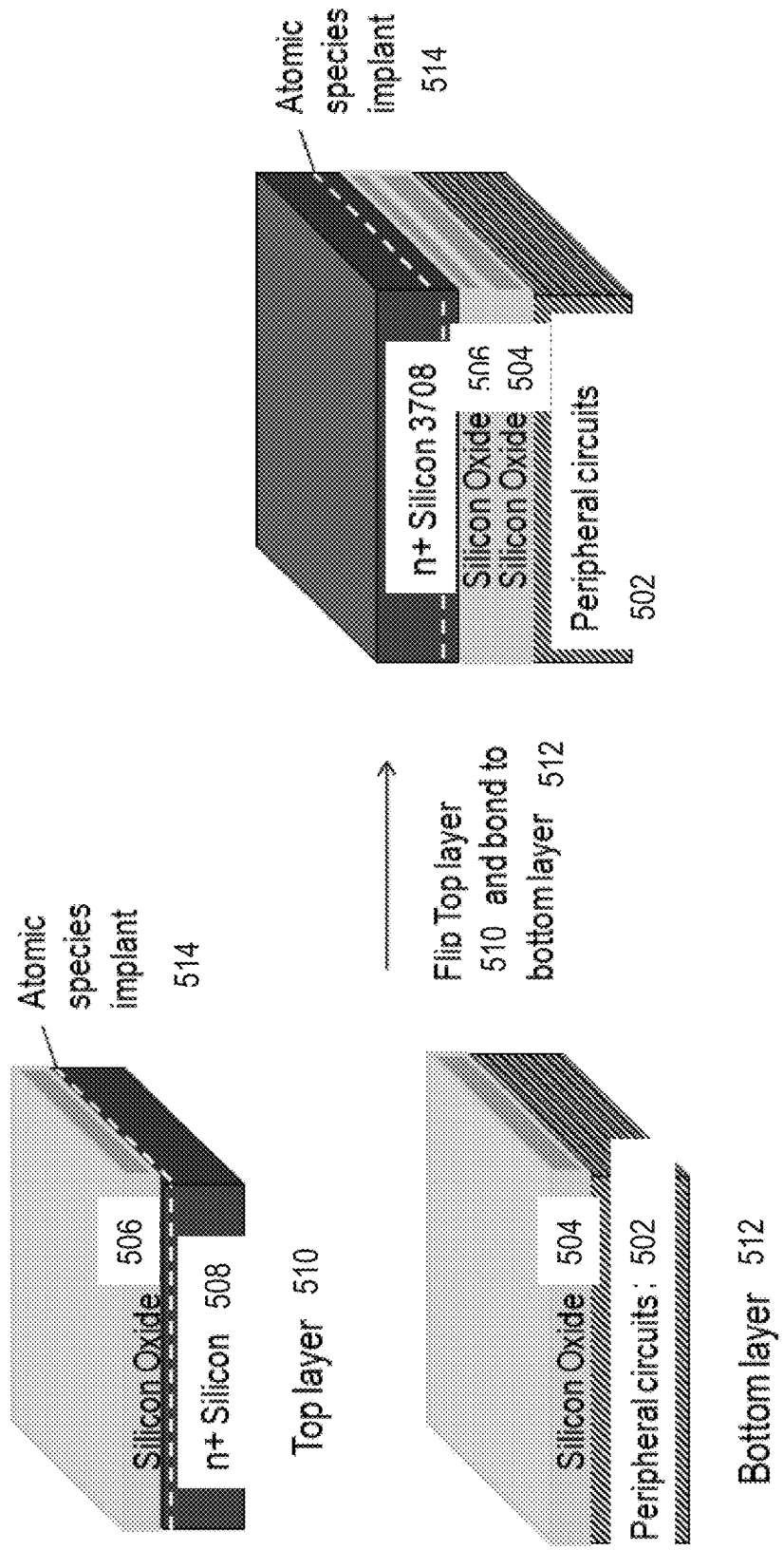

Step (B): FIG. 5B illustrates the structure after Step (B). A wafer of n+ Silicon 508 has an oxide layer 506 grown or deposited above it. Following this, hydrogen is implanted into the n+ Silicon wafer at a certain depth indicated by 514. Alternatively, some other atomic species such as Helium could be implanted. This hydrogen implanted n+ Silicon wafer 508 forms the top layer 510. The bottom layer 512 may include the peripheral circuits 502 with oxide layer 504. The top layer 510 is flipped and bonded to the bottom layer 512 using oxide-to-oxide bonding. Alternatively, n+ silicon wafer 508 may be doped differently, such as, for example, with elemental species that form a p+, or p−, or n− silicon wafer, or substantially absent of semiconductor dopants to form an undoped silicon wafer.

Figure 5C:
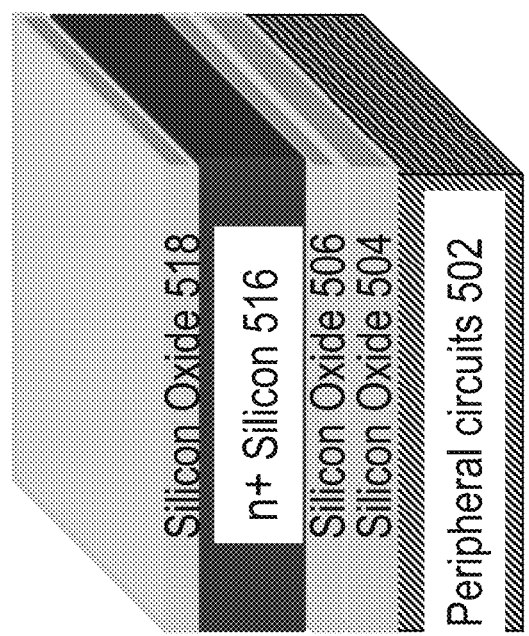

Step (C): FIG. 5C illustrates the structure after Step (C). The stack of top and bottom wafers after Step (B) is cleaved at the hydrogen plane 514 using either a anneal or a sideways mechanical force or other means. A CMP process is then conducted. A layer of silicon oxide 518 is then deposited atop the n+ Silicon layer 516. At the end of this step, a single-crystal n+ Si layer 516 exists atop the peripheral circuits, and this has been achieved using layer-transfer techniques.

Figure 5D:
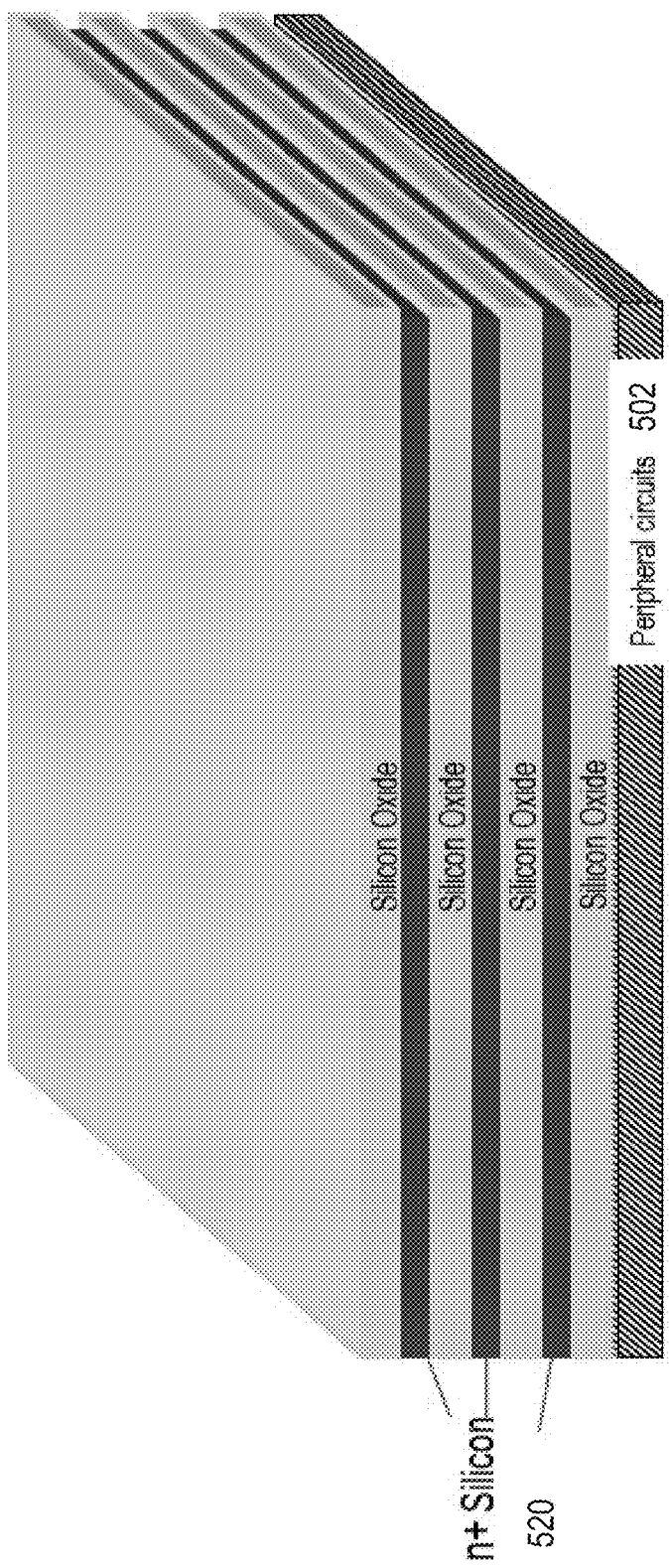

Step (D): FIG. 5D illustrates the structure after Step (D). Using methods similar to Step (B) and (C), multiple n+ silicon layers 520 are formed with silicon oxide layers in between.

Figure 5E:
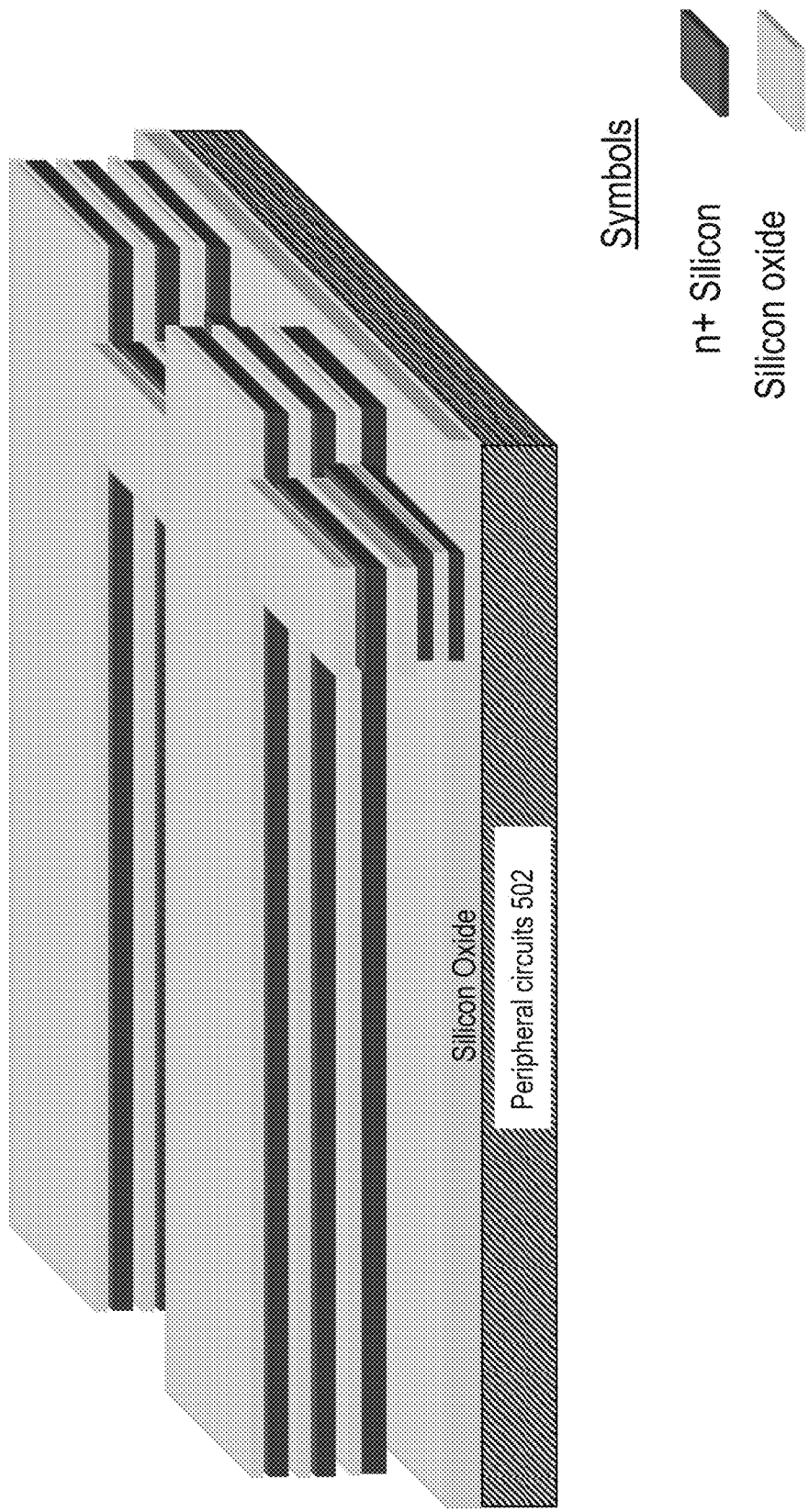

Step (E): FIG. 5E illustrates the structure after Step (E). Lithography and etch processes are then utilized to make a structure as shown in the figure.

Figure 5F:
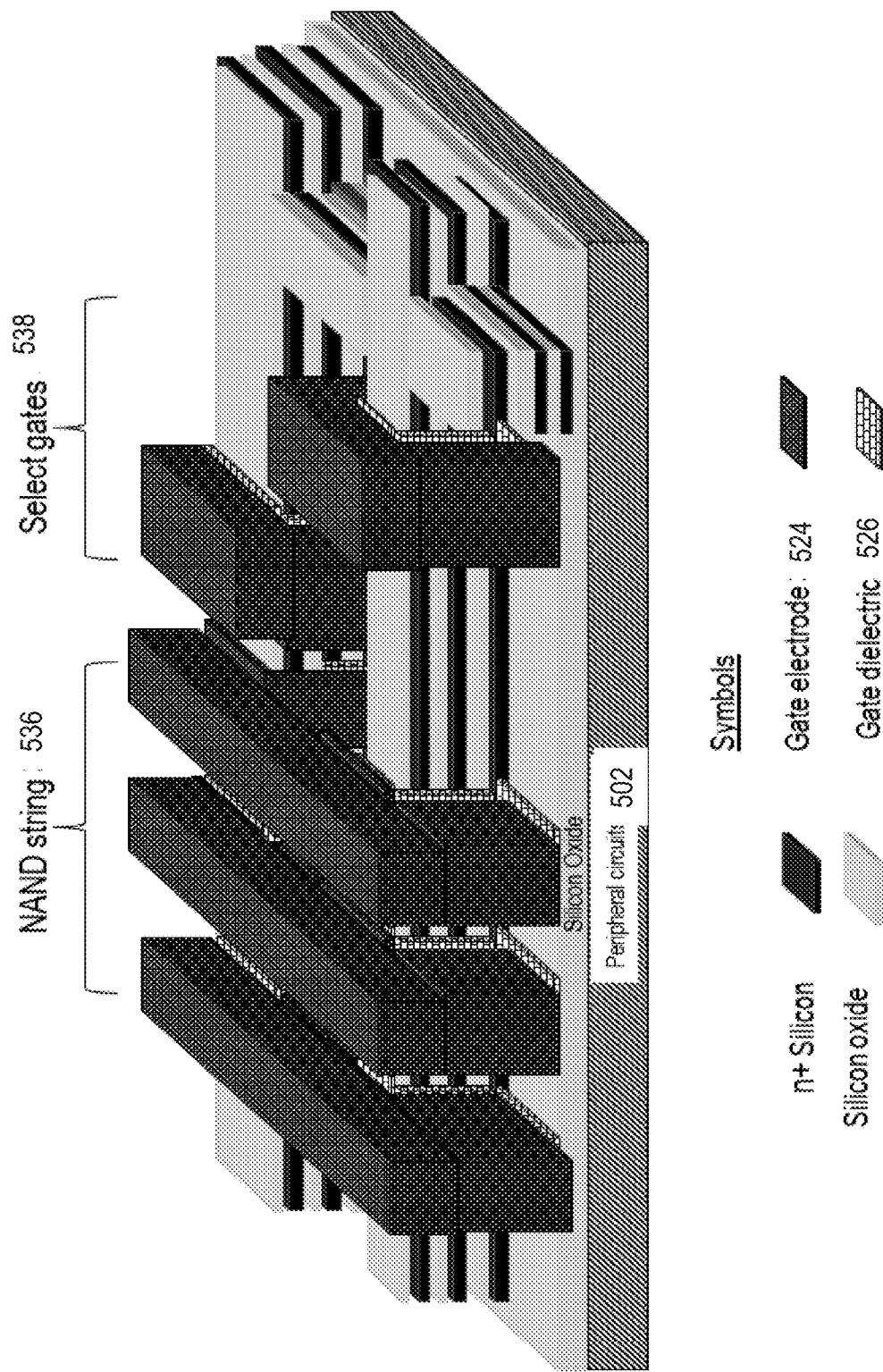

Step (F): FIG. 5F illustrates the structure after Step (F). Gate dielectric 526 and gate electrode 524 are then deposited following which a CMP is done to planarize the gate electrode 524 regions. Lithography and etch are utilized to define gate regions. Gates of the NAND string 536 as well gates of select gates of the NAND string 538 are defined.

Figure 5G:
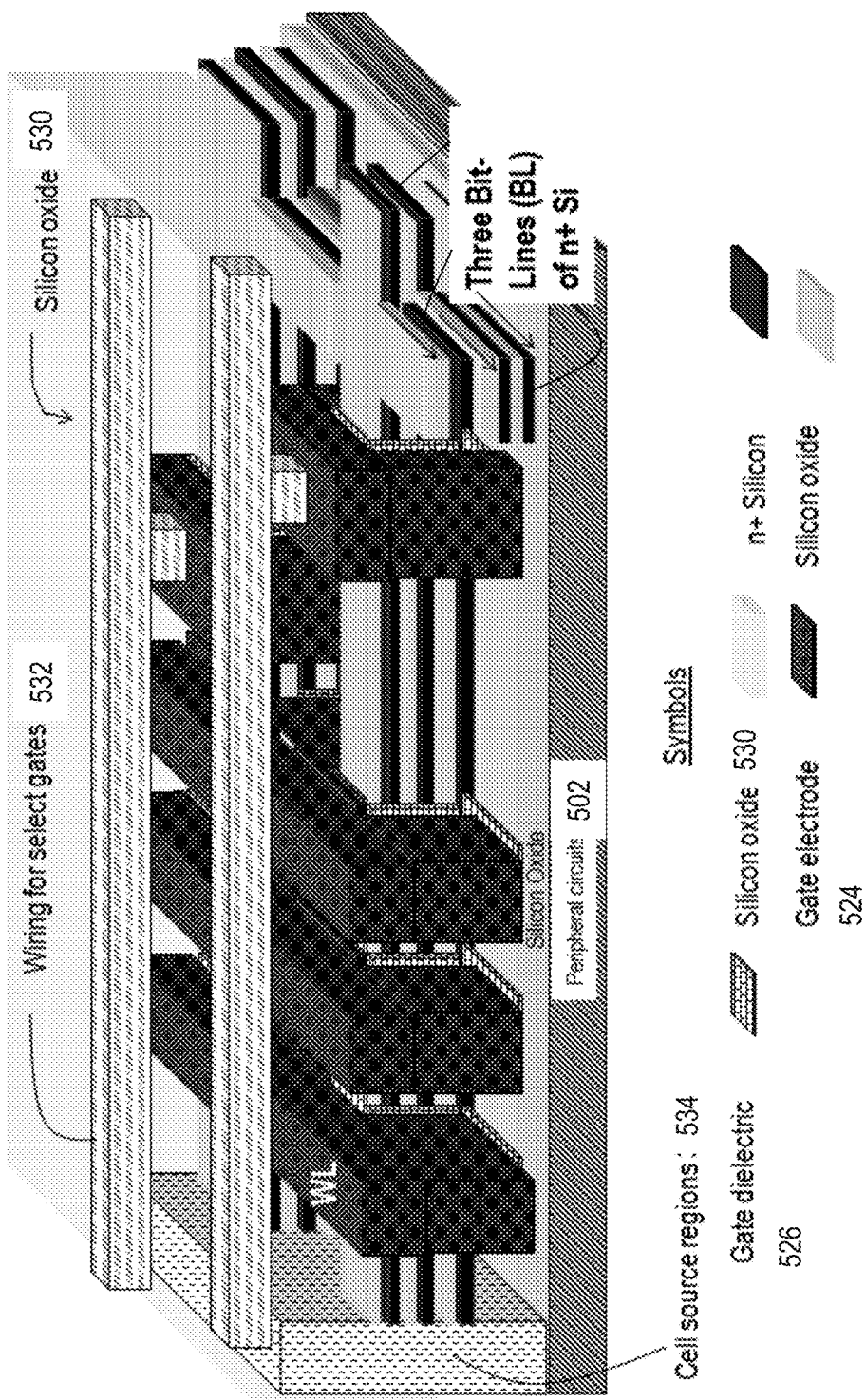

Step (G): FIG. 5G illustrates the structure after Step (G). A silicon oxide layer 530 is then deposited and planarized It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

Figure 6B:
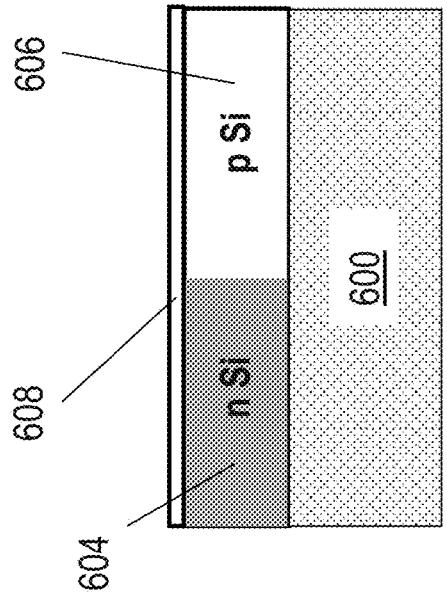
FIGS. 6A-6C are exemplary drawing illustrations of a technique to construct dopant segregated transistors compatible with 3D stacking.
Figure 6A:
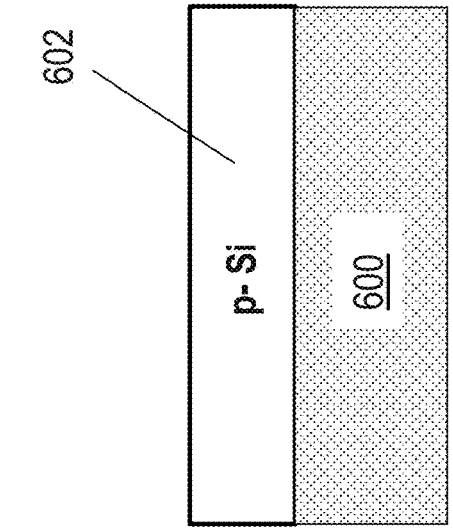
Figure 6C:
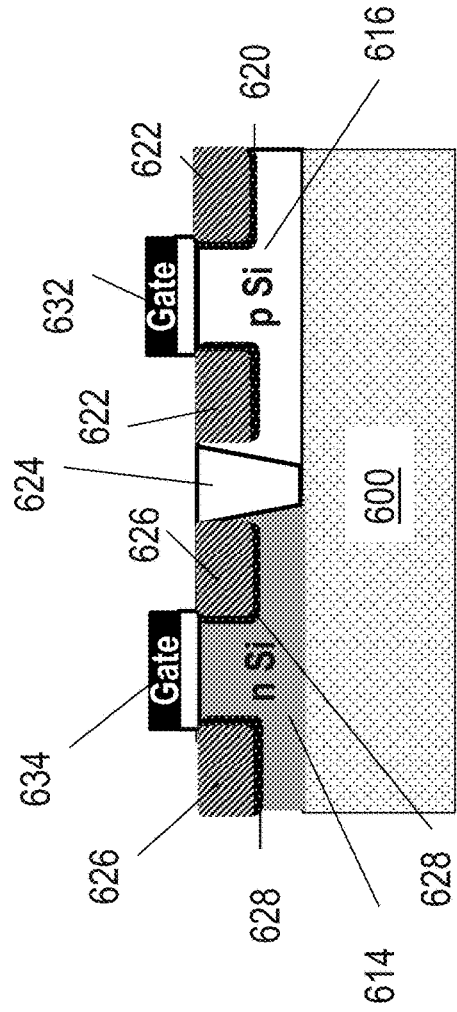

An alternate method to obtain low temperature 3D compatible CMOS transistors residing in the same device layer of silicon is illustrated in FIG. 6A-C. As illustrated in FIG. 6A, a layer of p− monocrystalline silicon 602 may be transferred onto a bottom layer of transistors and wires 600 utilizing previously described layer transfer techniques. As illustrated in FIG. 6C, n-type well regions 604 and p-type well regions 606 may be formed by conventional lithographic and ion implantation techniques. An oxide layer 608 may be grown or deposited prior to or after the lithographic and ion implantation steps. The dopants may be activated with a low wavelength optical anneal, such as a 550 nm laser anneal system manufactured by Applied Materials, that will not heat up the bottom layer of transistors and wires 600 beyond approximately 400° C., the temperature at which damage to the barrier metals containing the copper wiring of bottom layer of transistors and wires 600 may occur. At this step in the process flow, there is very little structure pattern in the top layer of silicon, which allows the effective use of the lower wavelength optical annealing systems, which are prone to pattern sensitivity issues thereby creating uneven heating. As illustrated in FIG. 6C, shallow trench regions 624 may be formed, and conventional CMOS transistor formation methods with dopant segregation techniques, including those previously described, may be utilized to construct CMOS transistors, including n-silicon regions 614, P+ silicon regions 628, silicide regions 626, PMOS gate stacks 634, p−silicon regions 616, N+ silicon regions 620, silicide regions 622, and NMOS gate stacks 632.

Persons of ordinary skill in the art will appreciate that the low temperature 3D compatible CMOS transistor formation method and techniques described in FIG. 6 may also utilize tungsten wiring for the bottom layer of transistors and wires 600 thereby increasing the temperature tolerance of the optical annealing utilized in FIG. 6B or 6C. Moreover, absorber layers, such as amorphous carbon, reflective layers, such as aluminum, or Brewster angle adjustments to the optical annealing may be utilized to optimize the implant activation and minimize the heating of lower device layers. Further, shallow trench regions 624 may be formed prior to the optical annealing or ion-implantation steps. Furthermore, channel implants may be performed prior to the optical annealing so that transistor characteristics may be more tightly controlled. Moreover, one or more of the transistor channels may be undoped by layer transferring an undoped layer of monocrystalline silicon in place of the layer of p− monocrystalline silicon 602. Further, the source and drain implants may be performed prior to the optical anneals. Moreover, the methods utilized in FIG. 6 may be applied to create other types of transistors, such as junctionless transistors or recessed channel transistors. Further, the FIG. 6 methods may be applied in conjunction with the hydrogen plasma activation techniques previously described in this document. Thus the invention is to be limited only by the appended claims.

Persons of ordinary skill in the art will appreciate that when multiple layers of doped or undoped single crystal silicon and an insulator, such as, for example, silicon dioxide, are formed as described above (e.g. additional Si/SiO2 layers 3024 and 3026 and first Si/SiO2 layer 3022 of incorporated references Ser. No. 15/201,430 and U.S. Pat. No. 9,385,088), that there are many other circuit elements which may be formed, such as, for example, capacitors and inductors, by subsequent processing. Moreover, it will also be appreciated by persons of ordinary skill in the art that the thickness and doping of the single crystal silicon layer wherein the circuit elements, such as, for example, transistors, are formed, may provide a fully depleted device structure, a partially depleted device structure, or a substantially bulk device structure substrate for each layer of a 3D IC or the single layer of a 2D IC.

Alternatively, another process could be used for forming activated source-drain regions. Dopant segregation techniques (DST) may be utilized to efficiently modulate the source and drain Schottky barrier height for both p and n type junctions. Metal or metals, such as platinum and nickel, may be deposited, and a silicide, such as Ni0.9Pt0.1Si, may formed by thermal treatment or an optical treatment, such as a laser anneal, following which dopants for source and drain regions may be implanted, such as arsenic and boron, and the dopant pile-up is initiated by a low temperature post-silicidation activation step, such as a thermal treatment or an optical treatment, such as a laser anneal. An alternate DST is as follows: Metal or metals, such as platinum and nickel, may be deposited, following which dopants for source and drain regions may be implanted, such as arsenic and boron, followed by dopant segregation induced by the silicidation thermal budget wherein a silicide, such as Ni0.9Pt0.1Si, may formed by thermal treatment or an optical treatment, such as a laser anneal. Alternatively, dopants for source and drain regions may be implanted, such as arsenic and boron, following which metal or metals, such as platinum and nickel, may be deposited, and a silicide, such as Ni0.9Pt0.1Si, may formed by thermal treatment or an optical treatment, such as a laser anneal Further details of these processes for forming dopant segregated source-drain regions are described in "Low Temperature Implementation of Dopant-Segregated Band-edger Metallic S/D junctions in Thin-Body SOI p-MOSFETs", Proceedings IEDM, 2007, pp 147-150, by G. Larrieu, et al.; "A Comparative Study of Two Different Schemes to Dopant Segregation at NiSi/Si and PtSi/Si Interfaces for Schottky Barrier Height Lowering", IEEE Transactions on Electron Devices, vol. 55, no. 1, January 2008, pp. 396-403, by Z. Qiu, et al.; and "High-k/Metal-Gate Fully Depleted SOI CMOS With Single-Silicide Schottky Source/Drain With Sub-30-nm Gate Length", IEEE Electron Device Letters, vol. 31, no. 4, April 2010, pp. 275-277, by M. H. Khater, et al.

This embodiment of the invention advantageously uses this low-temperature source-drain formation technique and layer transfer techniques and produces 3D integrated circuits and chips.

Figure 7:
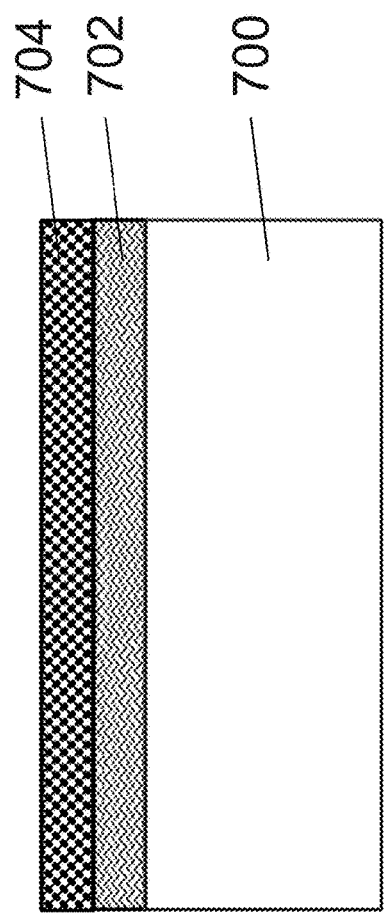
FIG. 7 is an exemplary drawing illustration of a partitioning of a circuit design into three layers of a 3D-IC.

Three dimensional devices offer a new possibility of partitioning designs into multiple layers or strata based various criteria, such as, for example, routing demands of device blocks in a design, lithographic process nodes, speed, cost, and density. Many of the criteria are illustrated in at least FIGS. 13, 210-215, and 239 and related specification sections in U.S. Patent Application Publication 2012/0129301 (allowed U.S. patent application Ser. No. 13/273,712, now U.S. Pat. No. 8,273,610), the contents are incorporated herein by reference. An additional criterion for partitioning decision-making may be one of trading cost for process complexity/attainment. For example, spacer based patterning techniques, wherein a lithographic critical dimension can be replicated smaller than the original image by single or multiple spacer depositions, spacer etches, and subsequent image (photoresist or prior spacer) removal, are becoming necessary in the industry to pattern smaller linewidths while still using the longer wavelength steppers and imagers. Other double, triple, and quad patterning techniques, such as pattern and cut, may also be utilized to overcome the lithographic constraints of the current imaging equipment. However, the spacer based and multiple patterning techniques are expensive to process and yield, and generally may be constraining to design and layout: they generally require regular patterns, sometimes substantially all parallel lines. An embodiment of the invention is to partition a design into those blocks and components that may be amenable and efficiently constructed by the above expensive patterning techniques onto one or more layers in the 3D-IC, and partition the other blocks and components of the design onto different layers in the 3D-IC. As illustrated in FIG. 7, third layer of circuits and transistors 704 may be stacked on top of second layer of circuits and transistors 702, which may be stacked on top of first layer/substrate of circuits and transistors 700. The formation of, stacking, and interconnect within and between the three layers may be done by techniques described herein, in the incorporated by reference documents, or any other 3DIC stacking technique that can form vertical interconnects of a density greater than 10,000 vias/cm$^2$. Partitioning of the overall device between the three layers may, for example, consist of the first layer/substrate of circuits and transistors 700 including the portion of the overall design wherein the blocks and components do not require the expensive patterning techniques discussed above; and second layer of circuits and transistors 702 may include a portion of the overall design wherein the blocks and components require the expensive patterning techniques discussed above, and may be aligned in, for example, the 'x' direction, and third layer of circuits and transistors 704 may include a portion of the overall design wherein the blocks and components require the expensive patterning techniques discussed above, and may be aligned in a direction different from second layer of circuits and transistors 702, for example, the 'y' direction (perpendicular to the second layer's pattern). The partitioning constraint discussed above related to process complexity/attainment may be utilized in combination with other partitioning constraints to provide an optimized fit to the design's logic and cost demands For example, the procedure and algorithm (illustrated in FIG. 239 and related specification found in the referenced patent document) to partition a design into two target technologies may be adapted to also include the constraints and criterion described herein FIG. 7.

Figure 8:
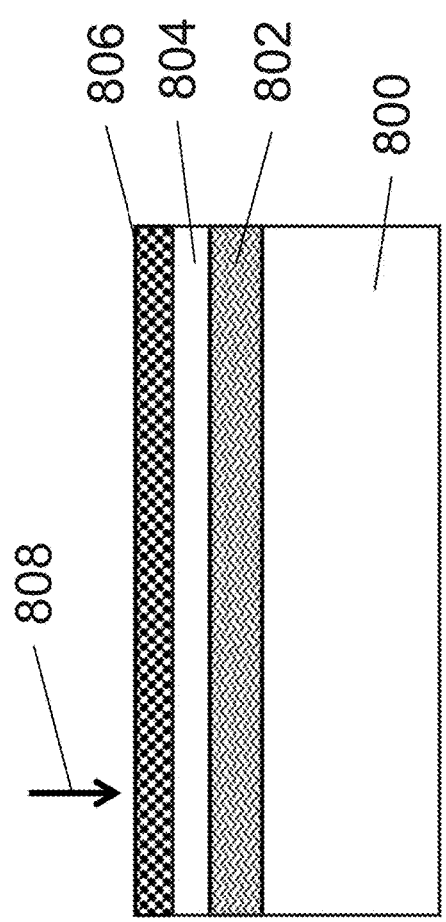
FIG. 8 is an exemplary drawing illustration of a carrier substrate with an integrated heat sink/spreader and/or optically reflective layer.

Ion implantation damage repair, and transferred layer annealing, such as activating doping, may utilize carrier wafer liftoff techniques as illustrated in at least FIGS. 184-189 and related specification sections in U.S. Patent Application Publication 2012/0129301 (allowed U.S. patent application Ser. No. 13/273,712, now U.S. Pat. No. 8,273, 610), the contents are incorporated herein by reference. High temperature glass carrier substrates/wafers may be utilized, but may locally be structurally damaged or de-bond from the layer being annealed when exposed to LSA (laser spike annealing) or other optical anneal techniques that may locally exceed the softening or outgassing temperature threshold of the glass carrier. An embodiment of the invention is to improve the heat-sinking capability and structural strength of the glass carrier by inserting a layer of a material that may have a greater heat capacity and/or heat spreading capability than glass or fused quartz, and may have an optically reflective property, for example, aluminum, tungsten or forms of carbon such as carbon nanotubes. As illustrated in FIG. 8, carrier substrate 899 may include substrate 800, heat sink reflector material 802, bonding material 804, and desired transfer layer 806. Substrate 800 may include, for example, monocrystalline silicon wafers, high temperature glass or fused quartz wafers/substrates, germanium wafers, InP wafers, or high temperature polymer substrates. Substrate 800 may have a thickness greater than about 50 um, such as 100 um, 1000 um, 1 mm, 2 mm, 5 mm to supply structural integrity for the subsequent processing. Heat sink reflector material 802 may include material that may have a greater heat capacity and/or heat spreading capability than glass or fused quartz, and may have an optically reflective property, for example, aluminum, tungsten, silicon based silicides, or forms of carbon such as carbon nanotubes. Bonding material 804 may include silicon oxides, indium tin oxides, fused quartz, high temperature glasses, and other optically transparent to the LSA beam or optical annealing wavelength materials. Bonding material 804 may have a thickness greater than about 5 nm, such as 10 nm, 20 nm, 100 nm, 200 nm, 300 nm, 500 nm. Desired transfer layer 806 may include any layer transfer devices and/or layer or layers contained herein this document or the referenced document, for example, the gate-last partial transistor layers, DRAM Si/SiO2 layers, sub-stack layers of circuitry, RCAT doped layers, or starting material doped monocrystalline silicon. Carrier substrate 899 may be exposed to an optical annealing beam, such as, for example, a laser-spike anneal beam from a commercial semiconductor material oriented single or dual-beam laser spike anneal DB-LSA system of Ultratech Inc., San Jose, Calif., USA or a short pulse laser (such as 160 ns), with 308 nm wavelength, such as offered by Excico of Gennevilliers, France. Optical anneal beam 808 may locally heat desired transfer layer 806 to anneal defects and/or activate dopants. The portion of the optical anneal beam 808 that is not absorbed by desired transfer layer 806 may pass through bonding material 804 and be absorbed and or reflected by heat sink reflector material 802. This may increase the efficiency of the optical anneal/activation of desired transfer layer 806, and may also provide a heat spreading capability so that the temperature of desired transfer layer 806 and bonding material 804 locally near the optical anneal beam 808, and in the beam's immediate past locations, may not exceed the debond temperature of the bonding material 804 to desired transfer layer 806 bond. The annealed and/or activated desired transfer layer 806 may be layer transferred to an acceptor wafer or substrate, as described, for example, in the referenced patent document FIG. 186. Substrate 800, heat sink reflector material 802, and bonding material 804 may be removed/decoupled from desired transfer layer 806 by being etched away or removed during the layer transfer process.

A planar fully depleted n-channel Recessed Channel Array Transistor (FD-RCAT) suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an un-doped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. FIG. 9A-F illustrates an exemplary n-channel FD-RCAT which may be constructed in a 3D stacked layer using procedures outlined below and in U.S. Patent Application Publication 2012/0129301 (allowed U.S. patent application Ser. No. 13/273,712, now U.S. Pat. No. 8,273, 610) and pending U.S. patent application Ser. Nos. 13/441, 923 and 13/099,010, now U.S. Pat. Nos. 8,557,632 and 8,581,349. The contents of the foregoing applications are incorporated herein by reference.

As illustrated in FIG. 9A, a P− substrate donor wafer 900 may be processed to include wafer sized layers of N+ doping 902, P− doping 906, channel 903 and P+ doping 904 across the wafer. The N+ doped layer 902, P− doped layer 906, channel layer 903 and P+ doped layer 904 may be formed by ion implantation and thermal anneal P− substrate donor wafer 900 may include a crystalline material, for example, mono-crystalline (single crystal) silicon. P− doped layer 906 and channel layer 903 may have additional ion implantation and anneal processing to provide a different dopant level than P− substrate donor wafer 900. P− substrate donor wafer 900 may be very lightly doped (less than 1e15 atoms/cm$^3$) or nominally un-doped (less than 1e14 atoms/cm$^3$). P− doped layer 906, channel layer 903, and P+ doped layer 904 may have graded or various layers doping to mitigate transistor performance issues, such as, for example, short channel effects, after the FD-RCAT is formed, and to provide effective body biasing, whether adaptive or dynamic The layer stack may alternatively be formed by successive epitaxially deposited doped silicon layers of N+ doped layer 902, P− doped layer 906, channel layer 903 and P+ doped layer 904, or by a combination of epitaxy and implantation. Annealing of implants and doping may include, for example, conductive/inductive thermal, optical annealing techniques or types of Rapid Thermal Anneal (RTA or spike). The N+ doped layer 902 may have a doping concentration that may be more than 10× the doping concentration of P− doped layer 906 and/or channel layer 903. The P+ doped layer 904 may have a doping concentration that may be more than 10× the doping concentration of P− doped layer 906 and/or channel layer 903. The P− doped layer 906 may have a doping concentration that may be more than 10× the doping concentration of channel layer 903. Channel layer 903 may have a thickness that may allow fully-depleted channel operation when the FD-RCAT transistor is substantially completely formed, such as, for example, less than 5 nm, less than 10 nm, or less than 20 nm.

As illustrated in FIG. 9B, the top surface of the P− substrate donor wafer 900 layer stack may be prepared for oxide wafer bonding with a deposition of an oxide or by thermal oxidation of P+ doped layer 904 to form oxide layer 980. A layer transfer demarcation plane (shown as dashed line) 999 may be formed by hydrogen implantation or other methods as described in the incorporated references. The P− substrate donor wafer 900 and acceptor wafer 910 may be prepared for wafer bonding as previously described and low temperature (less than approximately 400° C.) bonded. Acceptor wafer 910, as described in the incorporated references, may include, for example, transistors, circuitry, and metal, such as, for example, aluminum or copper, interconnect wiring, a metal shield/heat sink layer, and thru layer via metal interconnect strips or pads. The portion of the N+ doped layer 902 and the P− substrate donor wafer 900 that may be above (when the layer stack is flipped over and bonded to the acceptor wafer) the layer transfer demarcation plane 999 may be removed by cleaving or other low temperature processes as described in the incorporated references, such as, for example, ion-cut or other layer transfer methods.

As illustrated in FIG. 9C, oxide layer 980, P+ doped layer 904, channel layer 903, P− doped layer 906, and remaining N+ layer 922 have been layer transferred to acceptor wafer 910. The top surface of N+ layer 922 may be chemically or mechanically polished. Now transistors may be formed with low temperature (less than approximately 400° C. exposure to the acceptor wafer 910) processing and aligned to the acceptor wafer alignment marks (not shown) as described in the incorporated references.

As illustrated in FIG. 9D, the transistor isolation regions 905 may be formed by mask defining and plasma/RIE etching remaining N+ layer 922, P− doped layer 906, channel layer 903, and P+ doped layer 904 substantially to the top of oxide layer 980 (not shown), substantially into oxide layer 980, or into a portion of the upper oxide layer of acceptor wafer 910 (not shown). Additionally, a portion of the transistor isolation regions 905 may be etched (separate step) substantially to P+ doped layer 904, thus allowing multiple transistor regions to be connected by the same P+ doped region 924. A low-temperature gap fill oxide may be deposited and chemically mechanically polished, the oxide remaining in isolation regions 905. The recessed channel 986 may be mask defined and etched thru remaining N+ doped layer 922, P− doped layer 906 and partially into channel layer 903. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 932, P− regions 926, and channel region 923 may be formed, which may substantially form the transistor body. The doping concentration of N+ source and drain regions 932 may be more than 10× the concentration of channel region 923. The doping concentration of the N− channel region 923 may include gradients of concentration or layers of differing doping concentrations. The doping concentration of N+ source and drain regions 932 may be more than 10× the concentration of P− regions 926. The etch formation of recessed channel 986 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 923 in the region below recessed channel 986 may be of a thickness that allows fully-depleted channel operation. The thickness of channel region 923 in the region below N+ source and drain regions 932 may be of a thickness that allows fully-depleted transistor operation.

Figure 9E:
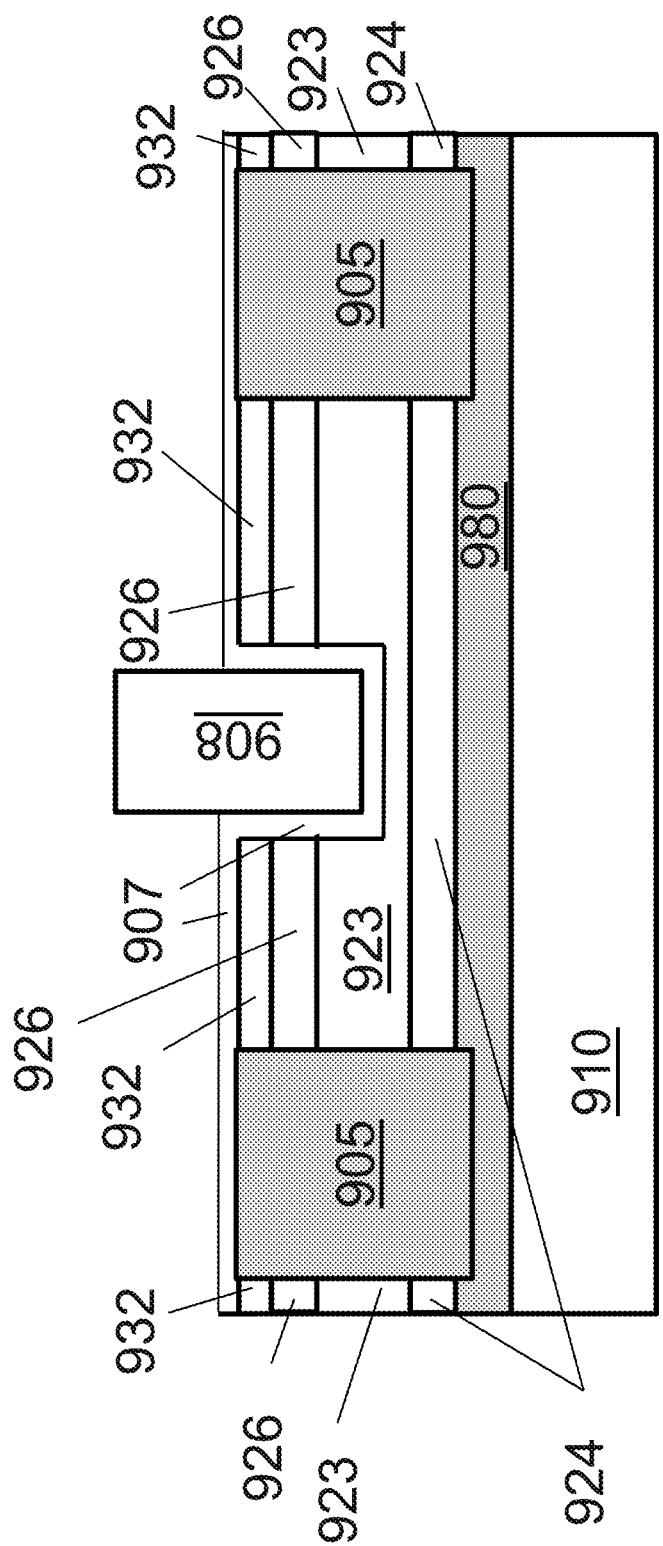

As illustrated in FIG. 9E, a gate dielectric 907 may be formed and a gate metal material may be deposited. The gate dielectric 907 may be an atomic layer deposited (ALD) gate dielectric that may be paired with a work function specific gate metal in the industry standard high k metal gate process schemes described in the incorporated references. Alternatively, the gate dielectric 907 may be formed with a low temperature processes including, for example, oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 908. The shape of gate electrode 908 is illustrative, the gate electrode may also overlap a portion of N+ source and drain regions 932.

As illustrated in FIG. 9F, a low temperature thick oxide 909 may be deposited and planarized, and source, gate, and drain contacts, P+ doped region contact (not shown) and thru layer via (not shown) openings may be masked and etched preparing the transistors to be connected via metallization P+ doped region contact may be constructed thru isolation regions 905, suitably when the isolation regions 905 is formed to a shared P+ doped region 924. Thus gate contact 911 connects to gate electrode 908, and source & drain contacts 940 connect to N+ source and drain regions 932. The thru layer via (not shown) provides electrical coupling among the donor wafer transistors and the acceptor wafer metal connect pads or strips (not shown) as described in the incorporated references.

Persons of ordinary skill in the art will appreciate that the illustrations in FIGS. 9A through 9F are exemplary only and are not drawn to scale. Such skilled persons will further appreciate that many variations are possible such as, for example, a p-channel FD-RCAT may be formed with changing the types of dopings appropriately. Moreover, the P− substrate donor wafer 900 may be n type or un-doped. Further, P− doped channel layer 903 may include multiple layers of different doping concentrations and gradients to fine tune the eventual FD-RCAT channel for electrical performance and reliability characteristics, such as, for example, off-state leakage current and on-state current. Furthermore, isolation regions 905 may be formed by a hard mask defined process flow, wherein a hard mask stack, such as, for example, silicon oxide and silicon nitride layers, or silicon oxide and amorphous carbon layers, may be utilized Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111>or <551>, and may include different contact silicides for optimum contact resistance to p or n type source, drains, and gates. Furthermore, P+ doped regions 924 may be utilized for a double gate structure for the FD-RCAT and may utilize techniques described in the incorporated references. Further, efficient heat removal and transistor body biasing may be accomplished on a FD-RCAT by adding an appropriately doped buried layer (N− in the case of a n-FD-RCAT), forming a buried layer region underneath the P+ doped region 924 for junction isolation, and connecting that buried region to a thermal and electrical contact, similar to what is described for layer 1606 and region 1646 in FIGS. 16A-G in the incorporated reference pending U.S. patent application Ser. No. 13/441,923, now U.S. Pat. No. 8,557,632. Many other modifications within the scope of the invention will suggest themselves to such skilled persons after reading this specification. Thus the invention is to be limited only by the appended claims Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting material layer or layers is incorporated between the sensitive metal interconnect layers and the layer or regions being optically irradiated and annealed, or annealed from the top of the 3D-IC stack using other methods. An exemplary generalized process flow is shown in FIGS. 10A-F. An exemplary process flow for an FD-RCAT with an integrated heat spreader is shown in FIGS. 34A-G. The 3D-ICs may be constructed in a 3D stacked layer using procedures outlined in U.S. Patent Application Publication 2012/0129301 (allowed U.S. patent application Ser. No. 13/273,712, now U.S. Pat. No. 8,273,610) and pending U.S. patent application Ser. Nos. 13/441,923 and 13/099,010, now U.S. Pat. Nos. 8,557,632 and 8,581,349. The contents of the foregoing applications are incorporated herein by reference. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength) or a short pulse laser (such as 160 ns), with 308 nm wavelength, and large area irradiation such as offered by Excico of Gennevilliers, France, may be utilized Additionally, the defect anneal may include, for example, laser anneals, Rapid Thermal Anneal (RTA), flash anneal, Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or reducing atmospheres (such as nitrogen or argon). The topside defect anneal may include temperatures of the layer being annealed above about 400° C. (a high temperature thermal anneal), including, for example, 600° C., 800° C., 900° C., 1000° C., 1050° C., 1100° C. and/or 1120° C. The topside defect anneal may include activation of semiconductor dopants, such as, for example, ion implanted dopants or PLAD applied dopants.

Figure 10A:
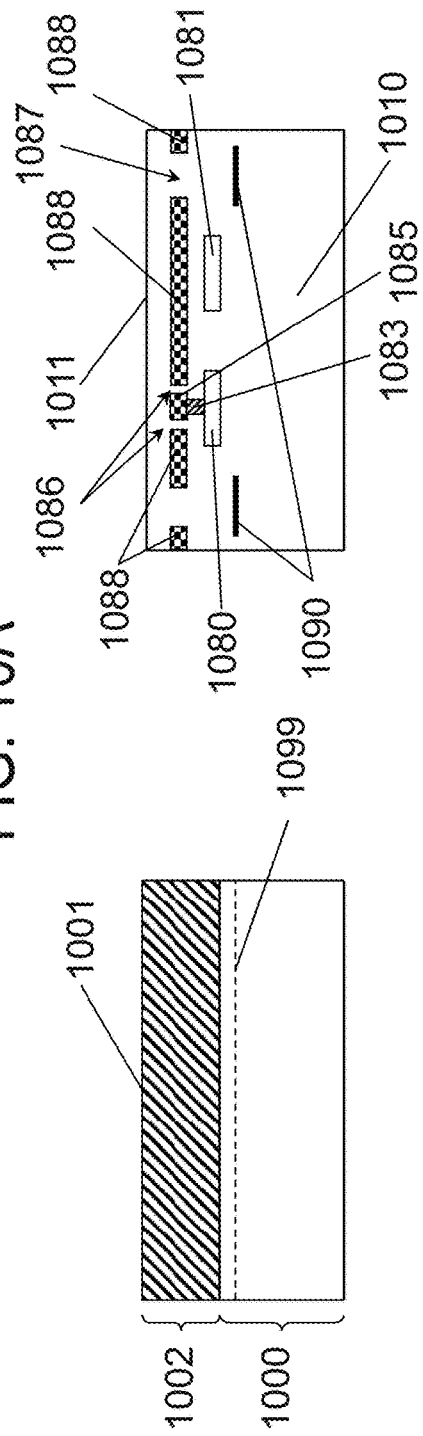

As illustrated in FIG. 10A, a generalized process flow may begin with a donor wafer 1000 that may be preprocessed with wafer sized layers 1002 of conducting, semiconducting or insulating materials that may be formed by deposition, ion implantation and anneal, oxidation, epitaxial growth, combinations of above, or other semiconductor processing steps and methods. For example, donor wafer 1000 and wafer sized layers 1002 may include semiconductor materials such as, for example, mono-crystalline silicon, germanium, GaAs, InP, and graphene. For this illustration, mono-crystalline (single crystal) silicon may be used. The donor wafer 1000 may be preprocessed with a layer transfer demarcation plane (shown as dashed line) 1099, such as, for example, a hydrogen implant cleave plane, before or after (typical) wafer sized layers 1002 are formed. Layer transfer demarcation plane 1099 may alternatively be formed within wafer sized layers 1002. Other layer transfer processes, some described in the referenced patent documents, may alternatively be utilized. Damage/defects to crystalline structure of donor wafer 1000 may be annealed by some of the annealing methods described, for example the short wavelength pulsed laser techniques, wherein the donor wafer 1000 wafer sized layers 1002 and portions of donor wafer 1000 may be heated to defect annealing temperatures, but the layer transfer demarcation plane 1099 may be kept below the temperate for cleaving and/or significant hydrogen diffusion. Dopants in at least a portion of wafer sized layers 1002 may also be electrically activated. Thru the processing, donor wafer 1000 and/or wafer sized layers 1002 could be thinned from its original thickness, and their/its final thickness could be in the range of about 0.01 um to about 50 um, for example, 10 nm, 100 nm, 200 nm, 0.4 um, 1 um, 2 um or 5 um. Donor wafer 1000 and wafer sized layers 1002 may include preparatory layers for the formation of transistors such as, for example, MOSFETS, FinFets, FD-RCATs, BJTs, HEMTs, HBTs, or partially processed transistors (for example, the replacement gate process described in the referenced patent documents). Donor wafer 1000 and wafer sized layers 1002 may include the layer transfer devices and/or layer or layers contained herein this document or referenced patent documents, for example, DRAM Si/SiO2 layers, RCAT doped layers, or starting material doped or undoped monocrystalline silicon, or polycrystalline silicon. Donor wafer 1000 and wafer sized layers 1002 may have alignment marks (not shown). Acceptor wafer 1010 may be a preprocessed wafer that may have fully functional circuitry including metal layers (including aluminum or copper metal interconnect layers that may connect acceptor wafer 1010 transistors) or may be a wafer with previously transferred layers, or may be a blank carrier or holder wafer, or other kinds of substrates suitable for layer transfer processing. Acceptor wafer 1010 may have alignment marks 1090 and metal connect pads or strips 1080 and ray blocked metal interconnect 1081. Acceptor wafer 1010 may include transistors such as, for example, MOSFETS, FinFets, FD-RCATs, BJTs, HEMTs, and/or HBTs. Acceptor wafer 1010 may include shield/heat sink layer 1088, which may include materials such as, for example, Aluminum, Tungsten, Copper, silicon or cobalt based silicides, or forms of carbon such as carbon nanotubes. Shield/heat sink layer 1088 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 1088 may include isolation openings 1086, and alignment mark openings 1087, which may be utilized for short wavelength alignment of top layer (donor) processing to the acceptor wafer alignment marks 1090. Shield/heat sink layer 1088 may include shield path connect 1085 and shield path via 1083. Shield path via 1083 may thermally and/or electrically couple and connect shield path connect 1085 to acceptor wafer 1010 interconnect metallization layers such as, for example, metal connect pads or strips 1080 (shown). If two shield/heat sink layers 1088 are utilized, one on top of the other and separated by an isolation layer common in semiconductor BEOL, such as carbon doped silicon oxide, shield path connect 1085 may also thermally and/or electrically couple and connect each shield/heat sink layer 1088 to the other and to acceptor wafer 1010 interconnect metallization layers such as, for example, metal connect pads or strips 1080, thereby creating a heat conduction path from the shield/heat sink layer 1088 to the acceptor wafer substrate, and a heat sink (shown in FIG. 10F.).

Figure 10B:
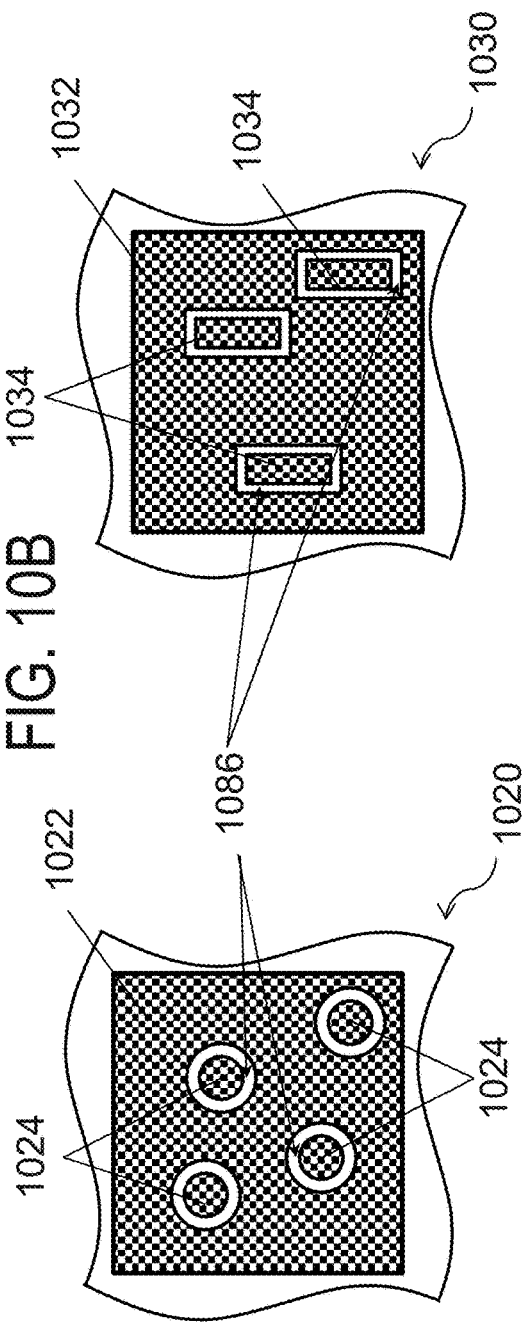

As illustrated in FIG. 10B, two exemplary top views of shield/heat sink layer 1088 are shown. In shield/heat sink portion 1020 a shield area 1022 of the shield/heat sink layer 1088 materials described above and in the incorporated references may include TLV/TSV connects 1024 and isolation openings 1086. Isolation openings 1086 may be the absence of the material of shield area 1022. TLV/TSV connects 1024 are an example of a shield path connect 1085. TLV/TSV connects 1024 and isolation openings 1086 may be drawn in the database of the 3D-IC stack and may formed during the acceptor wafer 1010 processing. In shield/heat sink portion 1030 a shield area 1032 of the shield/heat sink layer 1088 materials described above and in the incorporated references may have metal interconnect strips 1034 and isolation openings 1086. Metal interconnect strips 1034 may be surrounded by regions, such as isolation openings 1086, where the material of shield area 1032 may be etched away, thereby stopping electrical conduction from metal interconnect strips 1034 to shield area 1032 and to other metal interconnect strips. Metal interconnect strips 1034 may be utilized to connect/couple the transistors formed in the donor wafer layers, such as 1002, to themselves from the 'backside' or 'underside' and/or to transistors in the acceptor wafer level/layer. Metal interconnect strips 1034 and shield/heat sink layer 1088 regions such as shield area 1022 and shield area 1032 may be utilized as a ground plane for the transistors above it residing in the donor wafer layers.

Bonding surfaces, donor bonding surface 1001 and acceptor bonding surface 1011, may be prepared for wafer bonding by depositions (such as silicon oxide), polishes, plasma, or wet chemistry treatments to facilitate successful wafer to wafer bonding.

As illustrated in FIG. 10C, the donor wafer 1000 with wafer sized layers 1002 and layer transfer demarcation plane 1099 may be flipped over, aligned, and bonded to the acceptor wafer 1010. The donor wafer 1000 with wafer sized layers 1002 may have alignment marks (not shown). Various topside defect anneals may be utilized For this illustration, an optical beam such as the laser annealing previously described is used. Optical anneal beams may be optimized to focus light absorption and heat generation at or near the layer transfer demarcation plane (shown as dashed line) 1099 to provide a hydrogen bubble cleave with exemplary cleave ray 1051. The laser assisted hydrogen bubble cleave with the absorbed heat generated by exemplary cleave ray 1051 may also include a pre-heat of the bonded stack to, for example, about 100° C. to about 400° C., and/or a thermal rapid spike to temperatures above about 200° C. to about 600° C. The laser assisted ion-cut cleave may provide a smoother cleave surface upon which better quality transistors may be manufactured. Reflected ray 1053 may be reflected and/or absorbed by shield/heat sink layer 1088 regions thus blocking the optical absorption of ray blocked metal interconnect 1081. Additionally, shield/heat sink layer 1088 may laterally spread and conduct the heat generated by the topside defect anneal, and in conjunction with the dielectric materials (low heat conductivity) above and below shield/heat sink layer 1088, keep the interconnect metals and low-k dielectrics of the acceptor wafer interconnect layers cooler than a damage temperature, such as, for example, 400 C. Annealing of dopants or annealing of damage, such as from the H cleave implant damage, may be accomplished by a rays such as repair ray 1055. A small portion of the optical energy, such as unblocked ray 1057, may hit and heat, or be reflected, by (a few rays as the area of the heat shield openings, such as 1024, is small compared to the die or device area) such as metal connect pads or strips 1080. Heat generated by absorbed photons from, for example, cleave ray 1051, reflected ray 1053, and/or repair ray 1055 may also be absorbed by shield/heat sink layer 1088 regions and dissipated laterally and may keep the temperature of underlying metal layers, such as ray blocked metal interconnect 1081, and other metal layers below it, cooler and prevent damage. Shield/heat sink layer 1088 may act as a heat spreader. A second layer of shield/heat sink layer 1088 (not shown) may have been constructed (during the acceptor wafer 1010 formation) with a low heat conductive material sandwiched between the two heat sink layers, such as silicon oxide or carbon doped 'low-k' silicon oxides, for improved thermal protection of the acceptor wafer interconnect layers, metal and dielectrics. Electrically conductive materials may be used for the two layers of shield/heat sink layer 1088 and thus may provide, for example, a Vss and a Vdd plane for power delivery that may be connected to the donor layer transistors above, as well may be connected to the acceptor wafer transistors below. Shield/heat sink layer 1088 may include materials with a high thermal conductivity greater than 10 W/m-K, for example, copper (about 400 W/m-K), aluminum (about 237 W/m-K), Tungsten (about 173 W/m-K), Plasma. Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 1088 may be sandwiched and/or substantially enclosed by materials with a low thermal conductivity less than 10 W/m-K, for example, silicon dioxide (about 1.4 W/m-K). The sandwiching of high and low thermal conductivity materials in layers, such as shield/heat sink layer 1088 and under & overlying dielectric layers, spreads the localized heat/light energy of the topside anneal laterally and protect the underlying layers of interconnect metallization & dielectrics, such as in the acceptor wafer, from harmful temperatures or damage.

As illustrated in FIG. 10D, the donor wafer 1000 may be cleaved at or thinned to (or past, not shown) the layer transfer demarcation plane 1099, leaving donor wafer portion 1003 and the pre-processed layers 1002 bonded to the acceptor wafer 1010, by methods such as, for example, ion-cut or other layer transfer methods. The layer transfer demarcation plane 1099 may instead be placed in the pre-processed layers 1002. Optical anneal beams may be optimized to focus light absorption and heat generation within or at the surface of donor wafer portion 1003 and provide surface smoothing and/or defect annealing (defects may be from the cleave and/or the ion-cut implantation) with exemplary smoothing/annealing ray 1066. The laser assisted smoothing/annealing with the absorbed heat generated by exemplary smoothing/annealing ray 1066 may also include a pre-heat of the bonded stack to, for example, about 100° C. to about 400° C., and/or a thermal rapid spike to temperatures above about 200° C. to about 600° C. Reflected ray 1063 may be reflected and/or absorbed by shield/heat sink layer 1088 regions thus blocking the optical absorption of ray blocked metal interconnect 1081. Annealing of dopants or annealing of damage, such as from the H cleave implant damage, may be also accomplished by a set of rays such as repair ray 1065. A small portion of the optical energy, such as unblocked ray 1067, may hit and heat, or be reflected, by a few rays (as the area of the heat shield openings, such as 1024, is small) such as metal connect pads or strips 1080. Heat generated by absorbed photons from, for example, smoothing/annealing ray 1066, reflected ray 1063, and/or repair ray 1065 may also be absorbed by shield/heat sink layer 1088 regions and dissipated laterally and may keep the temperature of underlying metal layers, such as ray blocked metal interconnect 1081, and other metal layers below it, cooler and prevent damage. A second layer of shield/heat sink layer 1088 may be constructed with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 1088 may act as a heat spreader. Electrically conductive materials may be used for the two layers of shield/heat sink layer 1088 and thus may provide, for example, a Vss and a Vdd plane that may be connected to the donor layer transistors above, as well may be connected to the acceptor wafer transistors below.

As illustrated in FIG. 10E, the remaining donor wafer portion 1003 may be removed by polishing or etching and the transferred layers 1002 may be further processed to create second device layer 1005 which may include donor wafer device structures 1050 and metal interconnect layers (such as second device layer metal interconnect 1061) that may be precisely aligned to the acceptor wafer alignment marks 1090. Donor wafer device structures 1050 may include, for example, CMOS transistors such as N type and P type transistors, or any of the other transistor or device types discussed herein this document or referenced patent documents. Second device layer metal interconnect 1061 may include electrically conductive materials such as copper, aluminum, conductive forms of carbon, and tungsten. Donor wafer device structures 1050 may utilize second device layer metal interconnect 1061 and thru layer vias (TLVs) 1060 to electrically couple (connection paths) the donor wafer device structures 1050 to the acceptor wafer metal connect pads or strips 1080, and thus couple donor wafer device structures (the second layer transistors) with acceptor wafer device structures (first layer transistors). Thermal TLVs 1062 may be constructed of thermally conductive but not electrically conductive materials, for example, DLC (Diamond Like Carbon), and may connect donor wafer device structures 1050 thermally to shield/heat sink layer 1088. TLVs 1060 may be constructed out of electrically and thermally conductive materials, such as Tungsten, Copper, or aluminum, and may provide a thermal and electrical connection path from donor wafer device structures 1050 to shield/heat sink layer 1088, which may be a ground or Vdd plane in the design/layout. TLVs 1060 and thermal TLVs 1062 may be also constructed in the device scribelanes (pre-designed in base layers or potential dicelines) to provide thermal conduction to the heat sink, and may be sawed/diced off when the wafer is diced for packaging. Shield/heat sink layer 1088 may be configured to act as an emf (electro-motive force) shield to prevent direct layer to layer cross-talk between transistors in the donor wafer layer and transistors in the acceptor wafer. In addition to static ground or Vdd biasing, shield/heat sink layer 1088 may be actively biased with an anti-interference signal from circuitry residing on, for example, a layer of the 3D-IC or off chip. TLVs 1060 may be formed through the transferred layers 1002. As the transferred layers 1002 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 1002, the smaller the thru layer via diameter obtainable, which may result from maintaining manufacturable via aspect ratios. Thus, the transferred layers 1002 (and hence, TLVs 1060) may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable obtainable lithographic resolution, such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. Transferred layers 1002 may be considered to be overlying the metal layer or layers of acceptor wafer 1010. Alignment marks in acceptor wafer 1010 and/or in transferred layers 1002 may be utilized to enable reliable contact to transistors and circuitry in transferred layers 1002 and donor wafer device structures 1050 and electrically couple them to the transistors and circuitry in the acceptor wafer 1010. The donor wafer 1000 may now also be processed, such as smoothing and annealing, and reused for additional layer transfers.

As illustrated in FIG. 10F, a thermal conduction path may be constructed from the devices in the upper layer, the transferred donor layer and formed transistors, to the acceptor wafer substrate and associated heat sink. The thermal conduction path from the donor wafer device structures 1050 to the acceptor wafer heat sink 1097 may include second device layer metal interconnect 1061, TLVs 1060, shield path connect 1085, shield path via 1083, metal connect pads or strips 1080, first (acceptor) layer metal interconnect 1091, acceptor wafer transistors and devices 1093, and acceptor substrate 1095. The elements of the thermal conduction path may include materials that have a thermal conductivity greater than 10 W/m-K, for example, copper (about 400 W/m-K), aluminum (about 237 W/m-K), and Tungsten (about 173 W/m-K). The acceptor wafer interconnects may be substantially surrounded by BEOL dielectric 1096.

A planar fully depleted n-channel Recessed Channel Array Transistor (FD-RCAT) with an integrated shield/heat sink layer suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an undoped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 11A-G illustrates an exemplary n-channel FD-RCAT which may be constructed in a 3D stacked layer using procedures outlined below and in U.S. Patent Application Publication 2012/0129301 (allowed U.S. patent application Ser. No. 13/273,712, now U.S. Pat. No. 8,273,610) and pending U.S. patent application Ser. Nos. 13/441,923 and 13/099,010, now U.S. Pat. Nos. 8,557,632 and 8,581,349. The contents of the foregoing applications are incorporated herein by reference.

As illustrated in FIG. 11A, a P− substrate donor wafer 1100 may be processed to include wafer sized layers of N+ doping 1102, P− doping 1106, channel 1103 and P+ doping 1104 across the wafer. The N+ doped layer 1102, P− doped layer 1106, channel layer 1103 and P+ doped layer 1104 may be formed by ion implantation and thermal anneal. P− substrate donor wafer 1100 may include a crystalline material, for example, mono-crystalline (single crystal) silicon. P− doped layer 1106 and channel layer 1103 may have additional ion implantation and anneal processing to provide a different dopant level than P− substrate donor wafer 1100. P− substrate donor wafer 1100 may be very lightly doped (less than 1e15 atoms/cm$^3$) or nominally un-doped (less than 1e14 atoms/cm$^3$). P− doped layer 1106, channel layer 1103, and P+ doped layer 1104 may have graded or various layers doping to mitigate transistor performance issues, such as, for example, short channel effects, after the FD-RCAT is formed, and to provide effective body biasing, whether adaptive or dynamic The layer stack may alternatively be formed by successive epitaxially deposited doped silicon layers of N+ doped layer 1102, P− doped layer 1106, channel layer 1103 and P+ doped layer 1104, or by a combination of epitaxy and implantation, or by layer transfer. Annealing of implants and doping may include, for example, conductive/inductive thermal, optical annealing techniques or types of Rapid Thermal Anneal (RTA or spike). The N+ doped layer 1102 may have a doping concentration that may be more than 10× the doping concentration of P− doped layer 1106 and/or channel layer 1103. The P+ doped layer 1104 may have a doping concentration that may be more than 10× the doping concentration of P− doped layer 1106 and/or channel layer 1103. The P− doped layer 1106 may have a doping concentration that may be more than 10× the doping concentration of channel layer 1103. Channel layer 1103 may have a thickness that may allow fully-depleted channel operation when the FD-RCAT transistor is substantially completely formed, such as, for example, less than 5 nm, less than 10 nm, or less than 20 nm.

As illustrated in FIG. 11B, the top surface of the P− substrate donor wafer 1100 layer stack may be prepared for oxide wafer bonding with a deposition of an oxide or by thermal oxidation of P+ doped layer 1104 to form oxide layer 1180. A layer transfer demarcation plane (shown as dashed line) 1199 may be formed by hydrogen implantation or other methods as described in the incorporated references. The P− substrate donor wafer 1100 and acceptor wafer 1110 may be prepared for wafer bonding as previously described and low temperature (less than approximately 400° C.) bonded. Acceptor wafer 1110, as described in the incorporated references, may include, for example, transistors, circuitry, and metal, such as, for example, aluminum or copper, interconnect wiring, a metal shield/heat sink layer, and thru layer via metal interconnect strips or pads. Acceptor wafer 1110 may include transistors such as, for example, MOSFETS, FinFets, FD-RCATs, BJTs, HEMTs, and/or HBTs. The portion of the N+ doped layer 1102 and the P− substrate donor wafer 1100 that may be above (when the layer stack is flipped over and bonded to the acceptor wafer) the layer transfer demarcation plane 1199 may be removed by cleaving or other low temperature processes as described in the incorporated references, such as, for example, ion-cut or other layer transfer methods. Damage/defects to crystalline structure of N+ doped layer 1102, P− doped layer 1106, channel layer 1103 and P+ doped layer 1104 may be annealed by some of the annealing methods described, for example the short wavelength pulsed laser techniques, wherein the N+ doped layer 1102, P− doped layer 1106, channel layer 1103 and P+ doped layer 1104 or portions of them may be heated to defect annealing temperatures, but the layer transfer demarcation plane 1199 may be kept below the temperate for cleaving and/or significant hydrogen diffusion. The optical energy may be deposited in the upper layer of the stack, for example in P+ doped layer 1104, and annealing of the other layer may take place via heat diffusion. Dopants in at least a portion of N+ doped layer 1102, P− doped layer 1106, channel layer 1103 and P+ doped layer 1104 may also be electrically activated by the anneal.

Figure 11C:
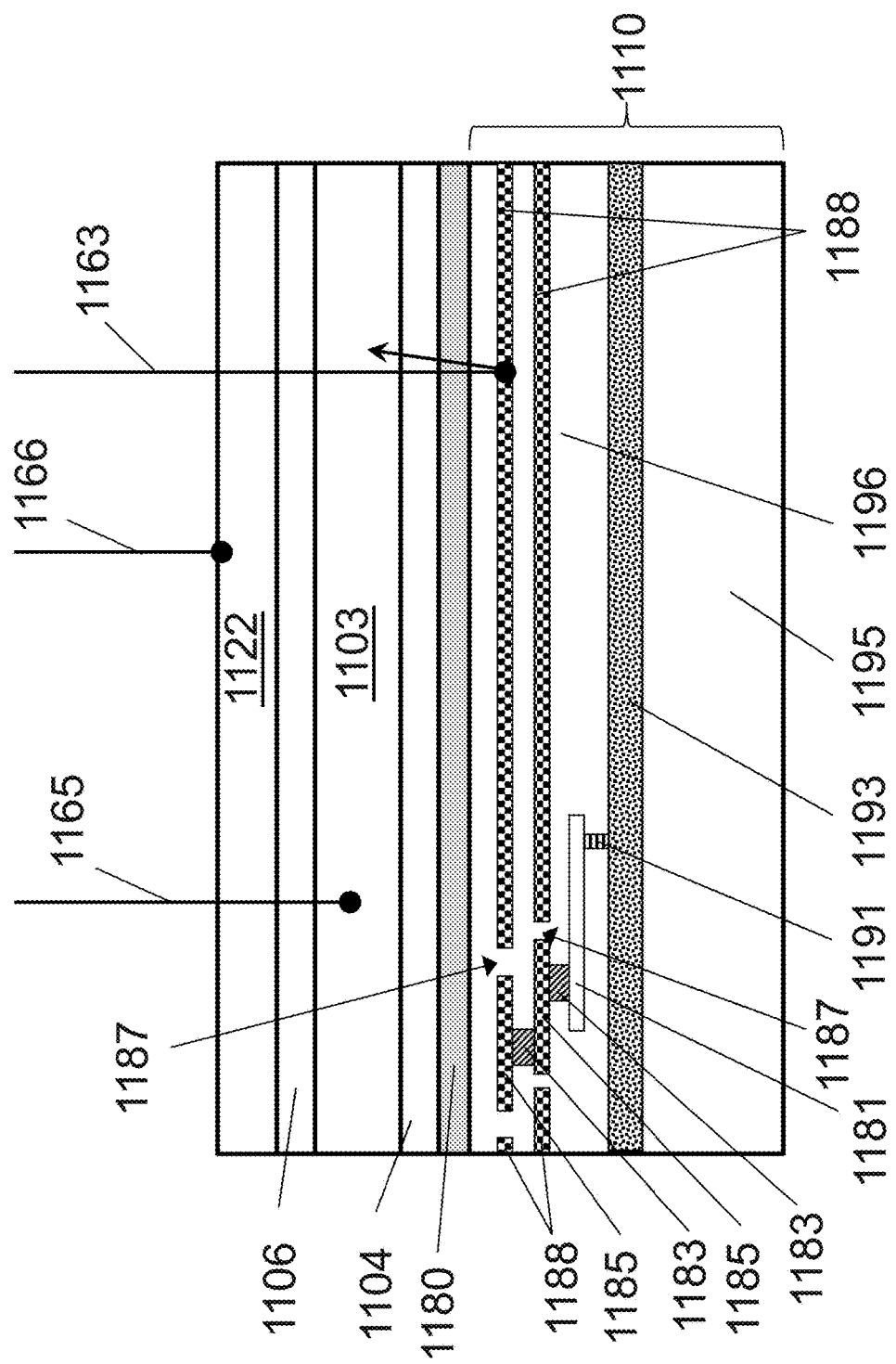

As illustrated in FIG. 11C, oxide layer 1180, P+ doped layer 1104, channel layer 1103, P− doped layer 1106, and remaining N+ layer 1122 have been layer transferred to acceptor wafer 1110. The top surface of N+ layer 1122 may be chemically or mechanically polished. Thru the processing, the wafer sized layers such as N+ layer 1122 P+ doped layer 1104, channel layer 1103, and P− doped layer 1106, could be thinned from its original total thickness, and their/its final total thickness could be in the range of about 0.01 um to about 50 um, for example, 10 nm, 100 nm, 200 nm, 0.4 um, 1 um, 2 um or 5 um. Acceptor wafer 1110 may include one or more (two are shown in this example) shield/heat sink layers 1188, which may include materials such as, for example, Aluminum, Tungsten, Copper, silicon or cobalt based silicides, or forms of carbon such as carbon nanotubes. Each shield/heat sink layer 1188 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 1188 may include isolation openings 1187, and alignment mark openings (not shown), which may be utilized for short wavelength alignment of top layer (donor) processing to the acceptor wafer alignment marks (not shown). Shield/heat sink layer 1188 may include one or more shield path connect 1185 and shield path via 1183. Shield path via 1183 may thermally and/or electrically couple and connect shield path connect 1185 to acceptor wafer 1110 interconnect metallization layers such as, for example, acceptor metal interconnect 1181 (shown). Shield path connect 1185 may also thermally and/or electrically couple and connect each shield/heat sink layer 1188 to the other and to acceptor wafer 1110 interconnect metallization layers such as, for example, acceptor metal interconnect 1181, thereby creating a heat conduction path from the shield/heat sink layer 1188 to the acceptor substrate 1195, and a heat sink (shown in FIG. 11G.). Isolation openings 1186 may include dielectric materials, similar to those of BEOL isolation 1196. Acceptor wafer 1110 may include first (acceptor) layer metal interconnect 1191, acceptor wafer transistors and devices 1193, and acceptor substrate 1195. Various topside defect anneals may be utilized For this illustration, an optical beam such as the laser annealing previously described is used. Optical anneal beams may be optimized to focus light absorption and heat generation within or at the surface of N+ layer 1122 and provide surface smoothing and/or defect annealing (defects may be from the cleave and/or the ion-cut implantation) with exemplary smoothing/annealing ray 1166. The laser assisted smoothing/annealing with the absorbed heat generated by exemplary smoothing/annealing ray 1166 may also include a pre-heat of the bonded stack to, for example, about 100° C. to about 400° C., and/or a rapid thermal spike to temperatures above about 200° C. to about 600° C. Reflected ray 1163 may be reflected and/or absorbed by shield/heat sink layer 1188 regions thus blocking the optical absorption of ray blocked metal interconnect 1181. Annealing of dopants or annealing of damage, such as from the H cleave implant damage, may be also accomplished by a set of rays such as repair ray 1165. Heat generated by absorbed photons from, for example, smoothing/annealing ray 1166, reflected ray 1163, and/or repair ray 1165 may also be absorbed by shield/heat sink layer 1188 regions and dissipated laterally and may keep the temperature of underlying metal layers, such as metal interconnect 1181, and other metal layers below it, cooler and prevent damage. Shield/heat sink layer 1188 and associated dielectrics may laterally spread and conduct the heat generated by the topside defect anneal, and in conjunction with the dielectric materials (low heat conductivity) above and below shield/heat sink layer 1188, keep the interconnect metals and low-k dielectrics of the acceptor wafer interconnect layers cooler than a damage temperature, such as, for example, 400° C. A second layer of shield/heat sink layer 1188 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 1188 may act as a heat spreader. Electrically conductive materials may be used for the two layers of shield/heat sink layer 1188 and thus may provide, for example, a Vss and a Vdd plane that may be connected to the donor layer transistors above, as well may be connected to the acceptor wafer transistors below. Shield/heat sink layer 1188 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 1188 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 1188 and under & overlying dielectric layers, spreads the localized heat/light energy of the topside anneal laterally and protect the underlying layers of interconnect metallization & dielectrics, such as in the acceptor wafer, from harmful temperatures or damage. Now transistors may be formed with low temperature (less than approximately 400° C. exposure to the acceptor wafer 1110) processing, and may be aligned to the acceptor wafer alignment marks (not shown) as described in the incorporated references. The donor wafer 1100 may now also be processed, such as smoothing and annealing, and reused for additional layer transfers.

Figure 11D:
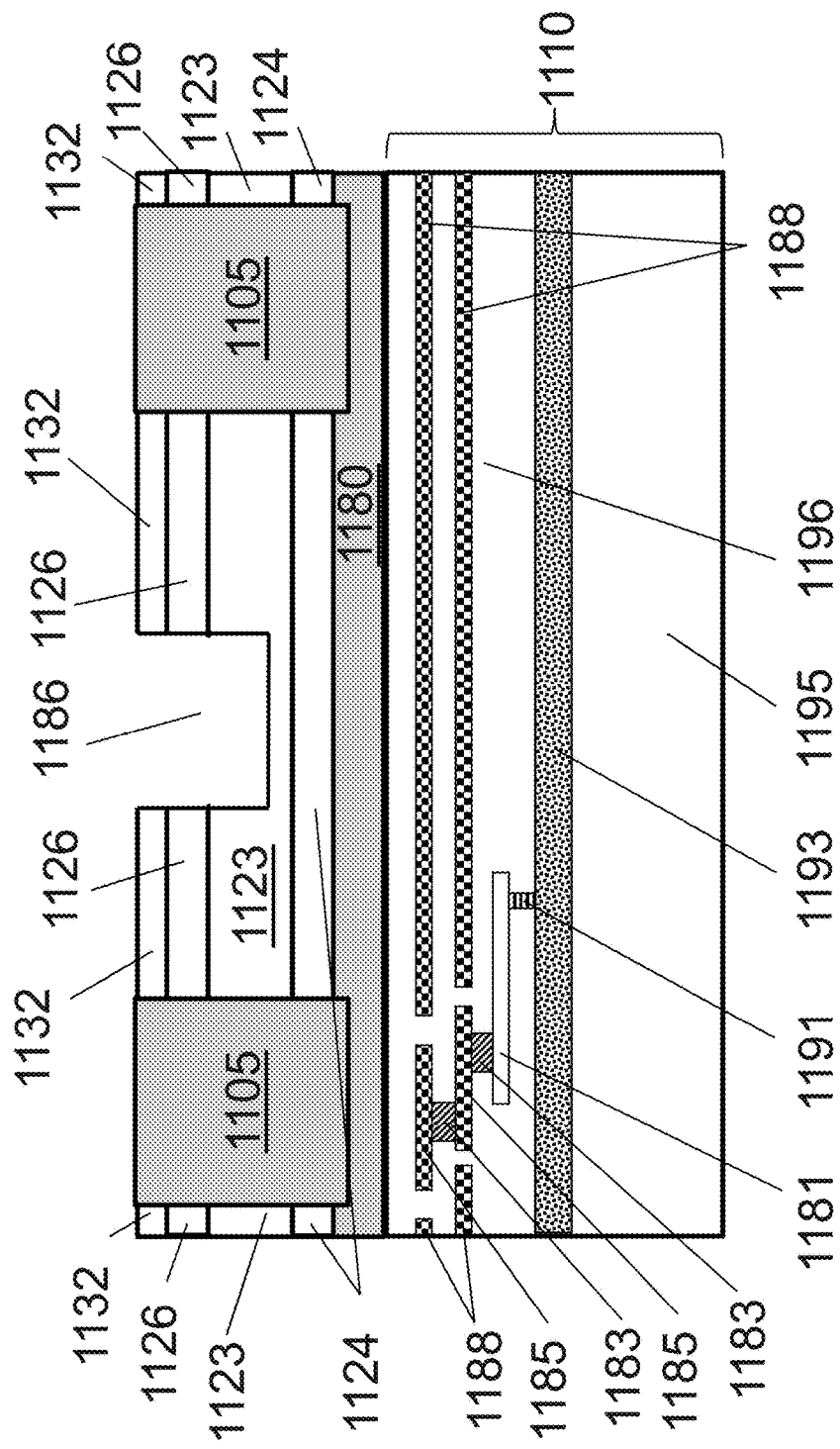

As illustrated in FIG. 11D, transistor isolation regions 1105 may be formed by mask defining and plasma/RIE etching remaining N+ layer 1122, P− doped layer 1106, channel layer 1103, and P+ doped layer 1104 substantially to the top of oxide layer 1180 (not shown), substantially into oxide layer 1180, or into a portion of the upper oxide layer of acceptor wafer 1110 (not shown). Additionally, a portion of the transistor isolation regions 1105 may be etched (separate step) substantially to P+ doped layer 1104, thus allowing multiple transistor regions to be connected by the same P+ doped region 1124. A low-temperature gap fill oxide may be deposited and chemically mechanically polished, the oxide remaining in isolation regions 1105. The recessed channel 1186 may be mask defined and etched thru remaining N+ doped layer 1122, P− doped layer 1106 and partially into channel layer 1103. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 1132, P− regions 1126, and channel region 1123 may be formed, which may substantially form the transistor body. The doping concentration of N+ source and drain regions 1132 may be more than 10× the concentration of channel region 1123. The doping concentration of the N− channel region 1123 may include gradients of concentration or layers of differing doping concentrations. The doping concentration of N+ source and drain regions 1132 may be more than 10× the concentration of P− regions 1126. The etch formation of recessed channel 1186 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 1123 in the region below recessed channel 1186 may be of a thickness that allows fully-depleted channel operation. The thickness of channel region 1123 in the region below N+ source and drain regions 1132 may be of a thickness that allows fully-depleted transistor operation.

Figure 11E:
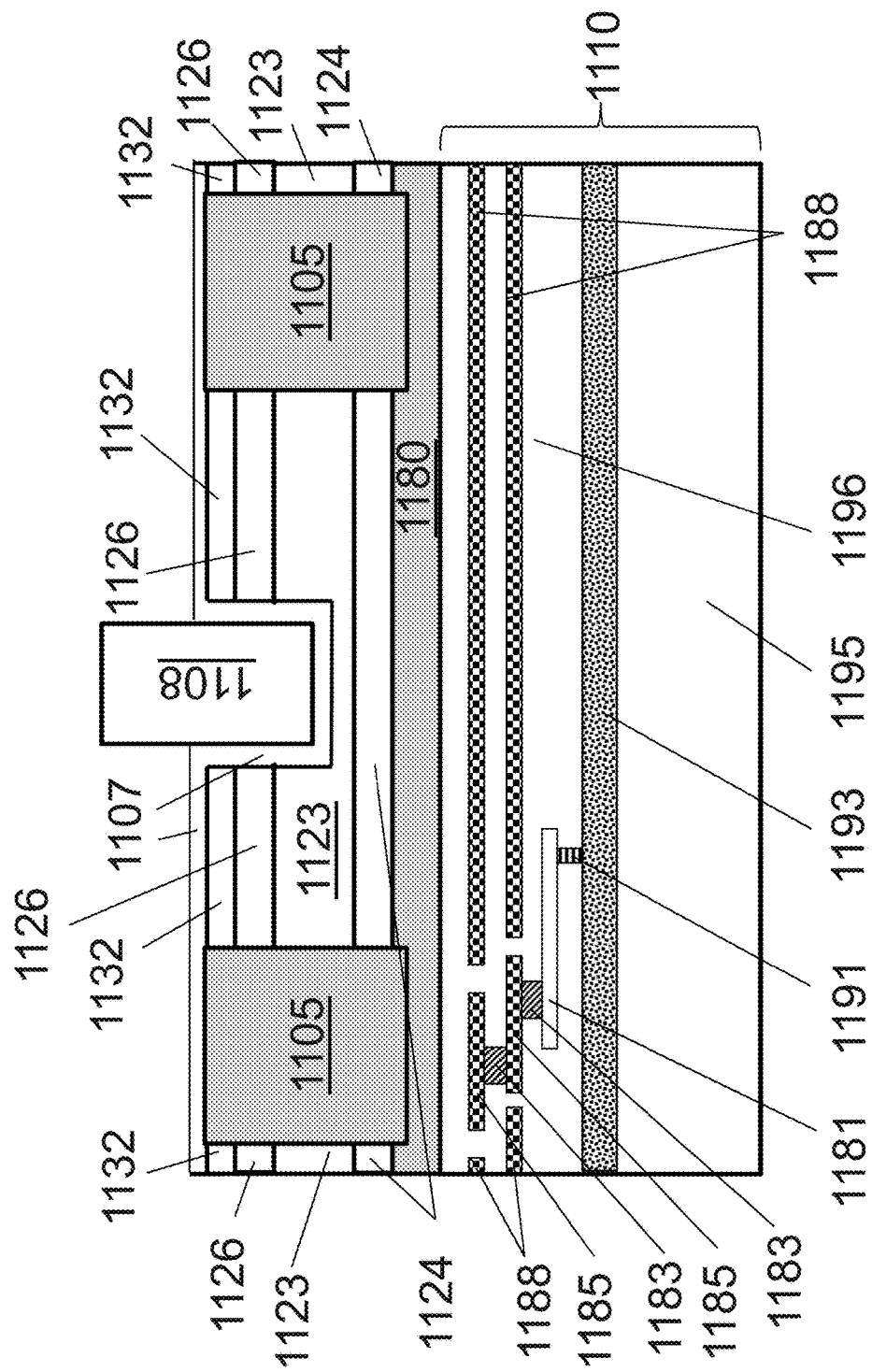

As illustrated in FIG. 11E, a gate dielectric 1107 may be formed and a gate metal material may be deposited. The gate dielectric 1107 may be an atomic layer deposited (ALD) gate dielectric that may be paired with a work function specific gate metal in the industry standard high k metal gate process schemes described in the incorporated references. Alternatively, the gate dielectric 1107 may be formed with a low temperature processes including, for example, oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 1108. The shape of gate electrode 1108 is illustrative, the gate electrode may also overlap a portion of N+ source and drain regions 1132.

As illustrated in FIG. 11F, a low temperature thick oxide 1109 may be deposited and planarized, and source, gate, and drain contacts, P+ doped region contact (not shown) and thru layer via (not shown) openings may be masked and etched preparing the transistors to be connected via metallization P+ doped region contact may be constructed thru isolation regions 1105, suitably when the isolation regions 1105 is formed to a shared P+ doped region 1124. Thus gate contact 1111 connects to gate electrode 1108, and source & drain contacts 1140 connect to N+ source and drain regions 1132.

As illustrated in FIG. 11G, thru layer vias (TLVs) 1160 may be formed by etching thick oxide 1109, gate dielectric 1107, isolation regions 1105, oxide layer 1180, into a portion of the upper oxide layer BEOL isolation 1196 of acceptor wafer 1110 BEOL, and filling with an electrically and thermally conducting material or an electrically non-conducting but thermally conducting material. Second device layer metal interconnect 1161 may be formed by conventional processing. TLVs 1160 may be constructed of thermally conductive but not electrically conductive materials, for example, DLC (Diamond Like Carbon), and may connect the FD-RCAT transistor device and other devices on the top (second) crystalline layer thermally to shield/heat sink layer 1188. TLVs 1160 may be constructed out of electrically and thermally conductive materials, such as Tungsten, Copper, or aluminum, and may provide a thermal and electrical connection path from the FD-RCAT transistor device and other devices on the top (second) crystalline layer to shield/heat sink layer 1188, which may be a ground or Vdd plane in the design/layout. TLVs 1160 may be also constructed in the device scribelanes (pre-designed in base layers or potential dicelines) to provide thermal conduction to the heat sink, and may be sawed/diced off when the wafer is diced for packaging not shown). Shield/heat sink layer 1188 may be configured to act (or adapted to act) as an emf (electro-motive force) shield to prevent direct layer to layer crosstalk between transistors in the donor wafer layer and transistors in the acceptor wafer. In addition to static ground or Vdd biasing, shield/heat sink layer 1188 may be actively biased with an anti-interference signal from circuitry residing on, for example, a layer of the 3D-IC or off chip. A thermal conduction path may be constructed from the devices in the upper layer, the transferred donor layer and formed transistors, to the acceptor wafer substrate and associated heat sink. The thermal conduction path from the FD-RCAT transistor device and other devices on the top (second) crystalline layer, for example, N+ source and drain regions 1132, to the acceptor wafer heat sink 1197 may include source & drain contacts 1140, second device layer metal interconnect 1161, TLV 1160, shield path connect 1185 (shown as twice), shield path via 1183 (shown as twice), metal interconnect 1181, first (acceptor) layer metal interconnect 1191, acceptor wafer transistors and devices 1193, and acceptor substrate 1195. The elements of the thermal conduction path may include materials that have a thermal conductivity greater than 10 W/m-K, for example, copper (about 400 W/m-K), aluminum (about 237 W/m-K), and Tungsten (about 173 W/m-K).

Persons of ordinary skill in the art will appreciate that the illustrations in FIGS. 11A through 11G are exemplary only and are not drawn to scale. Such skilled persons will further appreciate that many variations are possible such as, for example, a p-channel FD-RCAT may be formed with changing the types of dopings appropriately. Moreover, the P− substrate donor wafer 1100 may be n type or un-doped. Further, P− doped channel layer 1103 may include multiple layers of different doping concentrations and gradients to fine tune the eventual FD-RCAT channel for electrical performance and reliability characteristics, such as, for example, off-state leakage current and on-state current. Furthermore, isolation regions 1105 may be formed by a hard mask defined process flow, wherein a hard mask stack, such as, for example, silicon oxide and silicon nitride layers, or silicon oxide and amorphous carbon layers, may be utilized. Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111>or <551>, and may include different contact silicides for optimum contact resistance to p or n type source, drains, and gates. Furthermore, P+ doped regions 1124 may be utilized for a double gate structure for the FD-RCAT and may utilize techniques described in the incorporated references. Further, efficient heat removal and transistor body biasing may be accomplished on a FD-RCAT by adding an appropriately doped buried layer (N− in the case of a n-FD-RCAT), forming a buried layer region underneath the P+ doped regions 1124 for junction isolation, and connecting that buried region to a thermal and electrical contact, similar to what is described for layer 1606 and region 1646 in FIGS. 16A-G in the incorporated reference pending U.S. patent application Ser. No. 13/441,923, now U.S. Pat. No. 8,273,610. Implants after the formation of the isolation regions 1105 may be annealed by optical (such as pulsed laser) means as previously described and the acceptor wafer metallization may be protected by the shield/heat sink layer 1188. Many other modifications within the scope of the invention will suggest themselves to such skilled persons after reading this specification. Thus the invention is to be limited only by the appended claims.

While concepts in this patent application have been described with respect to 3D-ICs with two stacked device layers, those of ordinary skill in the art will appreciate that it can be valid for 3D-ICs with more than two stacked device layers. Additionally, some of the concepts may be applied to 2D ICs.

While ion-cut has been described in previous sections as the method for layer transfer, several other procedures exist that fulfill the same objective. These include:

Lift-off or laser lift-off: Background information for this technology is given in "Epitaxial lift-off and its applications", 1993 Semicond. Sci. Technol. 8 1124 by P Demeester et al. ("Demeester").

Porous-Si approaches such as ELTRAN: Background information for this technology is given in "Eltran, Novel SOI Wafer Technology", JSAP International, Number 4, July 2001 by T. Yonehara and K. Sakaguchi ("Yonehara") and also in "Frontiers of silicon-on-insulator," J. Appl. Phys. 93, 4955-4978, 2003 by G. K. Celler and S. Cristoloveanu ("Celler").

Time-controlled etch-back to thin an initial substrate, Polishing, Etch-stop layer controlled etch-back to thin an initial substrate: Background information on these technologies is given in Celler and in U.S. Pat. No. 6,806,171.

Rubber-stamp based layer transfer: Background information on this technology is given in "Solar cells sliced and diced", 19 May 2010, Nature News.

The above publications giving background information on various layer transfer procedures are incorporated herein by reference. It is obvious to one skilled in the art that one can form 3D integrated circuits and chips as described in this document with layer transfer schemes described in these publications.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3D IC technology described herein may be found at least in FIG. 156 of U.S. Pat. No. 8,273,610, the contents of which are incorporated by reference.

Furthermore, some embodiments of the invention may include alternative techniques to build systems based on integrated 3D devices including techniques and methods to construct 3D IC based systems that communicate with other 3DIC based systems. Some embodiments of the invention may enable system solutions with far less power consumption and intercommunication abilities at lower power than prior art. These systems may be called 'Internet of Things", or IoT, systems, wherein the system enabler is a 3DIC device which may provide at least three functions: a sensing capability, a digital and signal processing capability, and communication capability. For example, the sensing capability may include a region or regions, layer or layers within the 3DIC device which may include, for example, a MEMS accelerometer (single or multi-axis), gas sensor, electric or magnetic field sensor, microphone or sound sensing (air pressure changes), image sensor of one or many wavelengths (for example, as disclosed in at least U.S. Pat. Nos. 8,283,215 and 8,163,581, incorporated herein by reference), chemical sensing, gyroscopes, resonant structures, cantilever structures, ultrasonic transducers (capacitive & piezoelectric). Digital and signal processing capability may include a region or regions, layer or layers within the 3D IC device which may include, for example, a microprocessor, digital signal processor, micro-controller, FPGA, and other digital land/or analog logic circuits, devices, and subsystems. Communication capability, such as communication from at least one 3D IC of IoT system to another, or to a host controller/nexus node, may include a region or regions, layer or layers within the 3D IC device which may include, for example, an RF circuit and antenna or antennas for wireless communication which might utilize standard wireless communication protocols such as G4, WiFi or Bluetooth, I/O buffers and either mechanical bond pads/wires and/or optical devices/transistors for optical communication, transmitters, receivers, codecs, DACs, digital or analog filters, modulators.

Energy harvesting, device cooling and other capabilities may also be included in the system. The 3DIC inventions disclosed herein and in the incorporated referenced documents enable the IoT system to closely integrate different crystal devices, for example a layer or layers of devices/transistors formed on and/or within mono or poly crystalline silicon combined with a layer or layers of devices/transistors formed on and/or within Ge, or a layer of layers of GaAs, InP, differing silicon crystal orientations, and so on. For example, incorporating the 3D IC semiconductor devices according to some embodiments of the invention as or within the IoT systems and mobile systems could provide superior IoT or mobile systems that could operate much more efficiently and for a much longer time than with prior art technology. The 3D IC technology herein disclosed provides a most efficient path for heterogeneous integration with very effective integration reducing cost and operating power with the ability to support redundancy for long field life and other advantages which could make such an IoT System commercially successful.

Alignment is a basic step in semiconductor processing. For most cases it is part of the overall process flow that every successive layer is patterned when it is aligned to the layer below it. These alignments could all be done to one common alignment mark, or to some other alignment mark or marks that are embedded in a layer underneath. In today's equipment such alignment would be precise to below a few nanometers and better than 40 nm or better than 20 nm and even better than 10 nm. In general such alignment could be observed by comparing two devices processed using the same mask set. If two layers in one device maintain their relative relationship in both devices—to few nanometers—it is clear indication that these layers are aligned each to the other. This could be achieved by either aligning to the same alignment mark (sometimes called a zero mark alignment scheme), or one layer is using an alignment mark embedded in the other layer (sometimes called a direct alignment), or using different alignment marks of layers that are aligned to each other (sometimes called an indirect alignment).

In this document, the connection made between layers of, generally, single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate. Similarly, donor wafers herein may be substantially comprised of a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

While mono-crystalline silicon has been mentioned as a transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may or may not be stacked in a substantially vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. First silicon layers or transistor channels and second silicon layers or transistor channels may be may be substantially absent of semiconductor dopants to form an undoped silicon region or layer, or doped, such as, for example, with elemental or compound species that form a p+, or p, or p−, or n+, or n, or n− silicon layer or region. A heat removal apparatus may include an external surface from which heat transfer may take place by methods such as air cooling, liquid cooling, or attachment to another heat sink or heat spreader structure. Furthermore, raised source and drain contact structures, such as etch and epi SiGe and SiC, and implanted S/Ds (such as C) may be utilized for strain control of transistor channel to enhance carrier mobility and may provide contact resistance improvements. Damage from the processes may be optically annealed. Strain on a transistor channel to enhance carrier mobility may be accomplished by a stressor layer or layers as well.

In this specification the terms stratum, tier or layer might be used for the same structure and they may refer to transistors or other device structures (such as capacitors, resistors, inductors) that may lie substantially in a plane format and in most cases such stratum, tier or layer may include the interconnection layers used to interconnect the transistors on each. In a 3D device as herein described there may at least two such planes called tier, or stratum or layer.

In a 3D IC system stack, each layer/stratum may include a different operating voltage than other layers/stratum, for example, one stratum may have Vcc of 1.0v and another may have a Vcc of 0.7v. For example, one stratum may be designed for logic and have the appropriate Vcc for that process/device node, and another stratum in the stack may be designed for analog devices, and have a different Vcc, likely substantially higher in value-for example, greater than 3 volts, greater than 5 volts, greater than 8 volts, greater than 10 volts. In a 3D IC system stack, each layer/stratum may include a different gate dielectric thickness than other layers/stratum. For example, one stratum may include a gate dielectric thickness of 2 nm and another 10 nm. The definition of dielectric thickness may include both a physical definition of material thickness and an electrically 'effective' thickness of the material, given differing permittivity of the materials. In a 3D IC system stack, each layer/stratum may include different gate stack materials than other layers/stratum. For example, one stratum may include a HKMG (High k metal gate) stack and another stratum may include a polycide/silicon oxide gate stack. In a 3D IC system stack, each layer/stratum may include a different junction depth than other layers/stratum. For example, the depth of the junctions may include a FET transistor source or drain, bipolar emitter and contact junctions, vertical device junctions, resistor or capacitor junctions, and so on. For example, one stratum may include junctions of a fully depleted MOSFET, thus its junction depth may be defined by the thickness of the stratum device silicon to the vertical isolation, and the other stratum may also be fully depleted devices with a junction depth defined similarly, but one stratum has a thicker silicon layer than the other with respect to the respective edges of the vertical isolation. In a 3D IC system stack, each layer/stratum may include a different junction composition and/or structure than other layers/stratum. For example, one stratum may include raised source drains that may be constructed from an etch and epitaxial deposition processing, another stratum in the stack may have implanted and annealed junctions or may employ dopant segregation techniques, such as those utilized to form DSS Schottky transistors.

Some 3D device flows presented herein suggest the use of the ELTRAN or modified ELTRAN techniques and in other time a flow is presented using the ion-cut technique. It would be obvious for someone skilled in the art to suggest an alternative process flow by exchanging one layer transfer technique with another. Just as in some steps one could exchange these layer transfer techniques with others presented herein or in other publication such as the bonding of SOI wafer and etch back. These would be variations for the described and illustrated 3D process flows presented herein.

In various places here or in the incorporated by reference disclosures of heat removal techniques have been presented and illustrated. It would be obvious to person skilled in the art to apply these techniques to any of the other variations of 3D devices presented herein.

In various places here or in the incorporated by reference disclosures of repair and redundancy techniques have been presented and illustrated. It would be obvious to person skilled in the art to apply these techniques to any of the other variations of 3D devices presented herein.

In various places here or in the incorporated by reference disclosures memories and other circuit and techniques of customizing and integrating these structures have been presented and illustrated. It would be obvious to person skilled in the art to apply these techniques and structures to any of the other variations of 3D devices presented herein.

It should be noted that one of the design requirements for a monolithic 3D IC design may be that substantially all of the stacked layers and the base or substrate would have their respective dice lines (may be called scribe-lines) aligned. As the base wafer or substrate is processed and multiple circuits may be constructed on semiconductor layers that overlay each other, the overall device may be designed wherein each overlaying layer would have its respective dice lines overlying the dice lines of the layer underneath, thus at the end of processing the entire layer stacked wafer/substrate could be diced in a single dicing step. There may be test structures in the streets between dice lines, which overall may be called scribe-lanes or dice-lanes. These scribe-lanes or dice-lanes may be 10 um wide, 20 um wide, 50 um wide 100 um wide, or greater than 100 um wide depending on design choice and die singulation process capability. The scribe-lanes or dice-lanes may include guard-ring structures and/or other die border structures. In a monolithic 3D design each layer test structure could be connected through each of the overlying layers and then to the top surface to allow access to these 'buried' test structure before dicing the wafer. Accordingly the design may include these vertical connections and may offset the layer test structures to enable such connection. In many cases the die borders comprise a protection structure, such as, for example, a guard-ring structure, die seal structure, ESD structure, and others elements. Accordingly in a monolithic 3D device these structures, such as guard rings, would be designed to overlay each other and may be aligned to each other during the course of processing. The die edges may be sealed by a process and structure such as, for example, described in relation to FIG. 183C of incorporated U.S. Pat. No. 8,273,610, and may include aspects as described in relation to FIG. 183A and 183B of same reference. One skilled in the art would recognize that the die seal can be passive or electrically active. On each 3D stack layer, or stratum, the electronic circuits within one die, that may be circumscribed by a dice-lane, may not be connected to the electronic circuits of a second die on that same wafer, that second die also may be circumscribed by a dice-lane. Further, the dice-lane/scribe-lane of one stratum in the 3D stack may be aligned to the dice-lane/scribe-lane of another stratum in the 3D stack, thus providing a direct die singulation vector for the 3D stack of strata/layers.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described hereinabove as well as modifications and variations which would occur to such skilled persons upon reading the foregoing description. Thus the invention is to be limited only by the appended claims

We claim:
1. A 3D semiconductor device, the device comprising:
a first single crystal layer comprising a plurality of first transistors;
at least one metal layer interconnecting said first transistors, a portion of said first transistors forming a plurality of logic gates;
a plurality of second transistors overlaying said first single crystal layer;
at least one connection from said plurality of first transistors to a plurality of through silicon vias (TSVs);
a plurality of third transistors overlaying said plurality of second transistors,
wherein said plurality of second transistors are self-aligned to said plurality of third transistors having been processed following the same lithography step; and
a first memory array and a second memory array,
wherein said first memory array comprises said plurality of second transistors and said second memory array comprises said plurality of third transistors,
wherein at least one of said plurality of second transistors comprises a polysilicon channel,
wherein at least one of said plurality of second transistors is a junction-less transistor, and
wherein each of said plurality of second transistors comprises a gate.
2. The 3D semiconductor device according to claim 1, wherein formation of said gate comprises an Atomic Layer Deposition (ALD).
3. The 3D semiconductor device according to claim 1, further comprising:
a NAND type flash memory comprising said first memory array.
4. The 3D semiconductor device according to claim 1, further comprising:
a top metal layer overlaying said plurality of third transistors,
wherein a subset of said plurality of first transistors are part of a peripheral circuit controlling said first memory array.
5. The 3D semiconductor device according to claim 1, wherein said plurality of second transistors comprises a gate dielectric, and wherein said gate dielectric comprises a low temperature microwave plasma oxide.
6. The 3D semiconductor device according to claim 1, further comprising:
a staircase structure.
7. The 3D semiconductor device according to claim 1, wherein at least one of said plurality of second transistors overlays at least partially one of said TSVs.
8. A 3D semiconductor device, the device comprising:
a first single crystal layer comprising a plurality of first transistors;
at least one metal layer interconnecting said first transistors, a portion of said first transistors forming a plurality of logic gates;
a plurality of second transistors overlaying said first single crystal layer;
at least one connection from said plurality of first transistors to a plurality of through silicon vias (TSVs);
a plurality of third transistors overlaying said plurality of second transistors,
wherein said plurality of second transistors are self-aligned to said plurality of third transistors having been processed following the same lithography step; and
a first memory array and a second memory array,
wherein said first memory array comprises said plurality of second transistors and said second memory array comprises said plurality of third transistors,
wherein at least one of said plurality of second transistors comprises a polysilicon channel,
wherein at least one of said plurality of second transistors is a junction-less transistor, and
said device further comprising:
a first set of external connections underlying said one metal layer to connect said device to a first external device; and
a second set of external connections overlaying said one metal layer to connect said device to a second external device,
wherein said first set of external connections comprises said plurality of through silicon vias (TSVs).
9. The 3D semiconductor device according to claim 8, wherein at least one of said second transistors is a double gate transistor, and
wherein each gate of said double gate transistor is independently controlled.
10. The 3D semiconductor device according to claim 8, wherein at least one of said second transistors overlays at least partially one of said TSVs.
11. The 3D semiconductor device according to claim 8, further comprising:
a NAND type flash memory comprising said first memory array.
12. The 3D semiconductor device according to claim 8, further comprising:
a top metal layer overlaying said plurality of third transistors, wherein a subset of said plurality of first transistors are part of a peripheral circuit controlling said first memory array.
13. The 3D semiconductor device according to claim 8, further comprising:
a first set of external connections underlying said one metal layer to connect said device to a first external device; and
a second set of external connections overlaying said one metal layer to connect said device to a second external device, wherein said first set of external connections comprises said plurality of through silicon vias (TSVs).

14. A 3D semiconductor device, the device comprising:
a first single crystal layer comprising a plurality of first transistors;
at least one metal layer interconnecting said first transistors, a portion of said first transistors forming a plurality of logic gates;
a plurality of second transistors overlaying said first single crystal layer;
at least one connection from said plurality of first transistors to a plurality of through silicon vias (TSVs);
a plurality of third transistors overlaying said plurality of second transistors,
wherein said plurality of second transistors are self-aligned to said plurality of third transistors having been processed following the same lithography step; and
a first memory array and a second memory array,
wherein said first memory array comprises said plurality of second transistors and said second memory array comprises said plurality of third transistors.

15. The 3D semiconductor device according to claim 14, wherein at least one of said plurality of second transistors comprises a polysilicon channel.

16. The 3D semiconductor device according to claim 14, wherein at least one of said second transistors is a double gate transistor, and
wherein each gate of said double gate transistor is independently controlled.

17. The 3D semiconductor device according to claim 14, wherein at least one of said second transistors is of the dopant segregated schottky barrier type.

18. The 3D semiconductor device according to claim 14, wherein at least one of said plurality of second transistors is a junction-less transistor.

19. The 3D semiconductor device according to claim 14, further comprising:
a NAND type flash memory comprising said plurality of second transistors.

20. The 3D semiconductor device according to claim 14, further comprising:
a top metal layer overlaying said plurality of third transistors; and
a plurality of fourth transistors overlaying said top metal,
wherein a subset of said plurality of first transistors are part of a peripheral circuit controlling said first memory array.

* * * * *